(12) United States Patent
Lee et al.

(10) Patent No.: US 7,608,494 B2
(45) Date of Patent: Oct. 27, 2009

(54) THIN FILM TRANSISTOR ARRAY PANEL AND A METHOD FOR MANUFACTURING THE SAME

(75) Inventors: Jae-Gab Lee, Seoul (KR); Bong-Joo Kang, Seoul (KR); Beom-Seok Cho, Seoul (KR); Chang-Oh Jeong, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/112,104

(22) Filed: Apr. 30, 2008

(65) Prior Publication Data

US 2008/0227245 A1 Sep. 18, 2008

Related U.S. Application Data

(62) Division of application No. 10/482,256, filed on Dec. 23, 2003, now Pat. No. 7,375,373.

(30) Foreign Application Priority Data

Jan. 2, 2002  (KR)  ............ 10-2002-0000907

(51) Int. Cl.
*H01L 21/84* (2006.01)
(52) U.S. Cl. .............. 438/160; 438/149; 438/139; 438/158; 438/157; 438/154; 257/E21.094; 257/E21.104; 257/E21.411; 257/E21.416; 257/E21.121; 257/E21.372
(58) Field of Classification Search .......... 438/160, 438/149, 257, 139, 158, 157, 154; 257/E21.094, 257/E21.104, E21.411, E21.121, E21.416
See application file for complete search history.

(56) References Cited

U.S. PATENT DOCUMENTS

| 5,078,810 A | 1/1992 | Tanaka et al. |
| 5,607,522 A | 3/1997 | McDonnell |
| 5,667,853 A | 9/1997 | Fukuyoshi et al. |
| 6,066,599 A | 5/2000 | Otto et al. |
| 6,259,503 B1 * | 7/2001 | Watanabe et al. ........... 349/141 |

(Continued)

FOREIGN PATENT DOCUMENTS

CN   1280387   1/2001

(Continued)

OTHER PUBLICATIONS

PCT International Search Report; International Application No. PCT/KR02/01252; International filing date: Jan. 8, 2002; Date of Mailing: Dec. 4, 2002.

*Primary Examiner*—Wael Fahmy
*Assistant Examiner*—Marc Armand
(74) *Attorney, Agent, or Firm*—Cantor Colburn LLP

(57) ABSTRACT

A thin film transistor array panel includes an insulating substrate, a gate wire formed on the insulating substrate. A gate insulating layer covers the gate wire. A semiconductor pattern is formed on the gate insulating layer. A data wire having source electrodes, drain electrodes and data lines is formed on the gate insulating layer and the semiconductor pattern. A protective layer is formed on the data wire. Pixel electrodes connected to the drain electrode via contact holes are formed on the protective layer. The gate wire and the data wire are made of Ag alloy containing Ag and an additive including at least one selected from Zn, In, Sn and Cr.

8 Claims, 70 Drawing Sheets

U.S. PATENT DOCUMENTS

| | | |
|---|---|---|
| 6,274,412 B1 | 8/2001 | Kydd et al. |
| 6,329,226 B1 | 12/2001 | Jones et al. |
| 6,335,276 B1 | 1/2002 | Park et al. |
| 6,432,157 B1 | 8/2002 | Nakamura et al. |
| 6,465,117 B2 | 10/2002 | Takaki et al. |
| 6,723,281 B1 | 4/2004 | Ueno et al. |
| 6,744,486 B2 * | 6/2004 | Kim et al. .................. 349/187 |

FOREIGN PATENT DOCUMENTS

| | | |
|---|---|---|
| JP | 6331752 | 3/1988 |
| JP | 09123337 | 5/1997 |
| JP | 09183181 | 7/1997 |
| JP | 10-153788 | 6/1998 |
| JP | 10282907 | 10/1998 |
| JP | 11070610 | 3/1999 |
| JP | 2000-147493 | 5/2000 |
| JP | 2001-102952 | 4/2001 |
| JP | 2001-192752 | 7/2001 |
| JP | 2001-230418 | 8/2001 |
| KR | 1998-036499 | 8/1998 |
| KR | 2001-0029930 | 4/2001 |

* cited by examiner

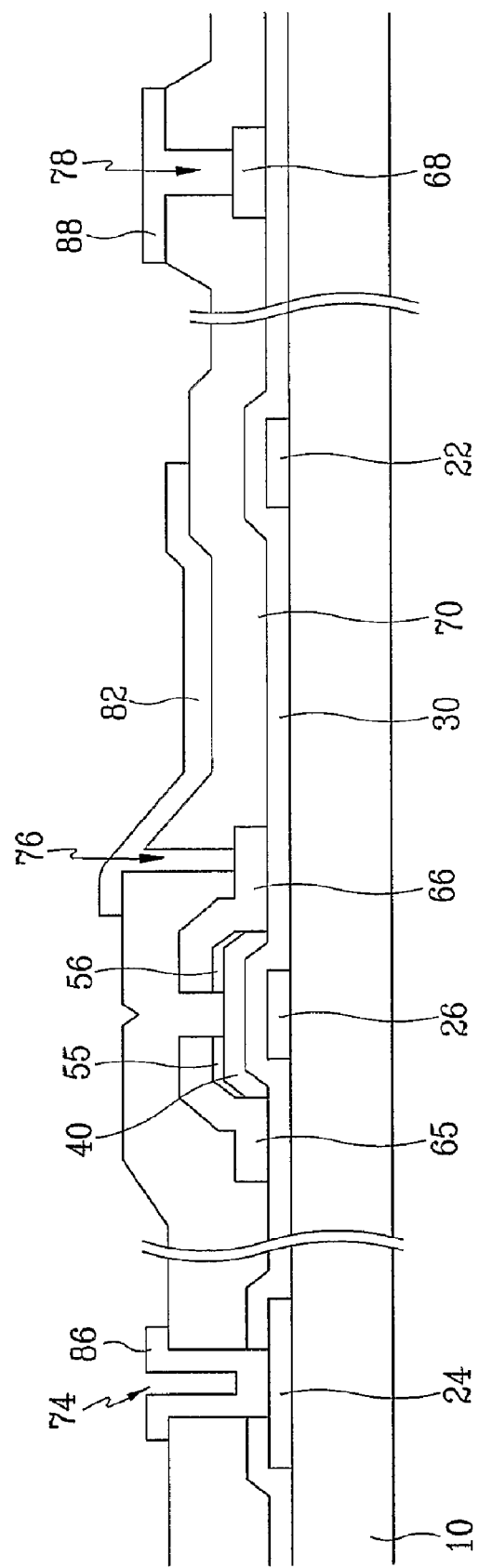

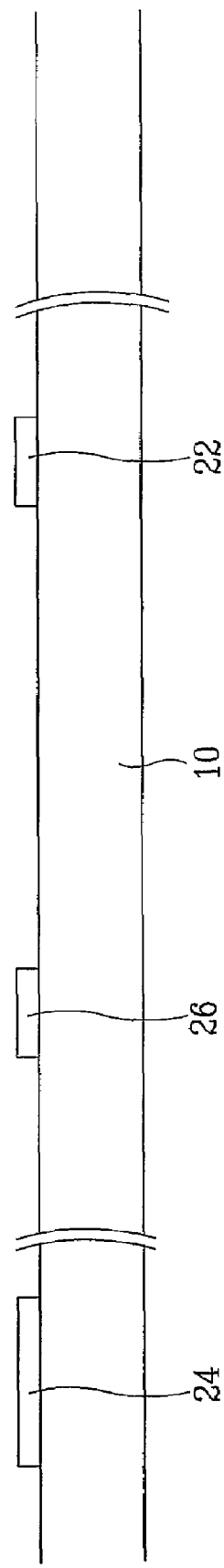

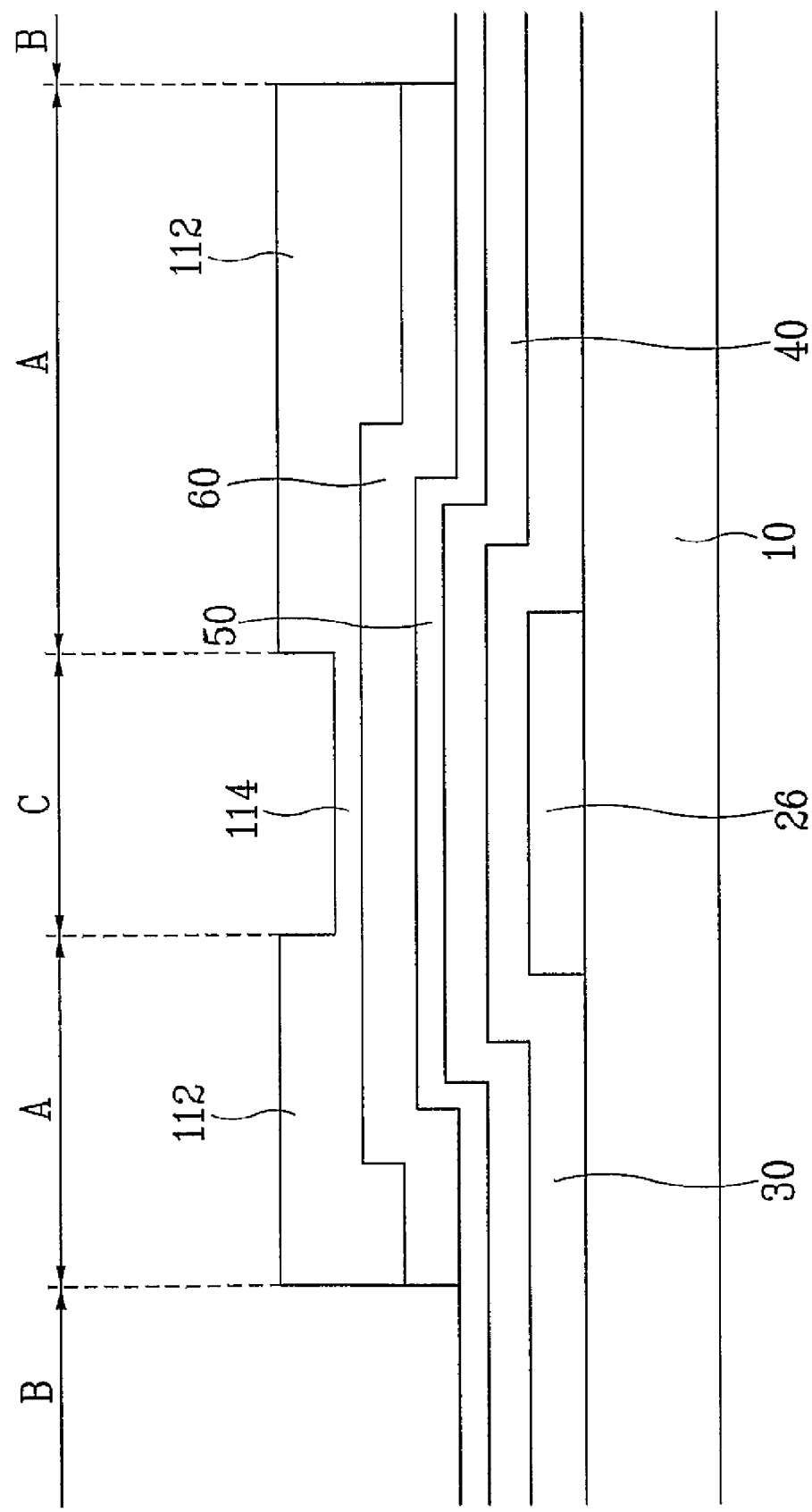

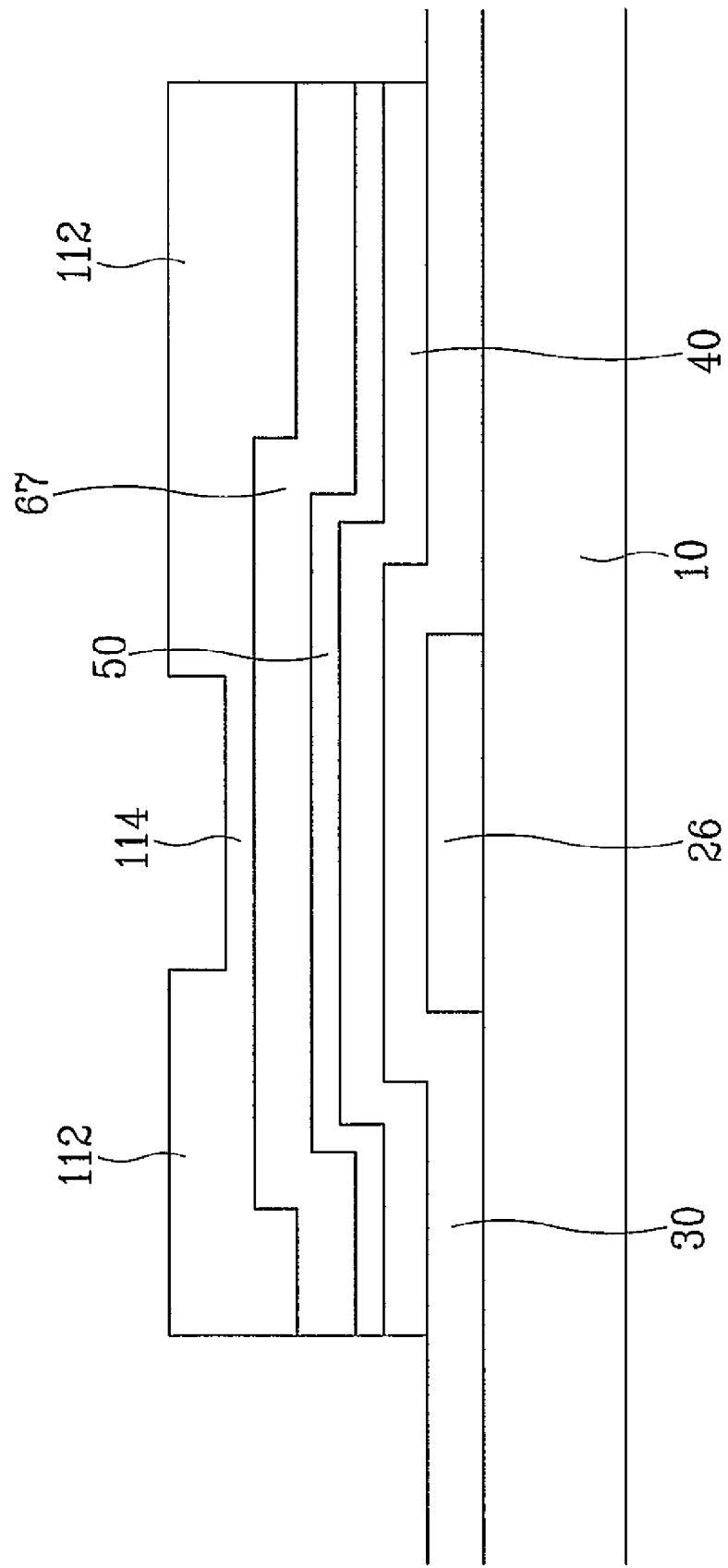

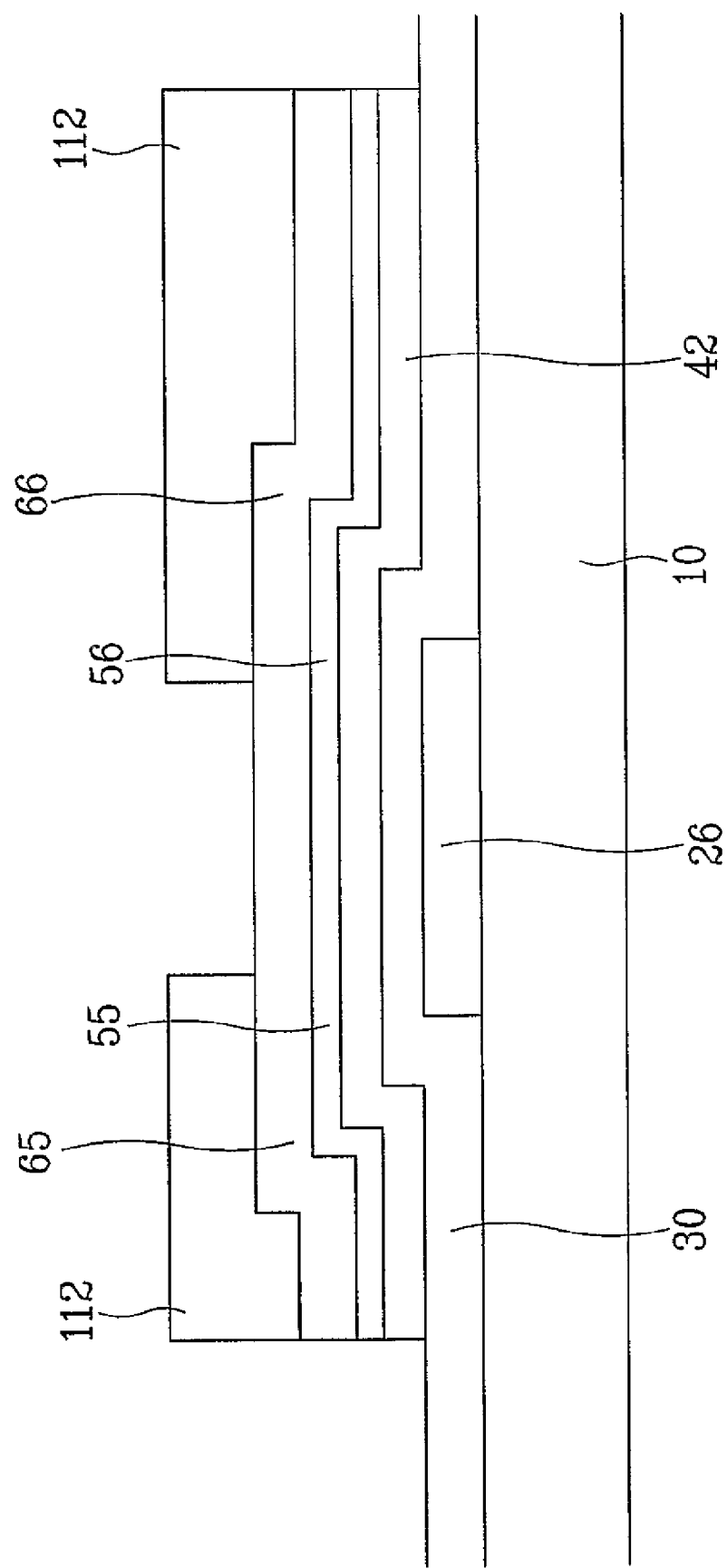

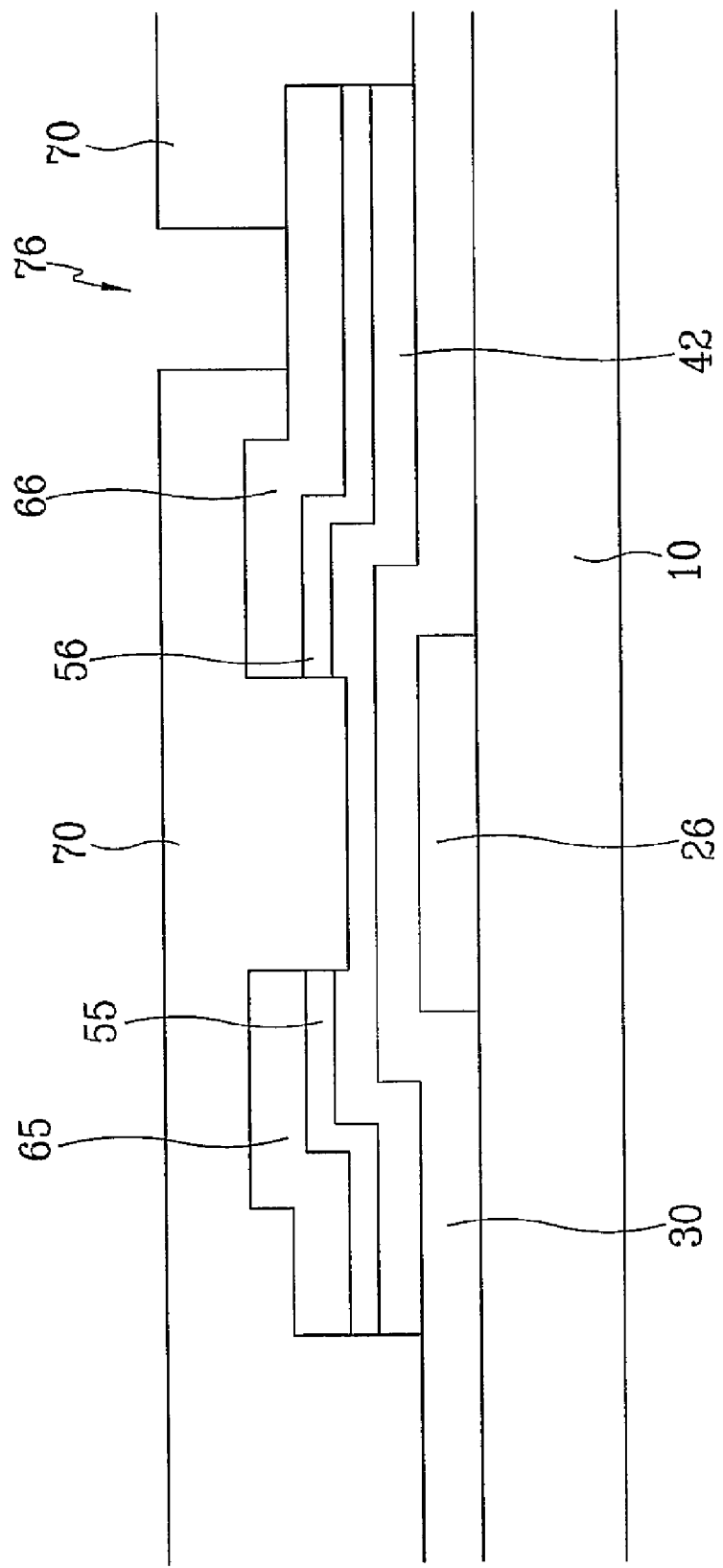

FIG.20A
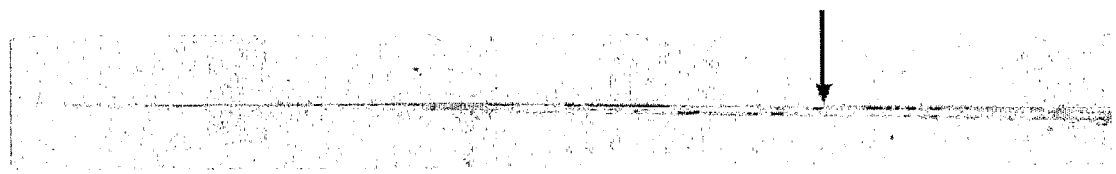
(a) Ag(Zn)As-dep
(b) Ag(Zn) 200°C annealing
FIG.20B
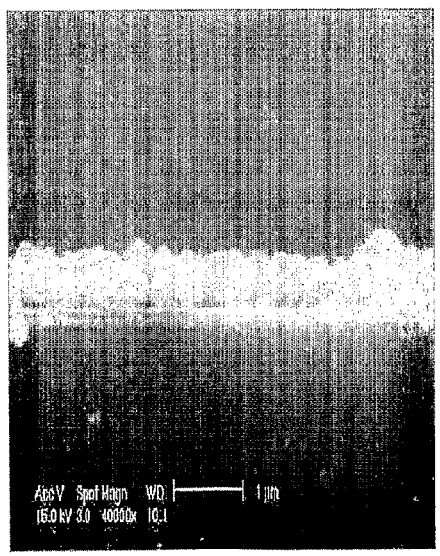
(a) Pure Ag
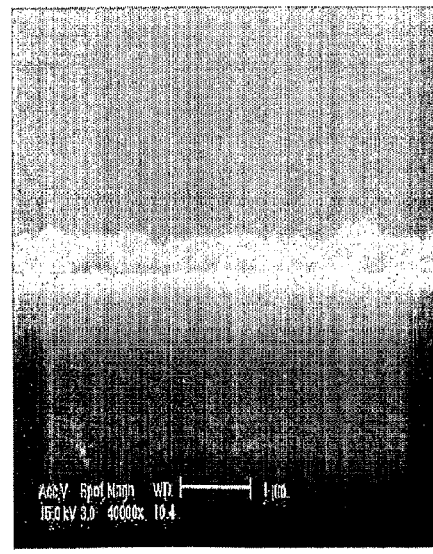
(b) Ag(Zn) alloy annealed at 300 °C

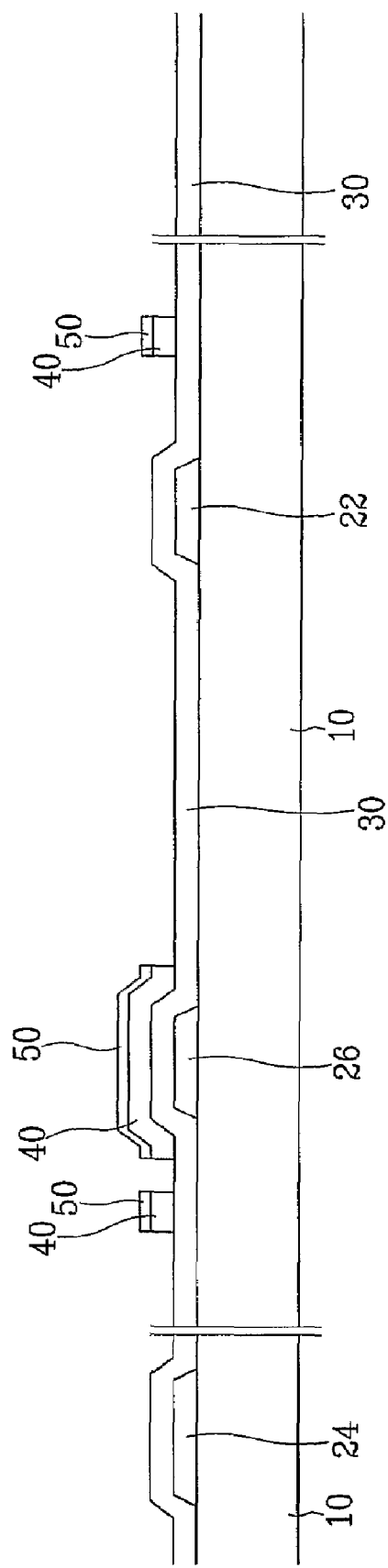

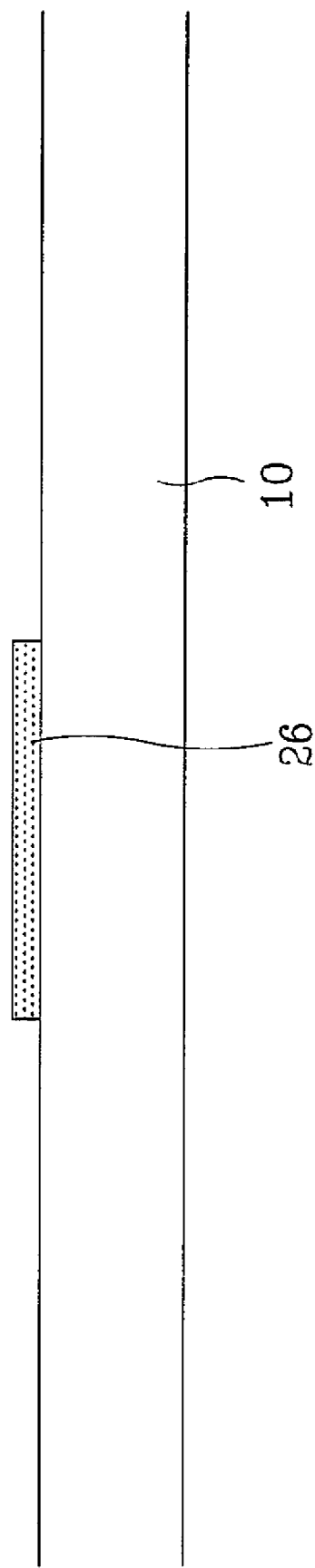

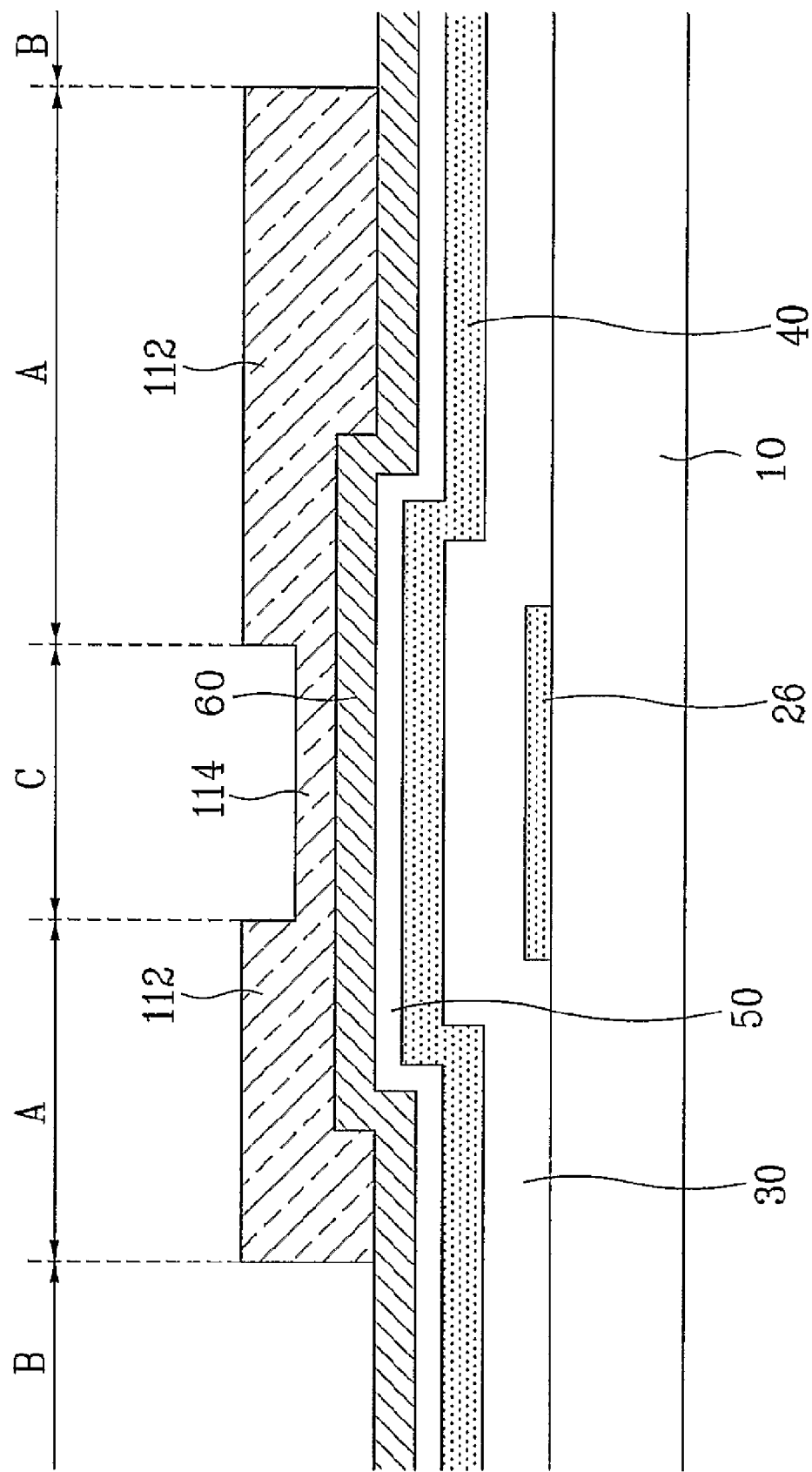

THIN FILM TRANSISTOR ARRAY PANEL AND A METHOD FOR MANUFACTURING THE SAME

CROSS REFERENCE TO RELATED APPLICATIONS

This application is a divisional application of U.S. application Ser. No. 10/482,256 filed Dec. 23, 2003, now U.S. Pat. No. 7,375,373, which claims priority to and the benefit of Korean Patent Application No. 10-2002-0000907, filed on Jan. 2, 2002, both of which are incorporated by reference herein in their entirety.

BACKGROUND OF THE INVENTION (a) Field of the Invention

The present invention relates to a thin film transistor array panel and a manufacturing method thereof.

(b) Description of the Related Art

Generally, a thin film transistor array ("TFT") panel for a liquid crystal display ("LCD") or an electro-luminescence ("EL") display is used as a circuit board for driving the respective pixels in an independent manner. The TFT array panel includes a scanning signal wire or a gate wire transmitting scanning signals, an image signal wire or a data wire transmitting image signals, TFTs connected to the gate and the data wire, pixel electrodes connected to the TFTs, a gate insulating layer covering the gate wire for insulation, and a protective layer covering the TFTs and the data wire for insulation. The TFT includes a gate electrode, which is a part of the gate wire, a semiconductor layer forming a channel, source and drain electrodes, which are parts of the data wire, a gate insulating layer, and a protective layer. The TFT is a switching element for transmitting the image signals from the data wire to the pixel electrode in response to the scanning signals from the gate wire.

The TFT array panel has been extensively used for the LCD. As large-sized high-resolution LCDs have been developed, the gate and the data wires become to have significantly elongated length but gradually narrowed width. Accordingly, signal distortion due to the increase in the resistance of the wires and in various parasitic capacitances becomes to be a critical problem. In this connection, silver (Ag) wire come to the attention because it has good contact characteristic with an amorphous silicon layer and having low resistivity compared with a conventionally-used aluminum alloy wire.

However, silver exhibits poor adhesiveness to a glass substrate or a silicon layer. The poor adhesiveness frequently causes the defect such as the looseness or detachment of the silver thin films during the subsequent processes such as cleaning, which results in the disconnection of the wire. Furthermore, silver may be easily damaged by dry etch of the silicon nitride insulating layer.

SUMMARY OF THE INVENTION

It is an object of the present invention to provide a low resistivity Ag wire.

It is another object of the present invention to provide a thin film transistor array panel with a low resistivity Ag wire having improved reliability.

These and other objects may be achieved by depositing Ag and an additive easily oxidizable and performing heat treatment to form a wire.

According to one aspect of the present invention, a thin film transistor array panel includes: an insulating substrate; a first signal line formed on an insulating substrate; a first insulating layer formed on the first signal line; a second signal line formed on the first insulating layer and intersecting the first signal line; a thin film transistor connected to the first and the second signal lines; a second insulating layer formed on the thin film transistor and having a first contact hole exposing a electrode of the thin film transistor; and a pixel electrode formed on the second insulating layer and connected to the electrode of the thin film transistor through the first contact hole, wherein at least one of the first and the second signal lines comprises Ag alloy containing Ag and an additive including at least one selected from the group consisting of Zn, In, Sn and Cr.

It is preferable that oxide of the additive is formed on surfaces of the at least one of the first and the second signal lines comprising Ag alloy.

A thin film transistor array panel according to another embodiment of the present invention includes: a gate wire formed on an insulating substrate and including a gate line, and a gate electrode connected to the gate line; a gate insulating layer covering the gate wire; a semiconductor pattern formed on the gate insulating layer; a data wire including source and drain electrodes formed on the semiconductor pattern, made of the same layer, and separated from each other, and a data line connected to the source electrode and intersecting the gate line to define a pixel area; a protective layer having a first contact hole exposing the drain electrode; and a pixel electrode formed on the protective layer and connected to the drain electrode through the first contact hole, wherein at least one of the gate wire and the data wire comprises Ag alloy containing Ag and an additive including at least one selected from the group consisting of Zn, In, Sn and Cr.

A thin film transistor array panel according to another embodiment of the present invention includes: an insulating substrate; a gate wire formed on the insulating substrate and including a gate line, a gate electrode and a gate pad; a gate insulating layer formed on the gate wire and having a contact hole at least exposing the gate pad; a semiconductor pattern formed on the gate insulating layer; an ohmic contact pattern formed on the semiconductor pattern; a data wire formed on the ohmic contact pattern, having substantially the same planar shape as the ohmic contact pattern, and including a source electrode, a drain electrode, a data line, and a data pad; a protective layer formed on the data wire and a plurality of contact holes exposing the gate pad, the data pad, and the drain electrode; and a transparent electrode pattern electrically connected to the exposed gate pad, data pad and drain electrode, wherein at least one of the gate wire and the data wire comprises Ag alloy containing Ag and an additive including at least one selected from the group consisting of Zn, In, Sn and Cr.

It is preferable that oxide of the additive is formed on surfaces of the at least one of the gate wire and the data wire comprising Ag alloy.

A method of manufacturing a thin film transistor array panel according to an embodiment of the present invention includes: forming a gate wire on an insulating substrate, the gate wire including a gate line, a gate electrode connected to the gate line, and a gate pad connected to the gate line; forming a gate insulating layer; forming a semiconductor layer; depositing a conductive layer and patterning the conductive layer to form a data wire including a data line intersecting the gate line, a data pad connected to the data line, a source electrode connected to the data line and placed close to the gate electrode, and a drain electrode opposite the source electrode with respect to the gate electrode; forming a protective layer; patterning the protective layer together with the gate insulating layer to form a plurality of contact holes respectively exposing the gate pad, the data pad and the drain electrode; and depositing a transparent conductive layer and patterning the conductive layer to form a subsidiary gate pad, a subsidiary data pad and a pixel electrode respectively connected to the gate pad, the data pad, and the pixel electrode. At least one of the formation of the gate wire and the formation of the data wire includes: forming a Ag alloy layer by sputtering Ag and an additive including at least one selected from the group consisting of Zn, In, Sn and Cr; patterning the Ag alloy layer; and heat-treating the Ag alloy layer.

A method of manufacturing a thin film transistor array panel according to an embodiment of the present invention includes: forming a gate wire on an insulating substrate, the gate wire having a gate line, and a gate electrode connected to the gate line; forming a gate insulating layer covering the gate wire; forming a semiconductor pattern on the gate insulating layer; forming a data wire on the gate insulating layer, the data wire comprising source and drain electrodes including substantially the same layer and separated from each other, and a data line connected to the source electrode; forming red, green and blue color filters and a first aperture exposing the drain electrode, the color filters including a photosensitive material containing red, green and blue pigments and covering the data wire; forming a protective layer covering the red, green and blue color filters; forming a first contact hole exposing the drain electrode; and forming a pixel electrode connected to the drain electrode through the first contact hole. At least one of the formation of the gate wire and the formation of the data wire includes: forming a Ag alloy layer by sputtering Ag and an additive including at least one selected from the group consisting of Zn, In, Sn and Cr; patterning the Ag alloy layer; and heat-treating the Ag alloy layer.

BRIEF DESCRIPTION OF THE DRAWINGS

FIG. 2 is a sectional view of the TFT array panel shown in FIG. 1 taken along the line II-II;

FIG. 3B is a sectional view of the TFT array panel shown in FIG. 3A taken along the line IIIb-IIIb';

FIGS. 12B and 12C are sectional views of the TFT array panel shown in FIG. 12A taken along the line XIIb-XIIb' and the line XIIc-XIIc', respectively;

FIGS. 13A, 14A and 15A and FIGS. 13B, 14B and 15B are sectional views of the TFT array panel shown in FIG. 12 taken along the line XIIb-XIIb' and the line XIIc-XIIc', respectively, sequentially illustrating the steps following the step illustrated in FIG. 12A;

FIGS. 17B and 17C are sectional view of the TFT array panel shown in FIG. 17A taken along the line XVIIb-XVIIb' and the line XVIIc-XVIIc', respectively;

FIG. 20A is a photograph illustrating a result of a scratch test for a Ag(Zn) alloy thin film before and after heat treatment of the Ag(Zn) alloy thin film;

FIG. 20B is a SEM photograph of a pure Ag thin film and a Ag(Zn) thin film after heat treatment at 300° C. and exposure to $CF_4+O_2$ plasma;

FIG. 24B is a sectional view of the TFT array panel shown in FIG. 24A taken along the line XXIVb-XXIVb';

FIGS. 31B and 31C are sectional views of the TFT array panel shown in FIG. 31A taken along the line XXXIb-XXXIb' and the line XXXIc-XXXIc', respectively;

FIGS. 33B and 33C are sectional views of the TFT array panel shown in FIG. 33A taken along the line XXXIIIb-XXXIIIb' and the line XXXIIIc-XXXIIIc', respectively;

DETAILED DESCRIPTION OF PREFERRED EMBODIMENTS

Now, TFT array panels provided with low-resistivity wires and manufacturing methods thereof according to embodiments of this invention will be described in detail with reference to the accompanying drawings for ordinary skill in the art to easily carry out.

First, a structure of a TFT array panel for an LCD according to a first embodiment of the present invention is described in detail with reference to FIGS. 1 and 2.

Figure 1:
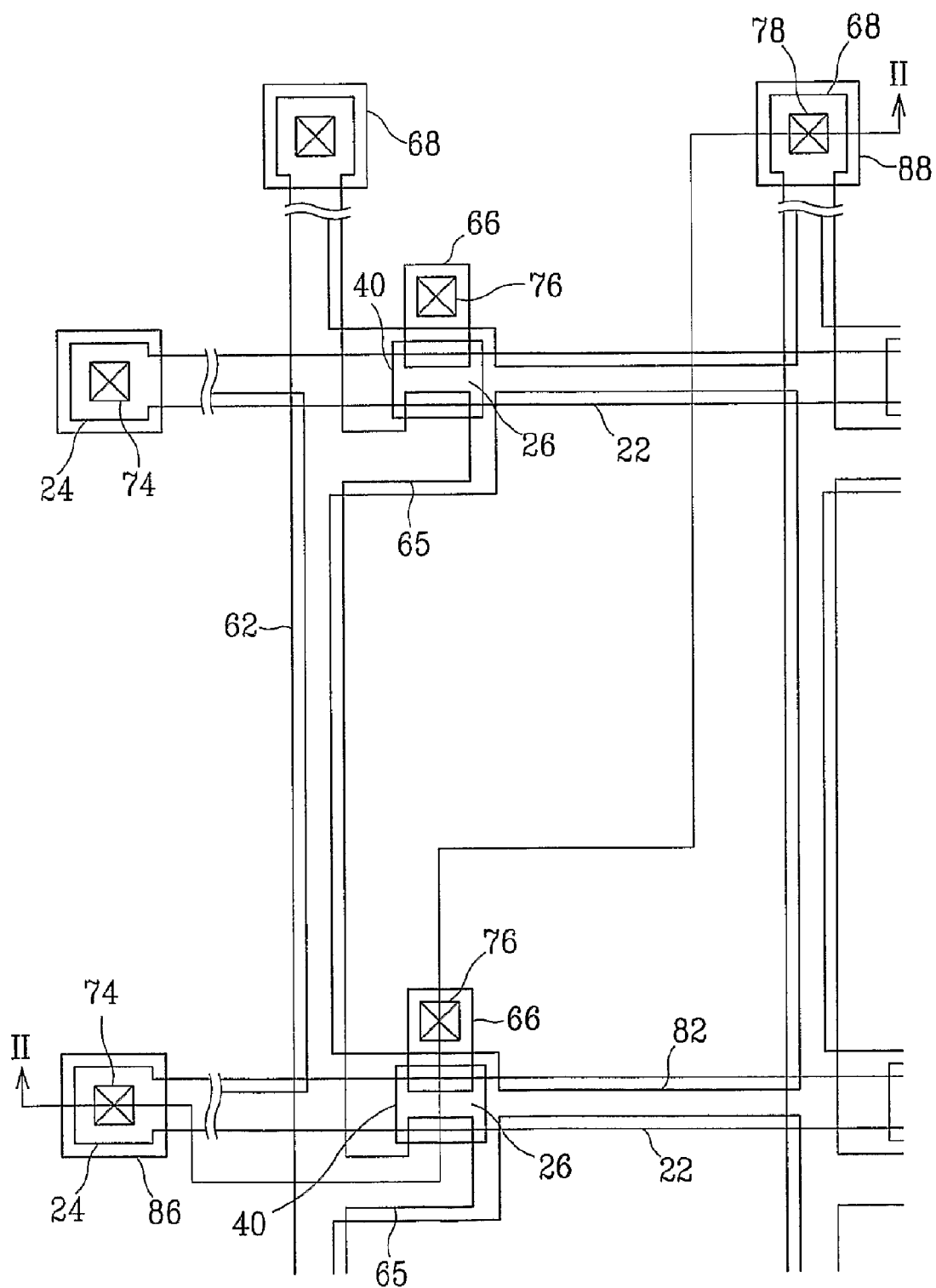
FIG. 1 shows a TFT array panel for a LCD according to a first embodiment of the present invention.

FIG. 1 is a layout view of a TFT array panel for an LCD according to a first embodiment of the present invention, and FIG. 2 is a sectional view of the TFT array panel shown in FIG. 1 taken along the line II-II.

A gate wire 22, 24 and 26 is formed on an insulating substrate 10. The gate wire 22, 24 and 26 is made of a Ag(Zn) alloy including Ag and additional Zn. A ZnOx layer, which is an oxide of the additive Zn, is formed on the surfaces of the gate wire 22, 24 and 26. The ZnOx layer increases the adhesiveness of the gate wire 22, 24 and 26 to the underlying substrate 10 and protecting the gate wire 22, 24 and 26 from the dry etch using $CF_4+O_2$ plasma and the like, in the subsequent steps. The ZnOx layer is formed by heat treatment of the Ag(Zn) alloy gate wire 22, 24 and 26, which causes the diffusion of Zn to the surfaces thereof and thus the oxidation of the diffused Zn content. As the ZnOx layer bears conductivity, the contact resistance is not so much increased even if any external circuit is connected to a gate pad 24 later.

Meanwhile, even though this embodiment uses Zn as an additive to Ag, In, Sn and Cr may be added to Ag instead of Zn. The above-described additives are easily oxidized, and their oxides have conductivity.

The gate wire 22, 24 and 26 includes a plurality of gate lines 22 extending in a transverse direction, a plurality of gate pads 24 connected to one ends of the gate lines 22 to transmit gate signals from an external device to the gate lines 22, and a plurality of gate electrodes 26 of TFTs connected to the gate lines 22.

A gate insulating layer 10 preferably made of SiNx on the substrate 10 covers the gate wire 22, 24 and 26.

A semiconductor layer 40 preferably made of amorphous silicon is formed on the gate insulating layer 30 opposite the gate electrodes 24. An ohmic contact layer 55 and 56 preferably made of silicide or n+ hydrogenated amorphous silicon heavily doped with n type impurities is formed on the semiconductor layer 40.

A data wire 62, 65, 66 and 68 is formed on the ohmic contact layer 55 and 56 and the gate insulating layer 30. The data wire 62, 65, 66 and 68 is made of Ag(Zn) alloy including Ag and additional Zn like the gate wire 22, 24 and 26. A ZnOx layer, which is an oxide of the additive Zn, is formed on the surfaces of the data wire 62, 65, 66 and 68. The ZnOx layer increases the adhesiveness of the data wire 62, 65, 66 and 68 to the underlying gate insulating layer 30 and the underlying ohmic contact layer 55 and 56 and protecting the data wire 62, 65, 66 and 68 from the dry etch using $CF_4+O_2$ plasma and the like, in the subsequent step of forming contact holes 74, 76 and 78 in a protective layer 70. The ZnOx layer is formed by heat treatment of the Ag(Zn) alloy data wire 62, 65, 66 and 68, which causes the diffusion of Zn to the surfaces thereof and thus the oxidation of the diffused Zn content. As the ZnOx layer bears conductivity, the contact resistance between source and drain electrodes 65 and 66 and the underlying ohmic contact layer 55 and 56 is not so much increased.

The data wire 62, 65, 66 and 68 includes a plurality of data lines 62 extending in a longitudinal direction and intersecting the gate lines 22 to form a plurality of pixels, a plurality of source electrodes 65 branched from the data lines 62 and extending onto a portion 55 of the ohmic contact layer, a plurality of data pads 68 connected to one ends of the data lines 62 to receive image signals from an external device, and a plurality of drain electrodes 66 formed on the other portion of the ohmic contact layer, located opposite the source electrodes 65 with respect to the gate electrodes 26 and separated from the source electrodes 65.

A protective layer 70 is formed on the data wire 62, 65, 66 and 68 and portions of the semiconductor layer 40 which are not covered with the data wire 62, 65, 66 and 68. The protective layer 70 preferably includes a SiNx layer, an a-Si:C:O layer or an a-Si:O:F layer deposited by plasma enhanced chemical vapor deposition ("PECVD") (which is called a low dielectric CVD layer), or an acrylic organic insulating layer. The a-Si:C:O layer or the a-Si:O:F layer deposited by PECVD (the low dielectric CVD layer) bears a dielectric constant equal to or less than four (ranging from two to four), which is very low. Accordingly, the low dielectric CVD layer does not have any problem due to the parasitic capacitance even with a small thickness. The low dielectric CVD layer further has excellent adhesion characteristic to other layers as well as excellent step coverage characteristic. As the low dielectric CVD layer is an inorganic CVD layer, it bears excellent heat resistance compared with an organic insulating layer. In addition, the deposition rate and the etching rate of the a-Si:C:O layer or the a-Si:O:F layer deposited by PECVD (the low dielectric CVD layer) are four to ten times faster than those of an SiNx layer. Thus, it is advantageous in view of the process time.

The protective layer 70 is provided with a plurality of contact holes 76 and 78 respectively exposing the drain electrodes 66 and the data pads 68, and the protective layer 70 and the gate insulating layer 30 has a plurality of contact holes 74 exposing the gate pads 24. The contact holes 74 and 78 exposing the pads 24 and 68 may have various shapes such as polygon or circle. The area of the contact holes 74 and 78 is preferably equal to or larger than 0.5 mm×15 μm and not larger than 2 mm×60 μm.

A plurality of pixel electrodes 82 are formed on the protective layer 70 and located in the pixel areas. The pixel electrodes 82 are electrically connected to the drain electrodes 66 through the contact holes 76. Furthermore, a plurality of subsidiary gate pads 86 and a plurality of subsidiary data pads 88 are formed on the protective layer 70. The subsidiary gate pads 86 and the subsidiary data pads 88 are connected to the gate pads 24 and the data pads 68 through the contact holes 74 and 78, respectively. The pixel electrodes 82, the subsidiary gate pads 86 and the subsidiary data pads 88 are preferably formed of indium tin oxide ("ITO") or indium zinc oxide ("IZO").

As shown in FIGS. 1 and 2, the pixel electrodes 82 overlap the gate lines 22 to form a plurality of storage capacitors. In case the storage capacity is not sufficient, a storage capacitor wire formed of the same layer as the gate wire 22, 24 and 26 may be added.

The pixel electrodes 82 may overlap the data lines 62 to maximize the aperture ratio. Even if the pixel electrodes 82 overlap the data lines 62 for large aperture ratio, the protective layer 70 made of a low dielectric CVD layer can make the parasitic capacitance generated therebetween be kept negligible.

A method of manufacturing a TFT array panel will be now described in detail with reference to FIGS. 3A to 7B as well as FIGS. 1 and 2.

Figure 3A:
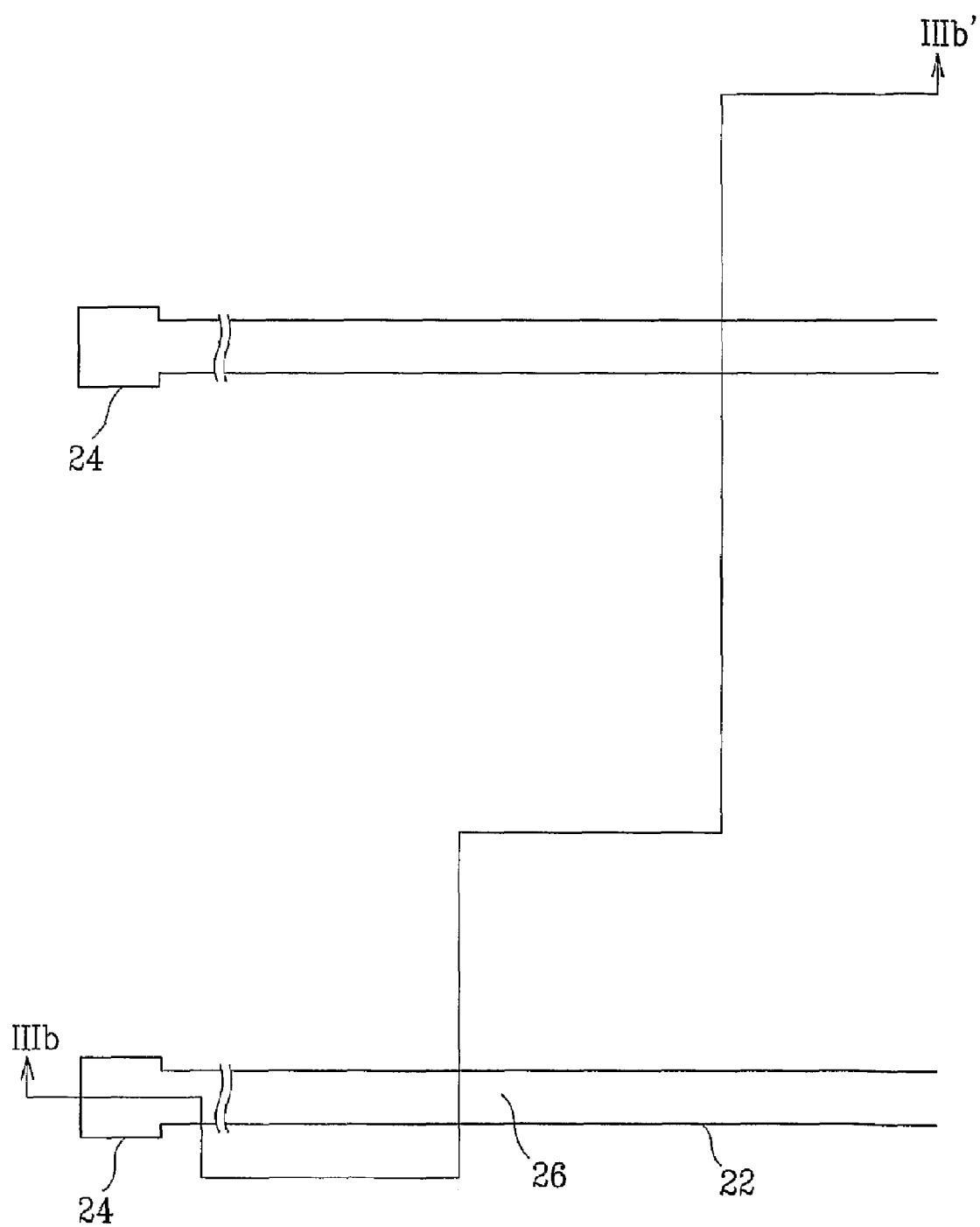
FIGS. 3A, 4A, 5A and 6A are layout views sequentially illustrating the intermediate steps of a method of manufacturing a TFT array panel for an LCD according to the first embodiment of the present invention.

First, as shown in FIGS. 3A and 3B, a Ag(Zn) thin film is deposited on a substrate 10 and photo-etched to form a gate wire 22, 24 and 26 extending in the transverse direction. The gate wire 22, 24 and 26 includes a plurality of gate lines 22, a plurality of gate electrodes 26, and a plurality of gate pads 24. The Ag(Zn) thin film is formed by co-deposition of Ag and Zn preferably using DC magnetron sputtering. Thereafter, the Ag(Zn) thin film is subject to heat treatment at about 300° C., which diffuses the Zn content and form a ZnOx layer on the surfaces of the gate wire 22, 24 and 26.

Figure 4A:
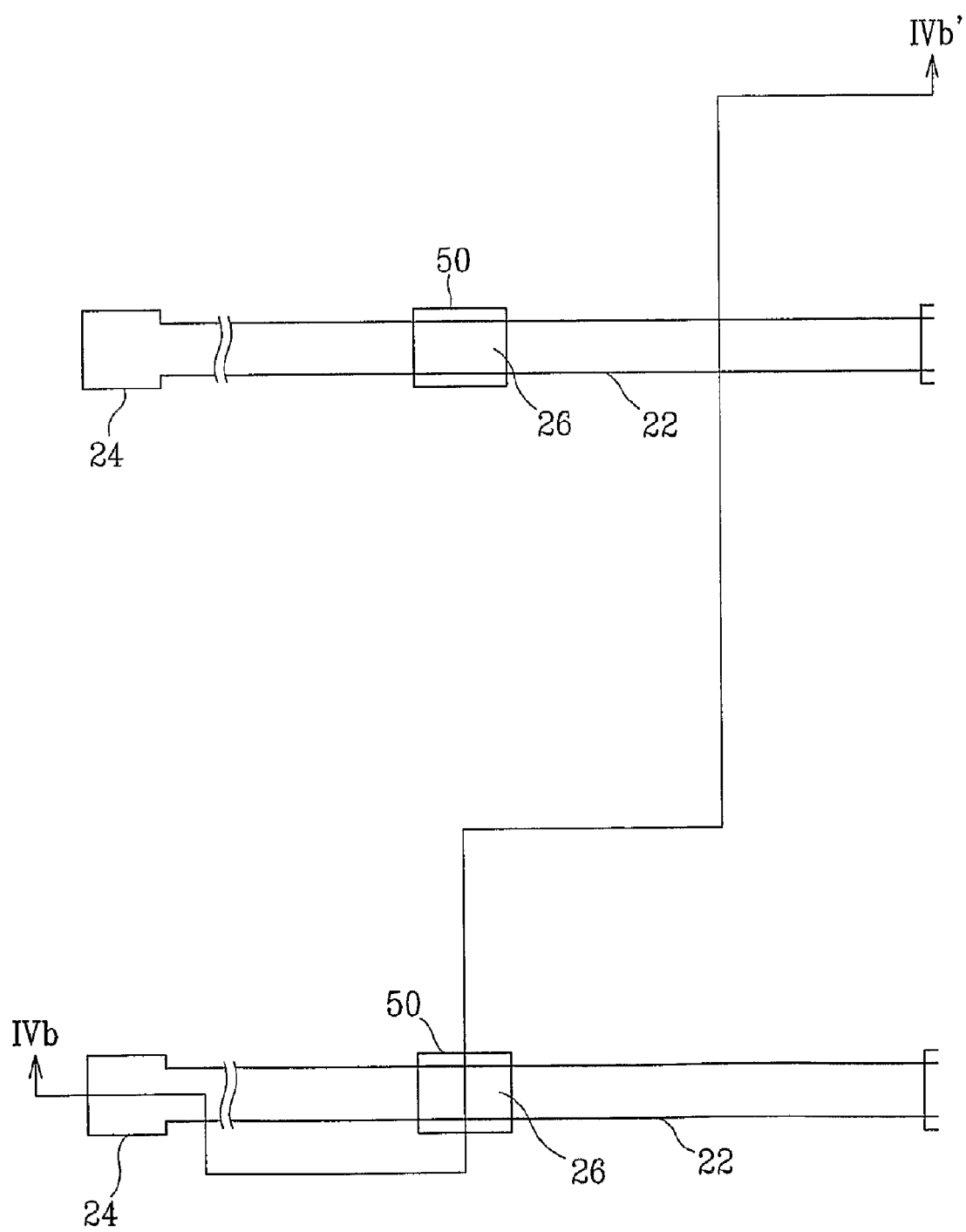
Figure 4B:
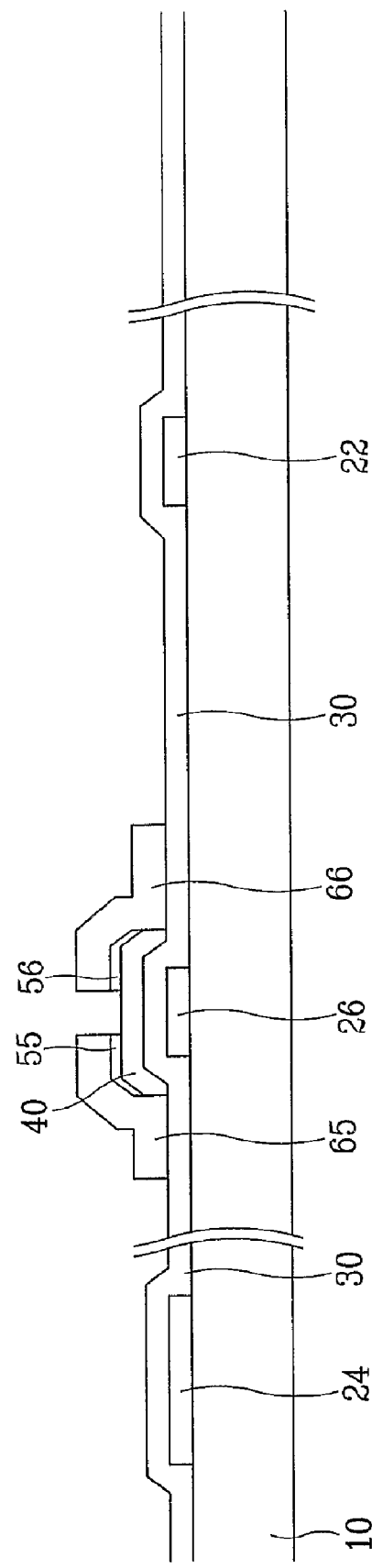
FIG. 4B is a sectional view of the TFT array panel shown in FIG. 4A taken along the line IVb-IVb' in the step following the step shown in FIG. 3B.

As shown in FIGS. 4A and 4B, triple layers including a gate insulating layer 30 preferably made of silicon nitride, a semiconductor layer preferably made of amorphous silicon, and a doped amorphous silicon layer are sequentially deposited on the substrate 10. The doped amorphous silicon layer and the semiconductor layer are photo-etched to form a doped amorphous silicon layer pattern 50 and a semiconductor pattern 40 on the gate insulating layer 30 opposite the gate electrodes 24.

Figure 5A:
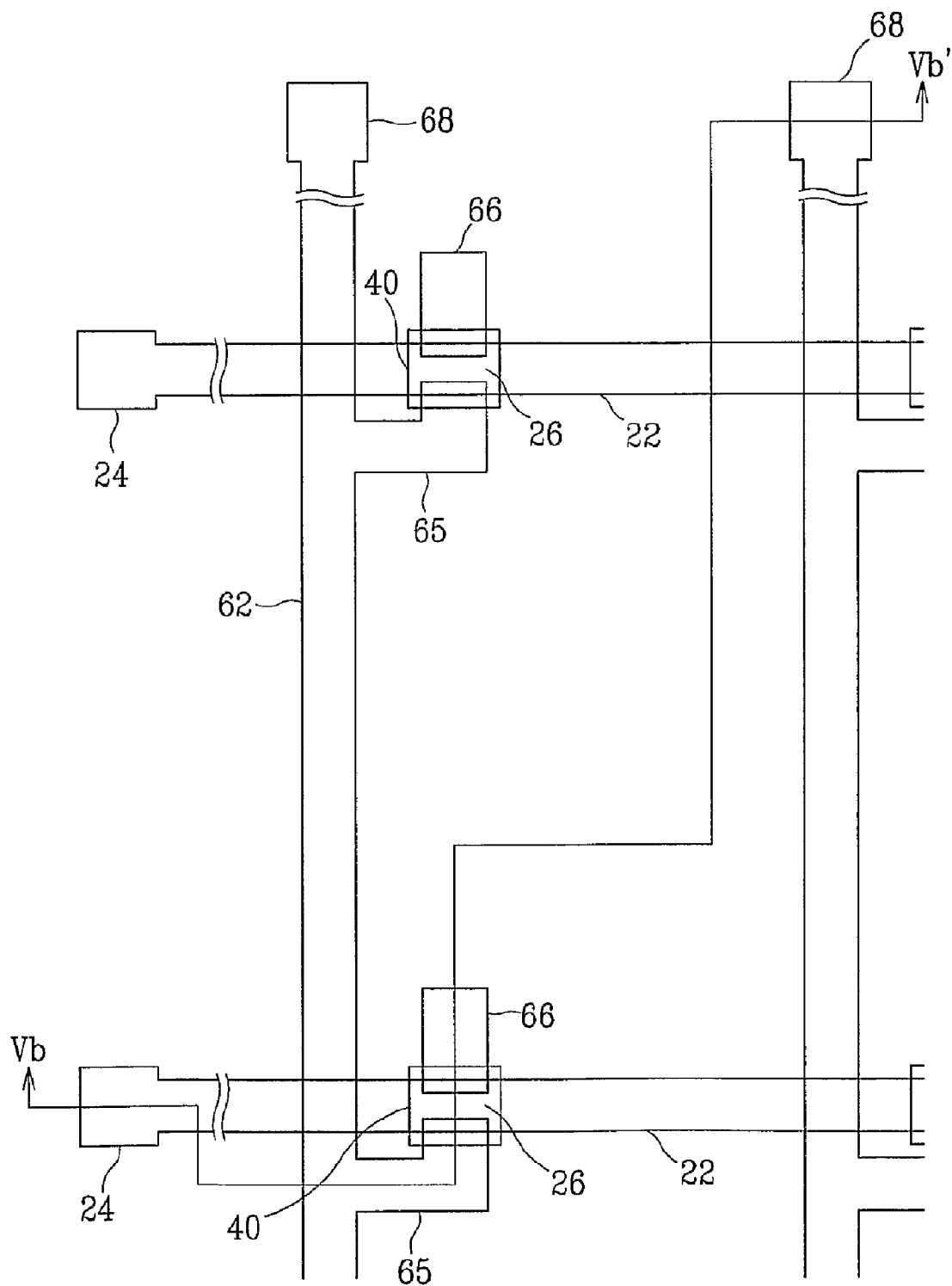
Figure 5B:
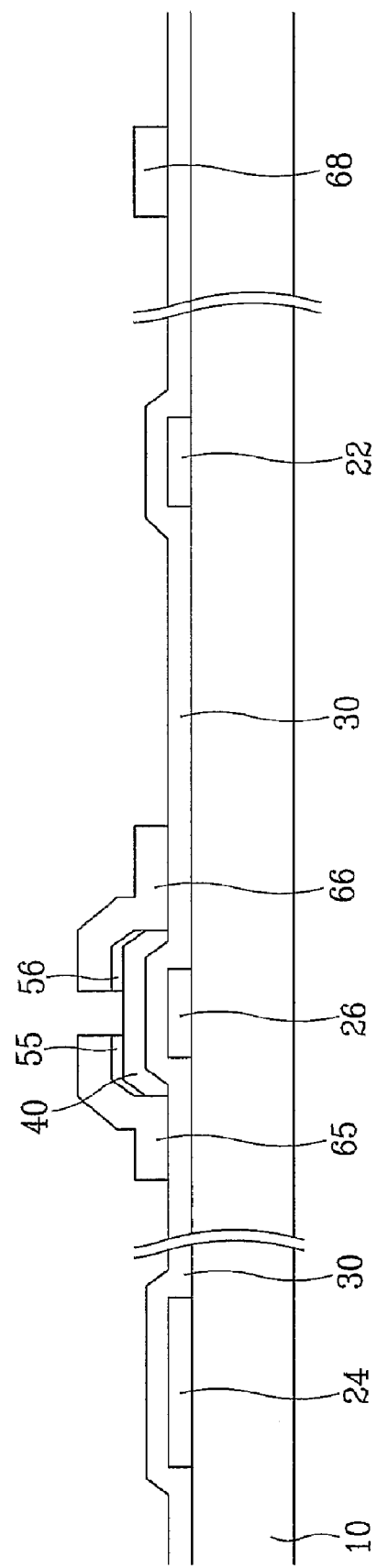
FIG. 5B is a sectional view of the TFT array panel shown in FIG. 5A taken along the line Vb-Vb' in the step following the step shown in FIG. 4B.

Thereafter, as shown in FIGS. 5A and 5B, a Ag(Zn) thin film is deposited, and photo-etched to form a data wire 62, 65, 66 and 68. The data wire 62, 65, 66 and 68 includes a plurality of data lines 62 intersecting the gate lines 22, a plurality of source electrodes 65 connected to the data lines 62 and extending onto the gate electrodes 26, a plurality of data pads 68 connected to one ends of the data lines 62, and a plurality of drain electrodes 66 separated from the source electrodes 65 and opposite the source electrodes 65 with respect to the gate electrodes 26. The Ag(Zn) thin film is formed by co-deposition of Ag and Zn preferably using DC magnetron sputtering. Thereafter, the Ag(Zn) thin film is subject to heat treatment at about 300° C., which diffuses the Zn content and form a ZnOx layer on the surfaces of the data wire 62, 65, 66 and 68.

Then, portions of the doped amorphous silicon layer pattern 50, which are not covered by the data wire 62, 65, 66 and 68, are removed such that an ohmic contact layer 55 and 56 including a plurality of pairs of two separated portions with respect to the gate electrodes 26 is formed and portions of the semiconductor layer 40 between the separated portions of the ohmic contact layer 55 and 56 are exposed. In order to stabilize the exposed surface of the semiconductor layer 40, oxygen plasma treatment is preferably performed.

Figure 6A:
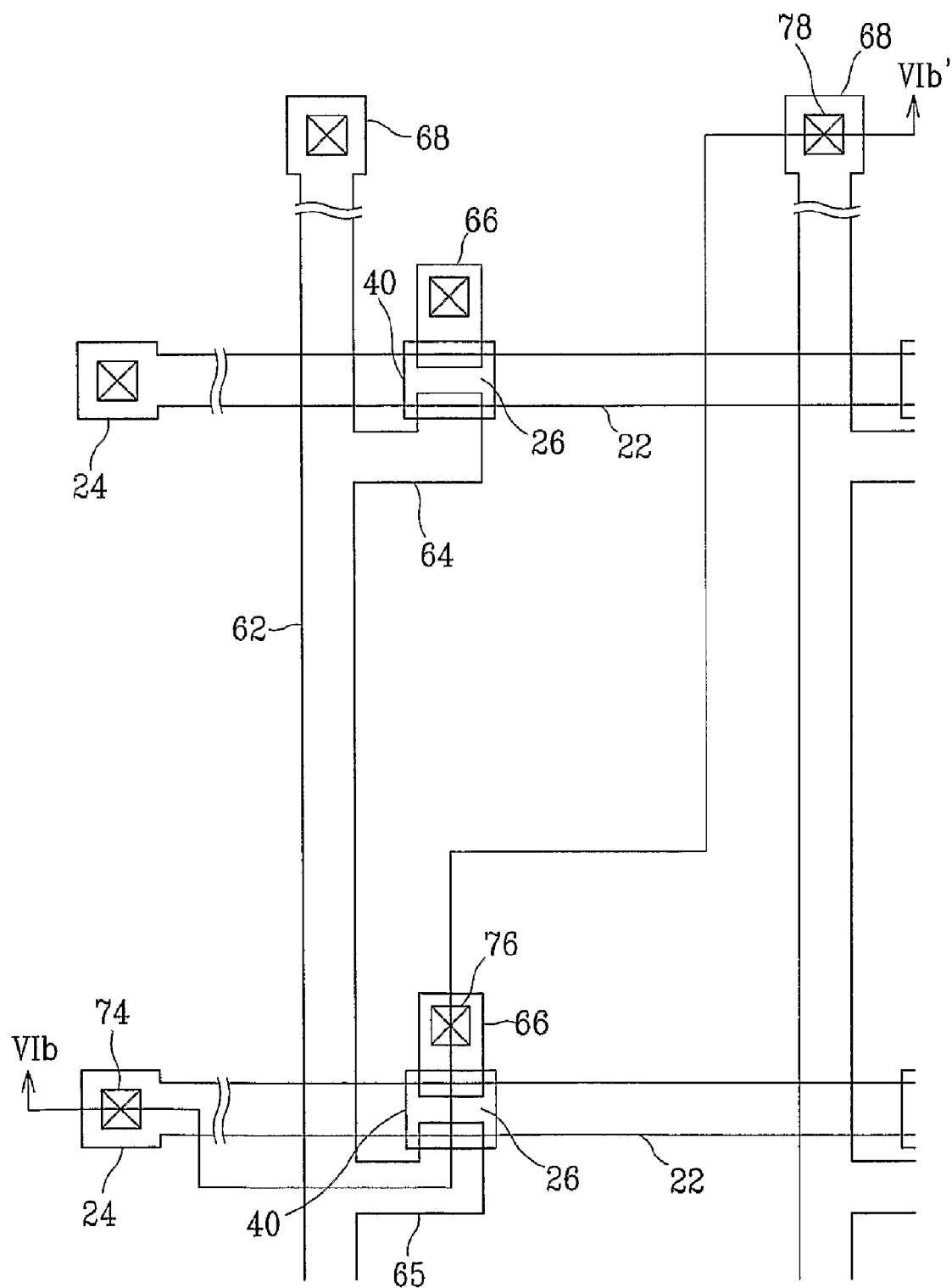
Figure 6B:
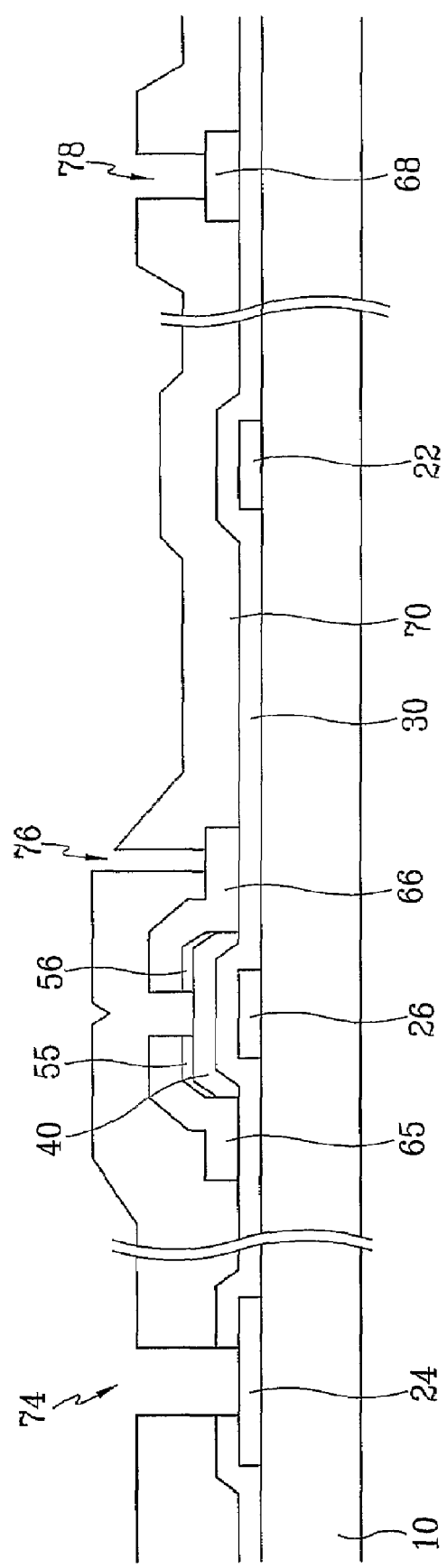
FIG. 6B is a sectional view of the TFT array panel shown in FIG. 6A taken along the line VIb-VIb' in the step following the step shown in FIG. 5B.

As shown in FIGS. 6A and 6B, a protective layer 70 is formed by CVD of silicon nitride, a-Si:C:O or a-Si:O:F, or by coating an organic insulating material.

The protective layer 70 together with the gate insulating layer 30 is photo-etched to form a plurality of contact holes 74, 76 and 78 exposing the gate pads 24, the drain electrodes 66 and the data pads 68. The contact holes 74, 76 and 78 may have polygonal or circular shapes. The area of the contact holes 74 and 78 is preferably equal to or larger than 0.5 mm×15 μm and not larger than 2 mm×60 μm.

Finally, as shown in FIGS. 1 and 2, an ITO layer or an IZO layer is deposited and photo-etched to form a plurality of pixel electrodes 82, a plurality of subsidiary gate pads 86 and a plurality of subsidiary data pads 88. The pixel electrodes 82 are connected to the drain electrodes 66 through the first contact holes 76. The subsidiary gate pads 86 and the subsidiary data pads 88 are connected to the gate pads 24 and the data pads 68 through the second and the third contact holes 74 and 78, respectively. Nitrogen gas is preferably used for the pre-heating process before the deposition of the ITO layer or the IZO layer. This is to prevent the formation of a metal oxide layer on portions of the metallic layers 24, 66 and 68 exposed through the contact holes 74, 76 and 78.

As described above, the heat treatment of the gate wire and the data wire made of silver alloy Ag(Zn) implements the low resistance wires wire and ensures the reliability thereof.

In the first embodiment, both the gate wire and the data wire are made of Ag(Zn). Alternatively, only one of the gate wire and the data wire may be made of Ag(Zn).

This technique is applied to a manufacturing method using five masks as described above. However, the technique may be well adapted for a method of a TFT array panel for an LCD using four masks. It is described in detail with reference to the drawings.

First, a structure of a pixel unit on a TFT array panel for an LCD manufactured using four masks according to an embodiment of the present invention.

Figure 7:
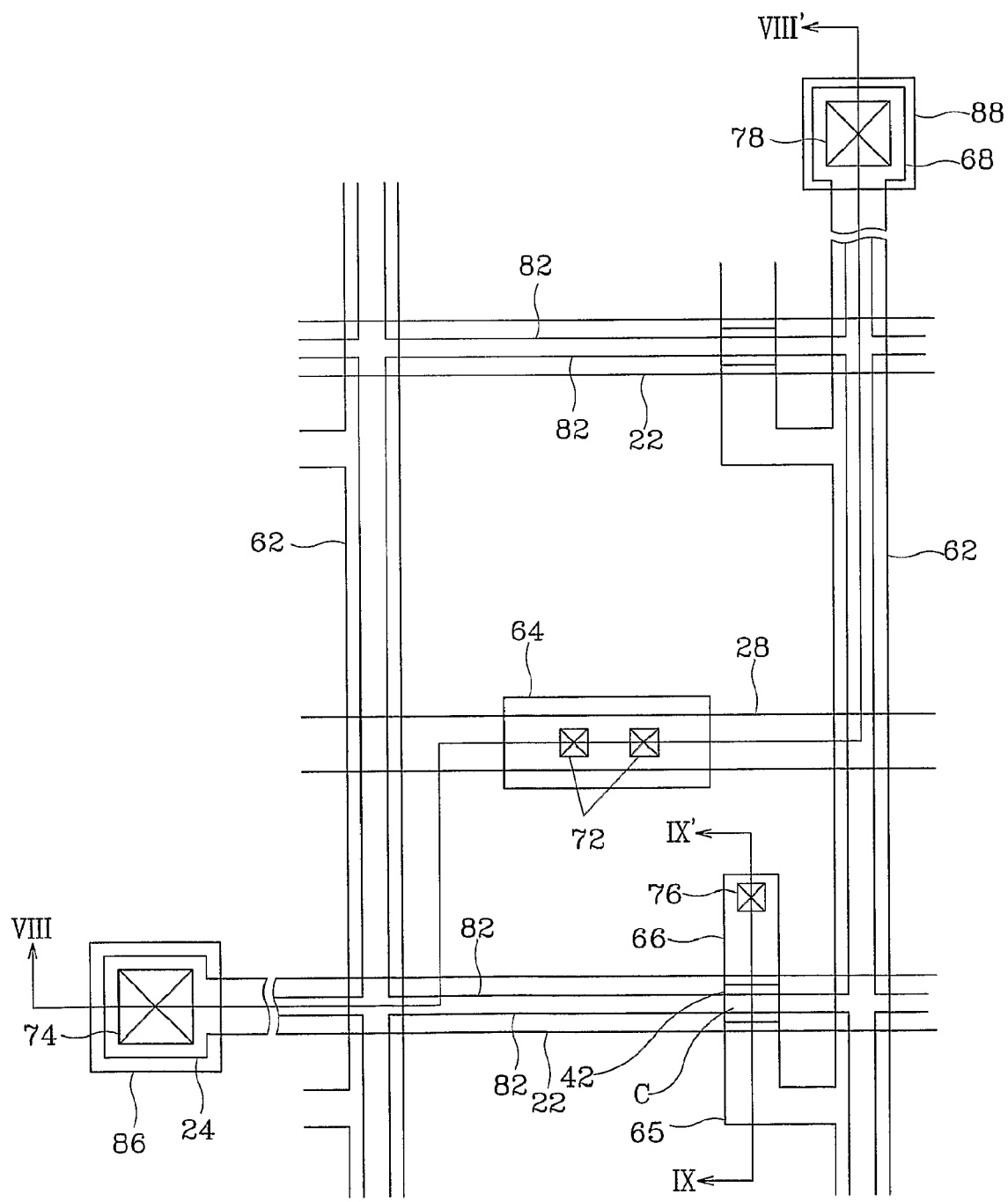
FIG. 7 is a layout view of a TFT array panel for a LCD according to a second embodiment of the present invention.
Figure 8:
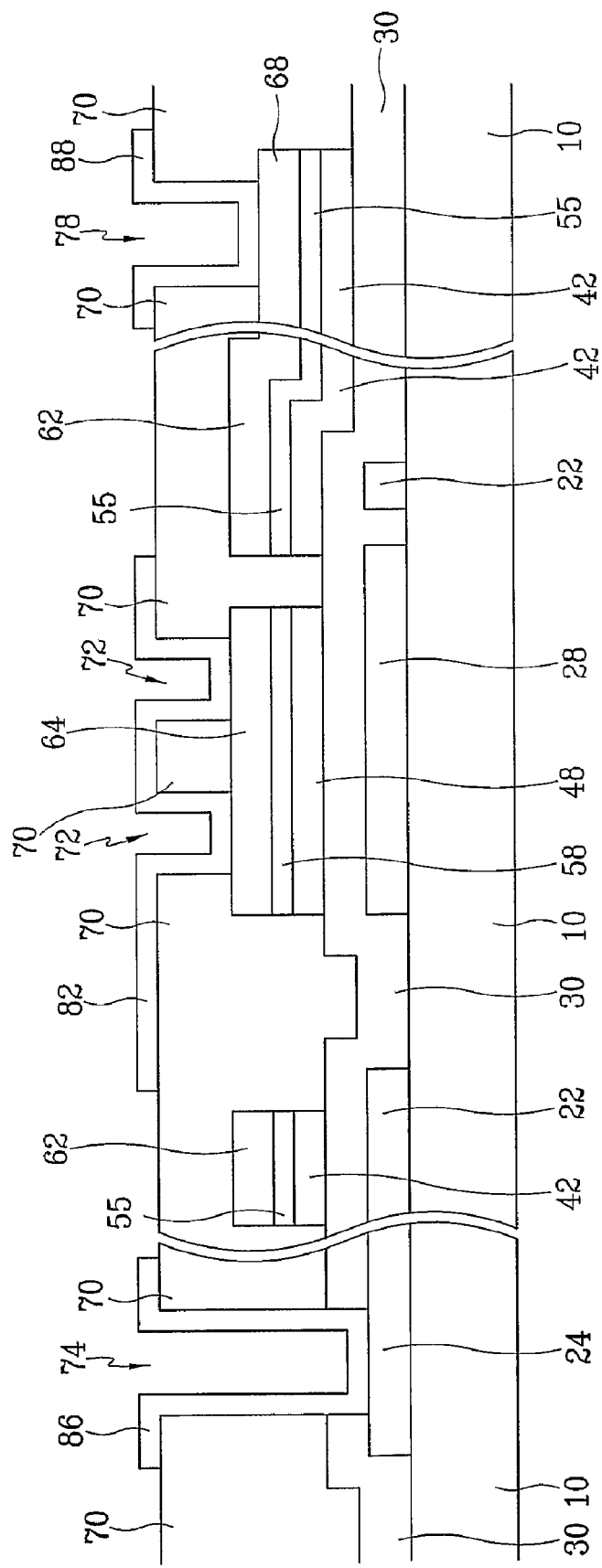
FIGS. 8 and 9 are sectional views of the TFT array panel shown in FIG. 7 taken along the line VIII-VIII' and the line IX-IX', respectively.
Figure 9:
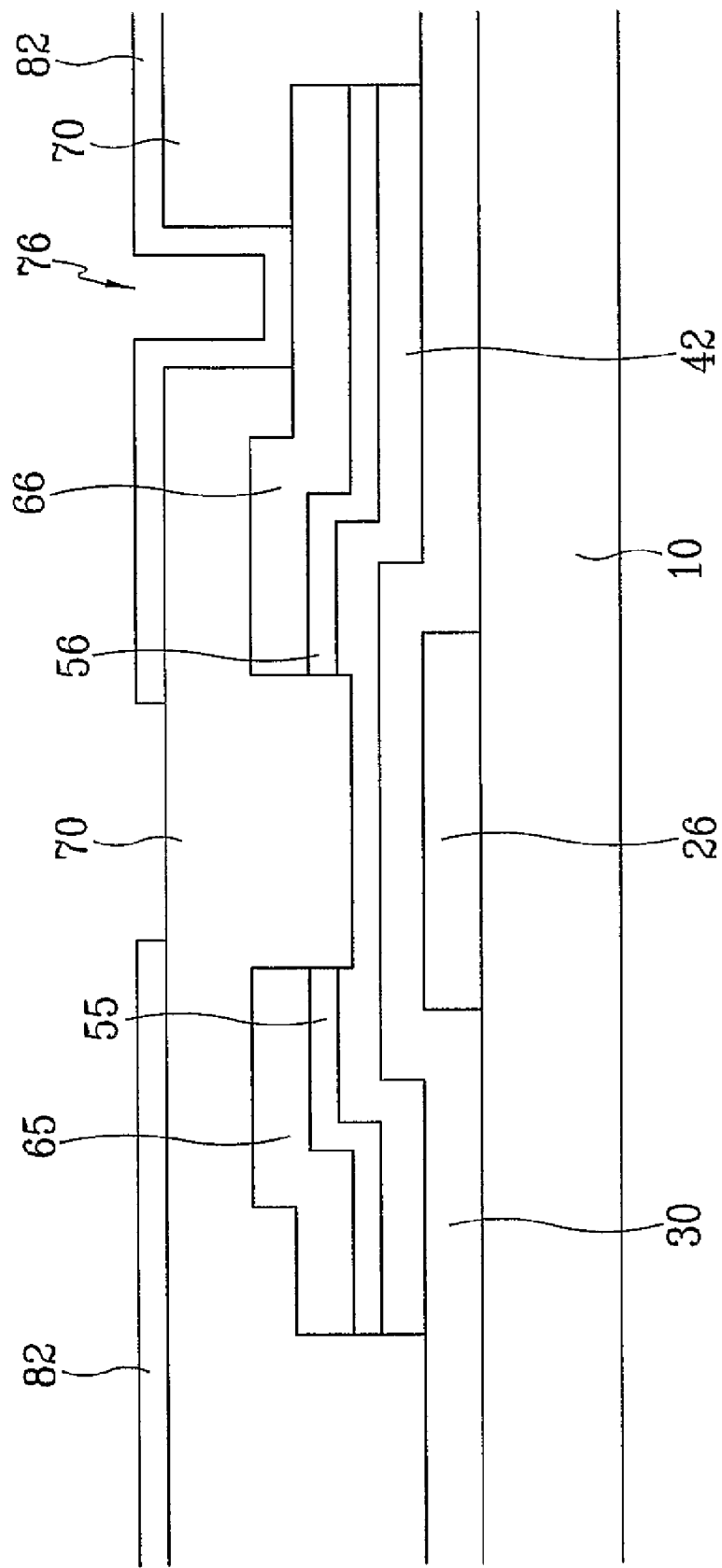

FIG. 7 is a layout view of a TFT array panel for an LCD according to a second embodiment of the present invention, and FIGS. 8 and 9 are sectional views of the TFT array panel shown FIG. 7 taken along the line VIII-VIII' and the line IX-IX', respectively.

A gate wire 22, 24 and 26 is formed on an insulating substrate 10. Like the first embodiment, the gate wire 22, 24 and 26 is made of Ag(Zn) alloy including Ag and additional Zn. A ZnOx layer, which is an oxide of the additive Zn, is formed on the surfaces of the gate wire 22, 24 and 26. The gate wire includes a plurality of gate lines 22, a plurality of gate pads 24, and a plurality of gate electrodes 26.

A plurality of storage capacitor lines 28 parallel to the gate lines 22 are formed on the substrate 10. The storage capacitor lines 28 are also made of Ag(Zn) alloy including Ag and additional Zn. A ZnOx layer, which is an oxide of the additive Zn, is formed on the surfaces of the storage capacitor lines 28. The storage capacitor lines 28 overlap storage capacitor conductors 64 connected to pixel electrodes 82 to form storage capacitors for enhancing the charge storing capacity of the pixels, which is described later. In case the overlapping of the pixel electrodes 82 and the gate lines 22 gives sufficient storage capacitance, the storage capacitor electrode lines 28 may be omitted. A voltage applied to a common electrode on an upper panel is usually applied to the storage capacitor electrode lines 28.

A gate insulating layer 30 preferably made of SiNx is formed on the gate wire 22, 24 and 26 and the storage capacitor electrode lines 28 to cover the gate wire 22, 24 and 26 and the storage capacitor electrode lines 28.

A semiconductor pattern 42 and 48 preferably made of hydrogenated amorphous silicon are formed on the gate insulating layer 30. An ohmic contact pattern (or an intermediate layer pattern) 55, 56 and 58 preferably made of amorphous silicon heavily doped with n type impurities such as phosphorous P are formed on the semiconductor pattern 42 and 48.

A data wire 62, 64, 65, 66 and 68 is formed on the ohmic contact pattern 55, 56 and 58. The data wire 62, 64, 65, 66 and 68 is made of Ag(Zn) alloy including Ag and additional Zn. A ZnOx layer, which is an oxide of the additive Zn, is formed on the surfaces of the data wire 62, 64, 65, 66 and 68. The data wire 62, 64, 65, 66 and 68 includes a plurality of data line units 62, 65 and 68, a plurality of drain electrodes 66 for TFTs, and a plurality of storage capacitor conductors 64. Each data line unit 62, 65 and 68 includes a data line 62 extending in the longitudinal direction, a data pad 68 connected to one end of the data line 62 to receive image signals from an external device, and a plurality of source electrodes 65 of TFTs branched from the data line 62. Each drain electrode 66 is separated from the data line units 62, 65 and 68 and placed opposite to the corresponding source electrode 65 with respect to the corresponding gate electrode 26 or the channel portion C of the TFT. The storage capacitor conductors 64 are placed over the storage capacitor electrode lines 28. In the absence of the storage capacitor electrode lines 28, the storage capacitor conductors 64 are also omitted.

The ohmic contact pattern 55, 56 and 58 reduces the contact resistance between the underlying semiconductor pattern 42 and 48 and the overlying data wire 62, 64, 65, 66 and 68 and has substantially the same shape as the data wire 62, 64, 65, 66 and 68. That is, the ohmic contact pattern 55, 56 and 58 includes a plurality of data-line ohmic contacts 55 having substantially the same shapes as the data line units 62, 68 and 65, a plurality of drain-electrode ohmic contacts 56 having substantially the same shapes as the drain electrodes 66, and a plurality of storage-capacitor ohmic contacts 58 having substantially the same shapes as the storage capacitor conductors 64.

Meanwhile, the semiconductor pattern 42 and 48 has substantially the same shape as the data wire 62, 64, 65, 66 and 68 and the ohmic contact pattern 55, 56 and 58 except for the TFT channel areas C. Specifically, the semiconductor pattern 42 and 48 includes a plurality of storage-capacitor semiconductors 48 having substantially the same shapes as the storage capacitor conductors 64 and the storage-capacitor ohmic contacts 58 and a plurality of TFT semiconductors 42 which have a little different shapes from the remains of the data wire and the ohmic contact pattern. That is, the source and the drain electrodes 65 and 66 are separated from each other at the TFT channel areas C, where the data-line ohmic contacts 55 and the drain-electrode ohmic contacts 56 are also separated from each other. However, the TFT semiconductors 42 continue to proceed there without disconnection to form TFT channels.

A protective layer 70 is formed on the data wire 62, 64, 65, 66 and 68. The protective layer 70 preferably includes a SiNx layer, an a-Si:C:O layer or an a-Si:O:F layer deposited by PECVD (a low dielectric CVD layer), or an organic insulating layer. The protective layer 70 has a plurality of contact holes 76, 78 and 72 exposing the drain electrodes 66, the data pads 68 and the storage capacitor conductors 64. The protective layer 70 together with the gate insulating layer 30 is further provided with a plurality of contact holes 74 exposing the gate pads 24.

A plurality of pixel electrodes 82 receiving image signals from the TFTs and generating electric fields in cooperation with an electrode of an upper panel are formed on the protective layer 70. The pixel electrodes 82 are formed of a transparent conductive material such as ITO and IZO. The pixel electrodes 82 are physically and electrically connected to the drain electrodes 66 through the contact holes 76 to receive the image signals. The pixel electrodes 82 overlap the neighboring gate lines 22 and the adjacent data lines 62 to enlarge the aperture ratio, but the overlapping may be omitted. The pixel electrodes 82 are also connected to the storage capacitor conductors 64 through the contact holes 72 to transmit the image signals to the conductors 64.

Meanwhile, a plurality of subsidiary gate pads 86 and a plurality of subsidiary data pads 88 are formed on the gate pads 24 and the data pads 68 to be connected thereto through the contact holes 74 and 78, respectively. The subsidiary gate pads 86 and the subsidiary data pads 88 compensate the adhesiveness of the pads 24 and 68 to external circuit devices and protect the pads 24 and 68. The subsidiary gate pads 86 and the subsidiary data pads 88 are not requisites but may be introduced in a selective mauler.

A method of manufacturing the TFT array panel for an LCD shown in FIG. 7-9 using four masks will be now described in detail with reference to FIGS. 10A to 17C as well as FIGS. 8 and 9.

Figure 10A:
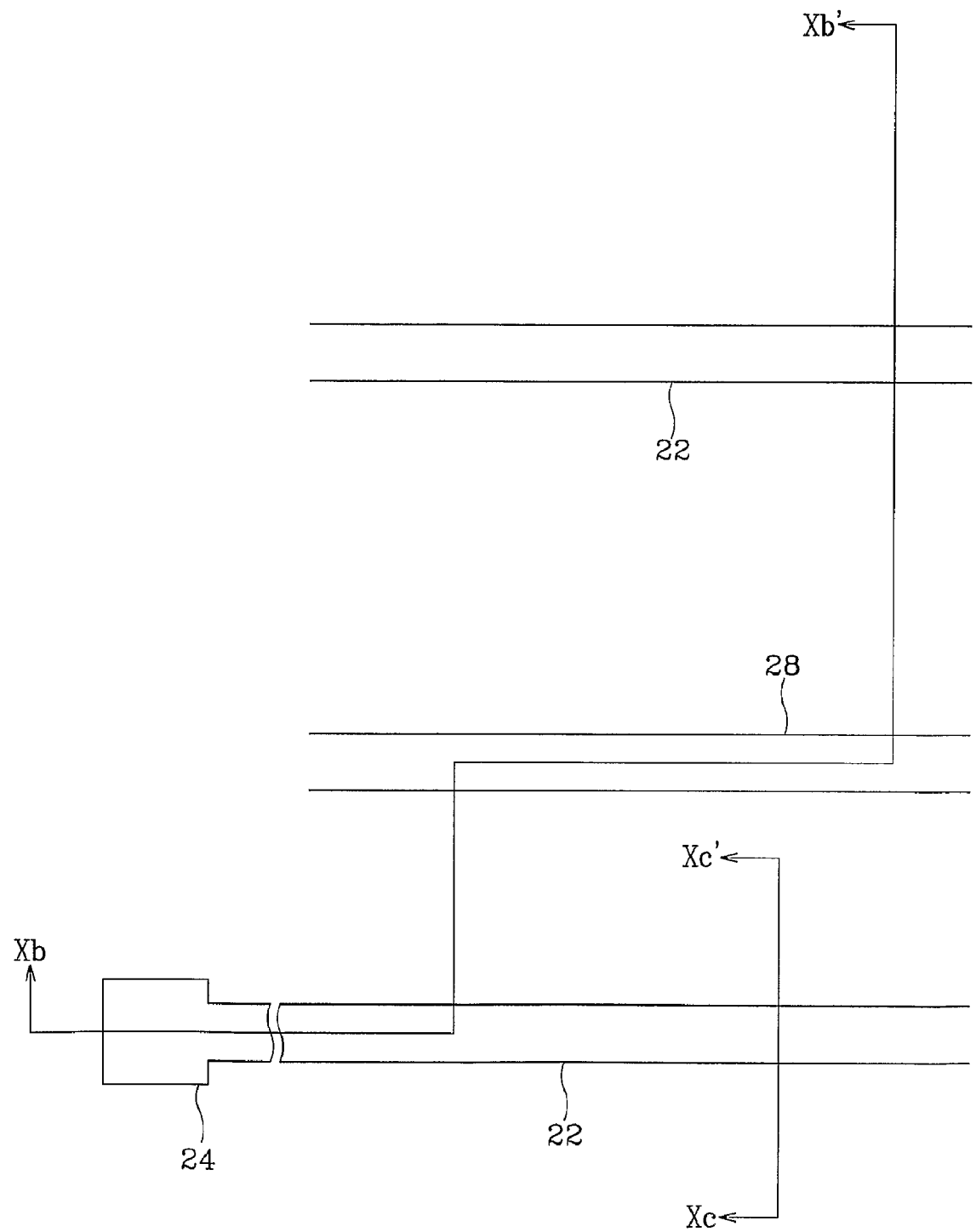
FIG. 10A is a layout view of the TFT array panel shown in FIG. 7 in the first step of a manufacturing method according to the second embodiment of the present invention.
Figure 10B:
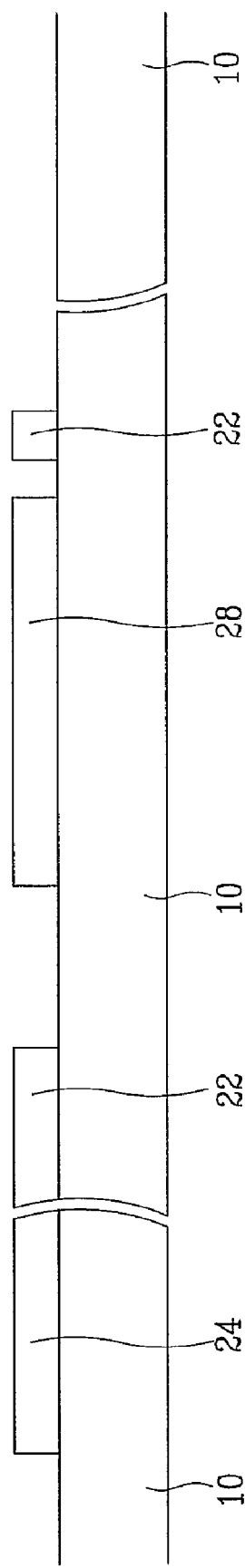
FIGS. 10B and 10C are sectional views of the TFT array panel shown in FIG. 10A taken along the line Xb-Xb' and the line Xc-Xc', respectively.
Figure 10C:
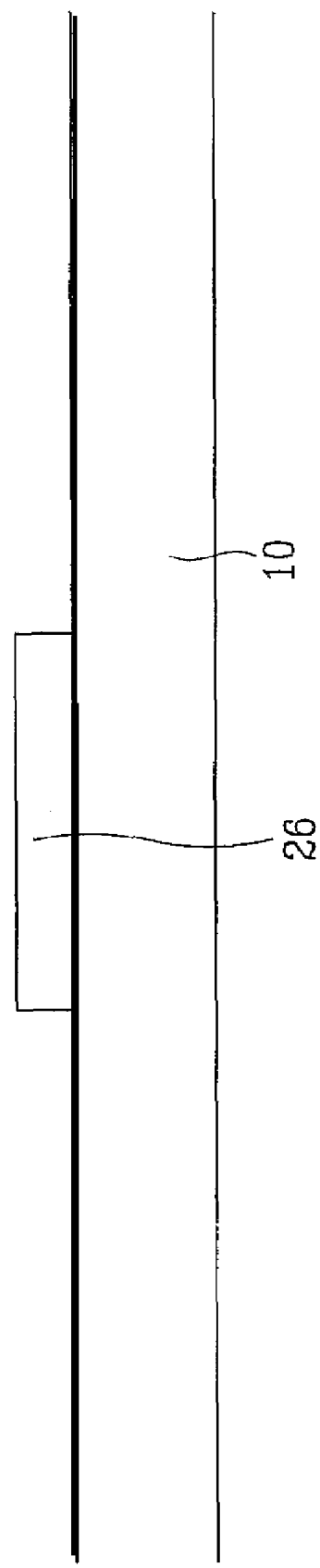

First, as shown in FIGS. 10A to 10C, a Ag(Zn) thin film is deposited on a substrate 10, and photo-etched to form a gate wire 22, 24 and 26 and a plurality of storage capacitor electrode lines 28 extending in the transverse direction like the first embodiment. The gate wire 22, 24 and 26 includes a plurality of gate lines 22, a plurality of gate electrodes 26, and a plurality of gate pads 24. The Ag(Zn) thin film is formed by co-deposition of Ag and Zn preferably using DC magnetron sputtering. Thereafter, the Ag(Zn) thin film is subject to heat treatment at about 300° C., which diffuses the Zn content and form a ZnOx layer on the surfaces of the gate wire 22, 24 and 26.

Figure 11A:
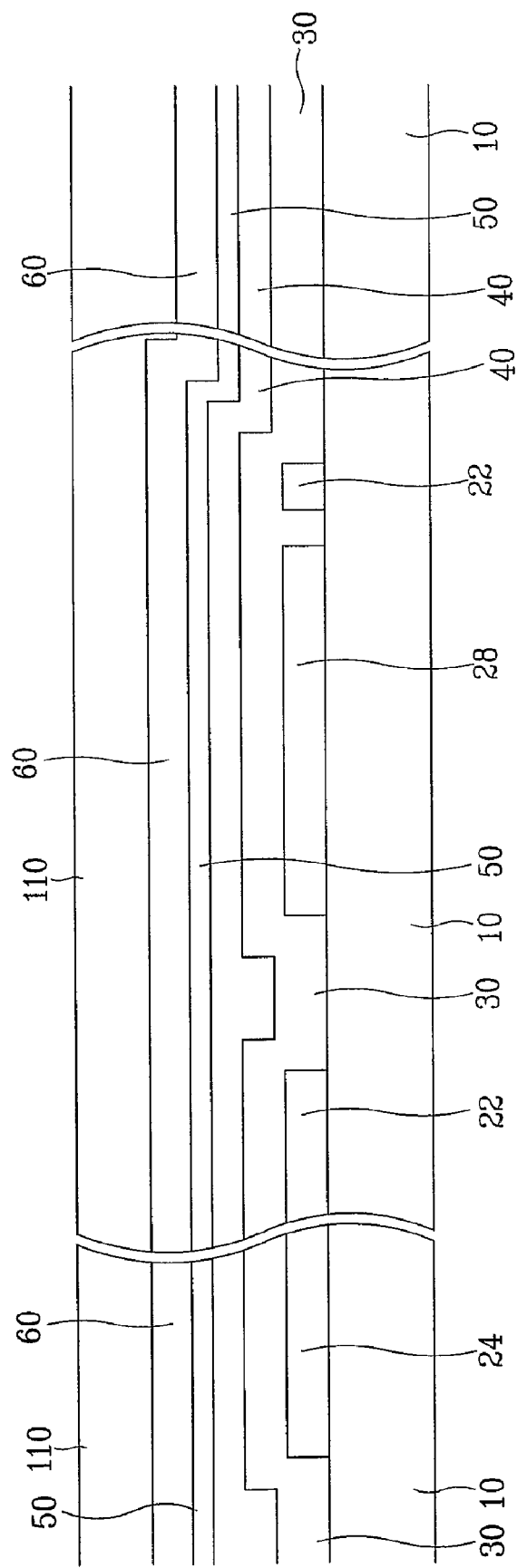
FIGS. 11A and 11B are sectional views of the TFT array panel shown in FIG. 10A taken along the line Xb-Xb' and the line Xc-Xc', respectively, in the step following the step illustrated in FIGS. 10B and 10C.
Figure 11B:
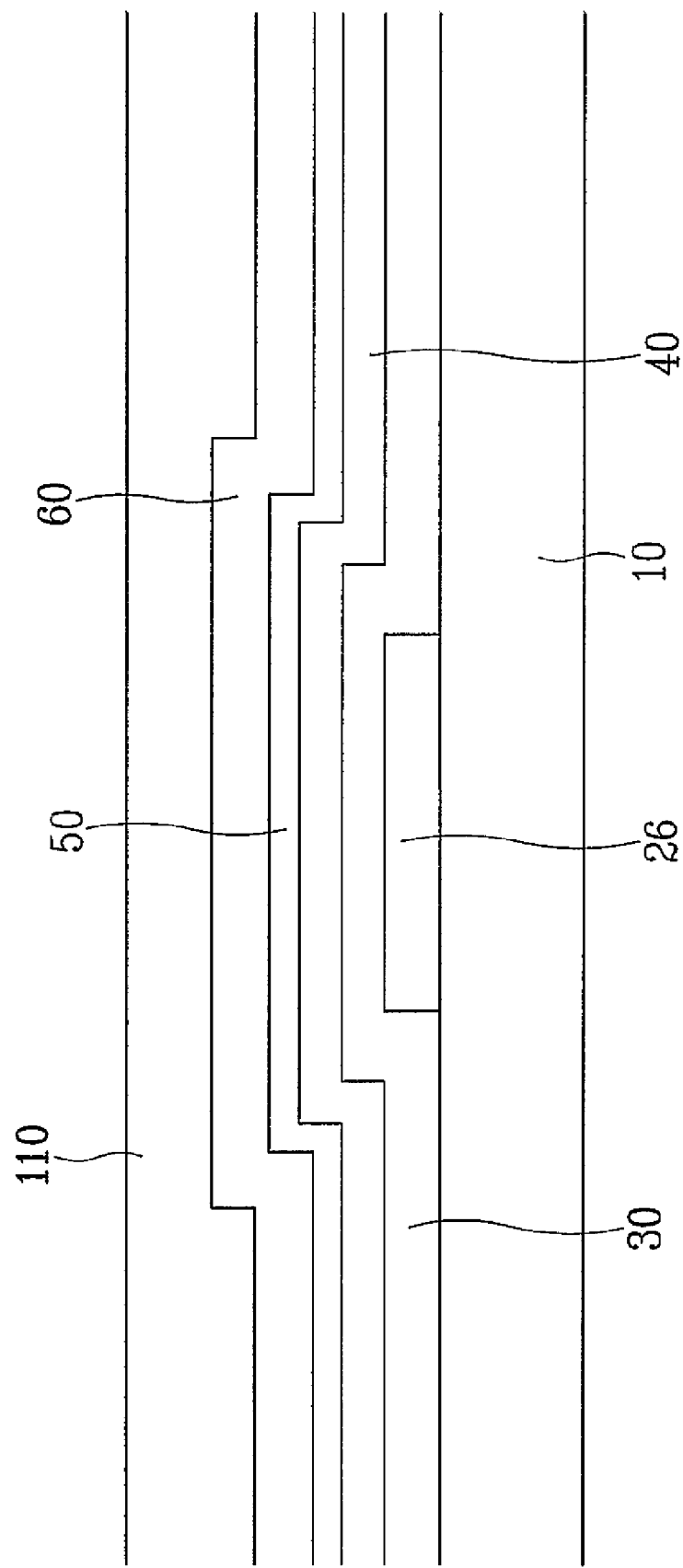

As shown in FIGS. 11A and 11B, a silicon nitride gate insulating layer 30 with 1,500-5,000Å thickness, a semiconductor layer 40 with 500-2,000Å thickness, and an intermediate layer 50 with 300-600Å thickness are sequentially deposited on the substrate 10 by CVD. A conductive layer 60 for a data wire is formed on the intermediate layer 50, and a photoresist film 110 with thickness of 1-2 microns is coated thereon. The conductive layer 60 is formed of a Ag(Zn) alloy layer by co-deposition of Ag and Zn preferably using DC magnetron sputtering.

Figure 12A:
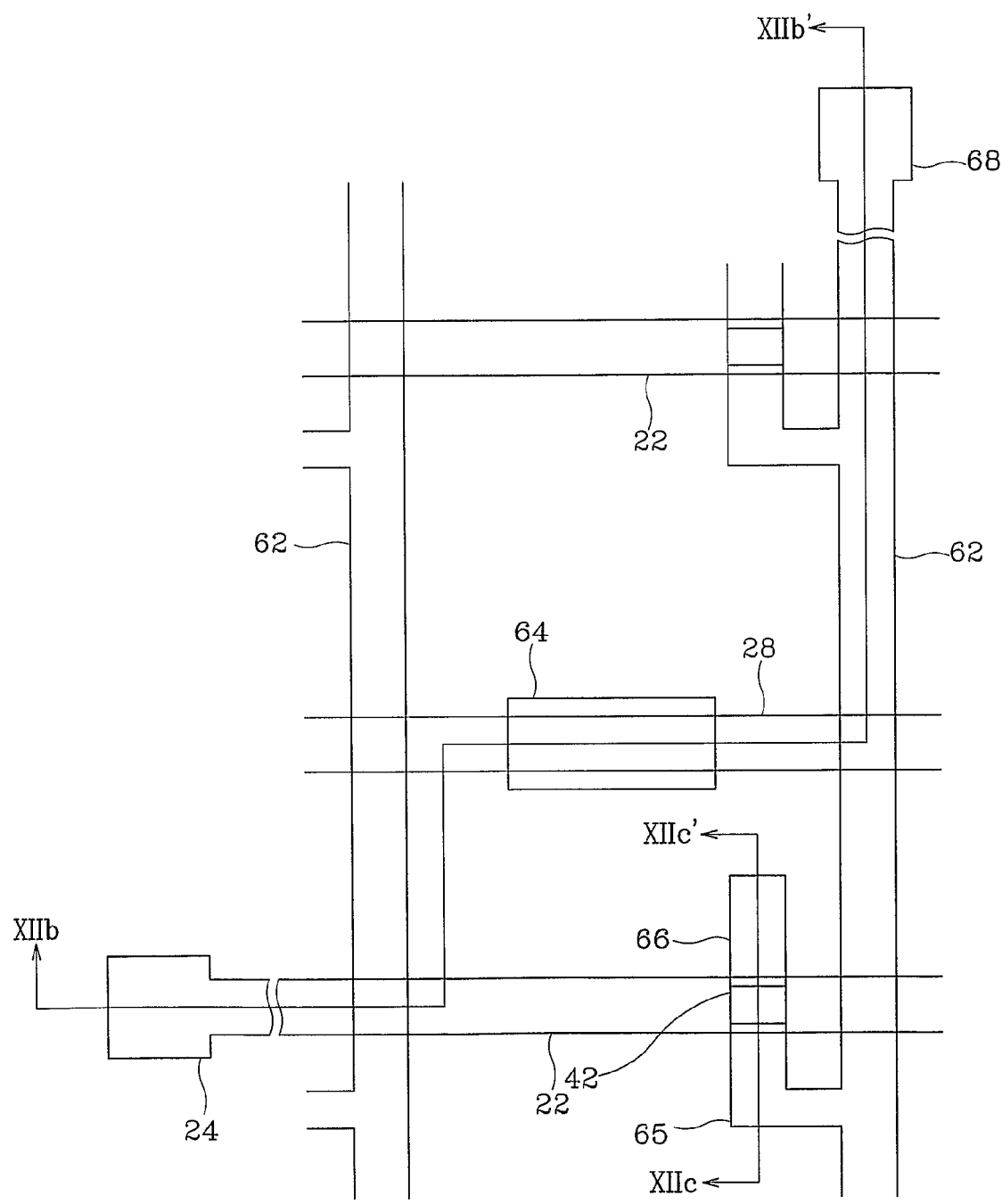
FIG. 12A is a layout view of the TFT array panel in the step following the step illustrated in FIGS. 11A and 11B.
Figure 12B:
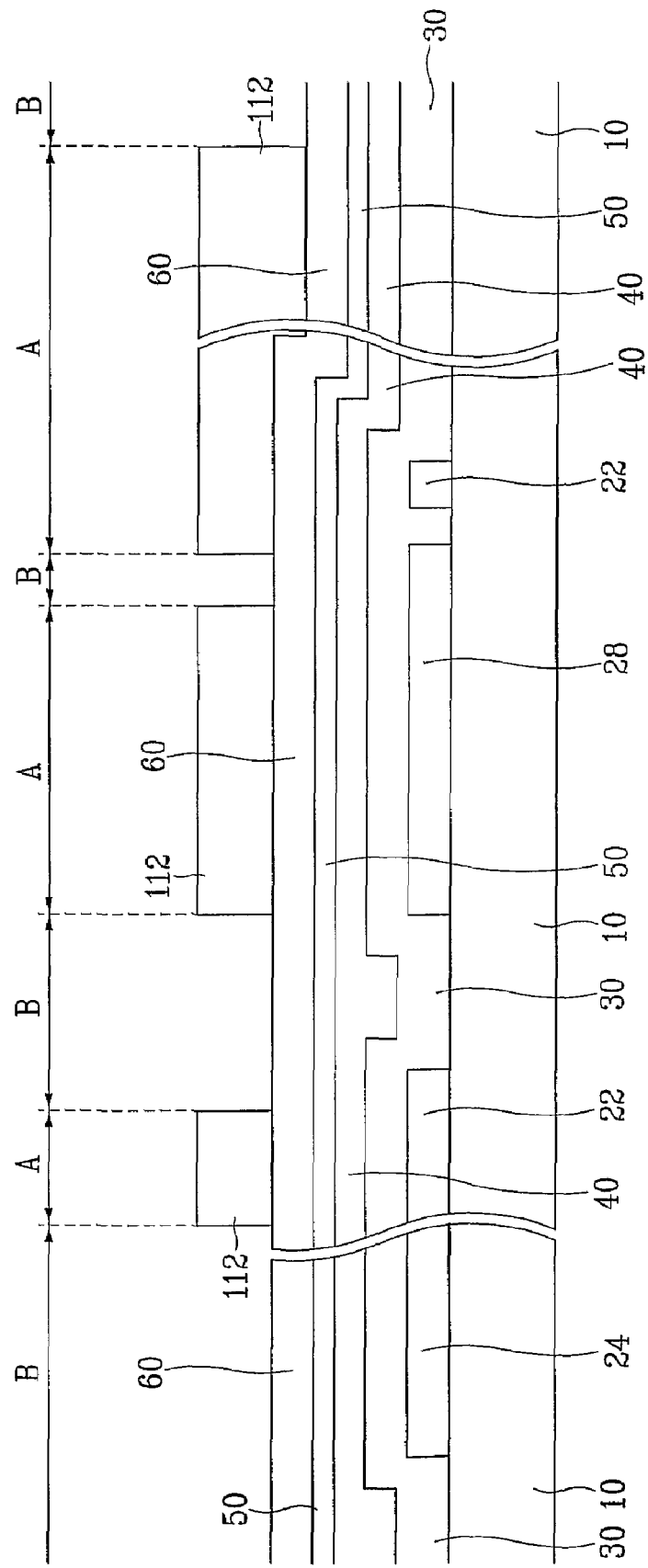

Thereafter, the photoresist film 110 is exposed to light through a mask and is developed to form a photoresist pattern 112 and 114 having a plurality of first portions and a plurality of second portions as shown in FIGS. 12B and 12C. Each of the first portions 114 of the photoresist pattern 112 and 114 is located on the channel area C of a TFT, which is placed between a source electrode 65 and a drain electrode 66. Each of the second portions 112 is located on a data area A located at a place where a data wire 62, 64, 65, 66 and 68 will be formed. All portions of the photoresist film 110 on the remaining areas B are removed, and the first portions 114 are made to be thinner than the second portions 112. Here, the ratio of the thickness of the first portion 114 on the channel area C and the second portion 112 on the data area A is adjusted depending on process conditions of subsequent etching steps described later, and it is preferable that the thickness of the first portion 114 is equal to or less than a half of that of the second portion 112, for example, equal to or less than 4,000 Å.

The position-dependent thickness of the photoresist pattern 112 and 114 are obtained by several techniques. A slit pattern, a lattice pattern or a translucent film is provided on the mask in order to adjust the light transmittance in the area C.

When using a slit pattern, it is preferable that width of the slits and a gap between the slits is smaller than the resolution of an exposer used for the photolithography. In case of using a translucent film, thin films with different transmittances or different thickness may be used to adjust the transmittance on the masks.

When a photoresist film 110 is exposed to light through such a mask, polymers of a portion directly exposed to the light are almost completely decomposed, and those of a portion exposed to the light through a slit pattern or a translucent film are not completely decomposed because the amount of a light irradiation is small. The polymers of a portion of the photoresist film 110 blocked by a light-blocking film provided on the mask is hardly decomposed. After the photoresist film 110 is developed, the portions containing the polymers, which are not decomposed, is left. At this time, the thickness of the portion with less light exposure is thinner than that of the portion without light exposure. Since too long exposure time decomposes all the molecules, it is necessary to adjust the exposure time.

The first portion 114 of the photoresist pattern 112 and 114 may be obtained using reflow. That is, the photoresist film 100 is made of a reflowable material and exposed to light through a normal mask having opaque and transparent portions. The photoresist film 110 is then developed and subject to reflow such that portions of the photoresist film 110 flows down onto areas without photoresist, thereby forming the thin portion 114.

Next, the photoresist film 114 and the underlying layers including the conductive layer 60, the intermediate 50 and the semiconductor layer 40 are etched such that the data wire and the underlying layers are left on the data areas A, only the semiconductor layer is left on the channel areas C, and all the three layers 60, 50 and 40 are removed to expose the gate insulating layer 30 on the remaining areas B.

Figure 13A:
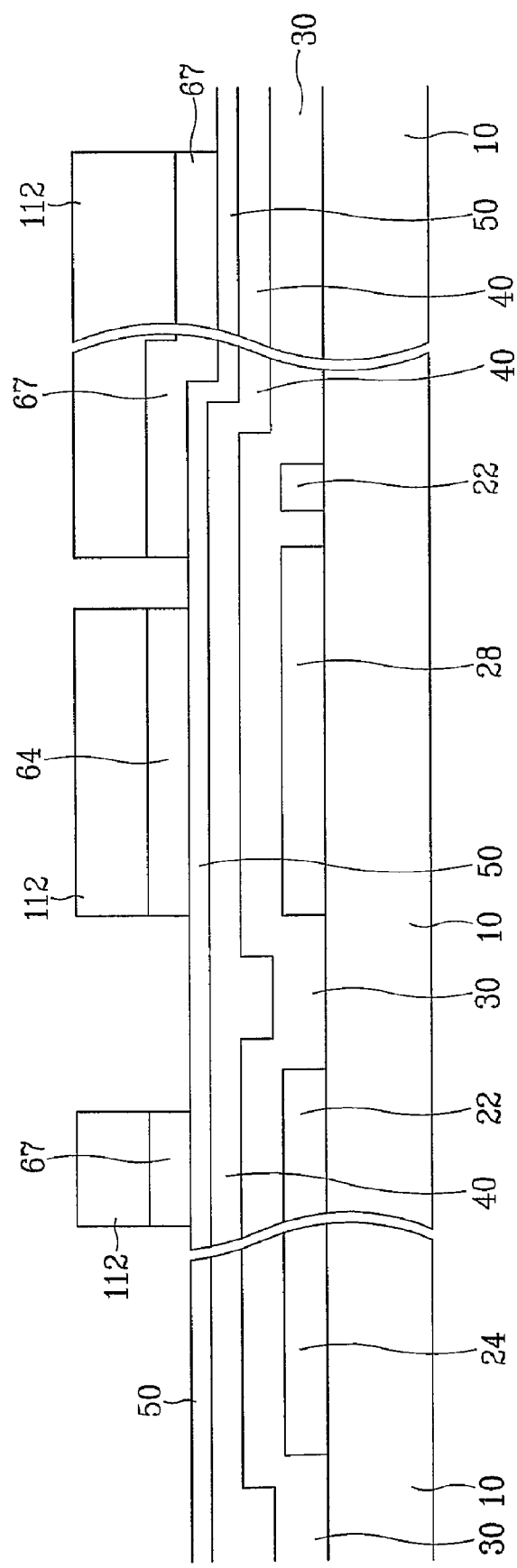

First, as shown in FIGS. 13A and 13B, the exposed portions of the conductive layer 60 on the other areas B are removed to expose the underlying portions of the intermediate layer 50. Both dry etch and wet etch are selectively used in this step and preferably performed under the condition that the conductive layer 60 is easily etched and the photoresist pattern 112 and 114 are hardly etched. However, since it is hard to identify the above-described condition for dry etch, and the dry etch may be performed under the condition that the photoresist pattern 112 and 114 and the conductive layer 60 are etched simultaneously. In this case, the first portion 114 for dry etch is preferably made to be thicker than that for the wet etch to prevent the removal of the first portion 114 and thus the exposure of the underlying portions of the conductive layer 60.

As a result, as shown in FIG. 13A and FIG. 13B, only the portions of the conductive layer 60 on the channel areas C and the data areas A, that is, the source/drain ("S/D") conductors 67 and the storage capacitor conductors 64 are left and the remaining portions of the conductive layer 60 on the remaining areas B are removed to expose the underlying portions of the intermediate layer 50. Here, the S/D conductors 64 have substantially the same planar shapes as the data wire 62, 64, 65, 66 and 68 except that the source electrodes 65 and the drain electrodes 66 are not disconnected from but connected to each other. When using dry etch, the thickness of the photoresist pattern 112 and 114 is reduced to an extent.

Figure 14A:
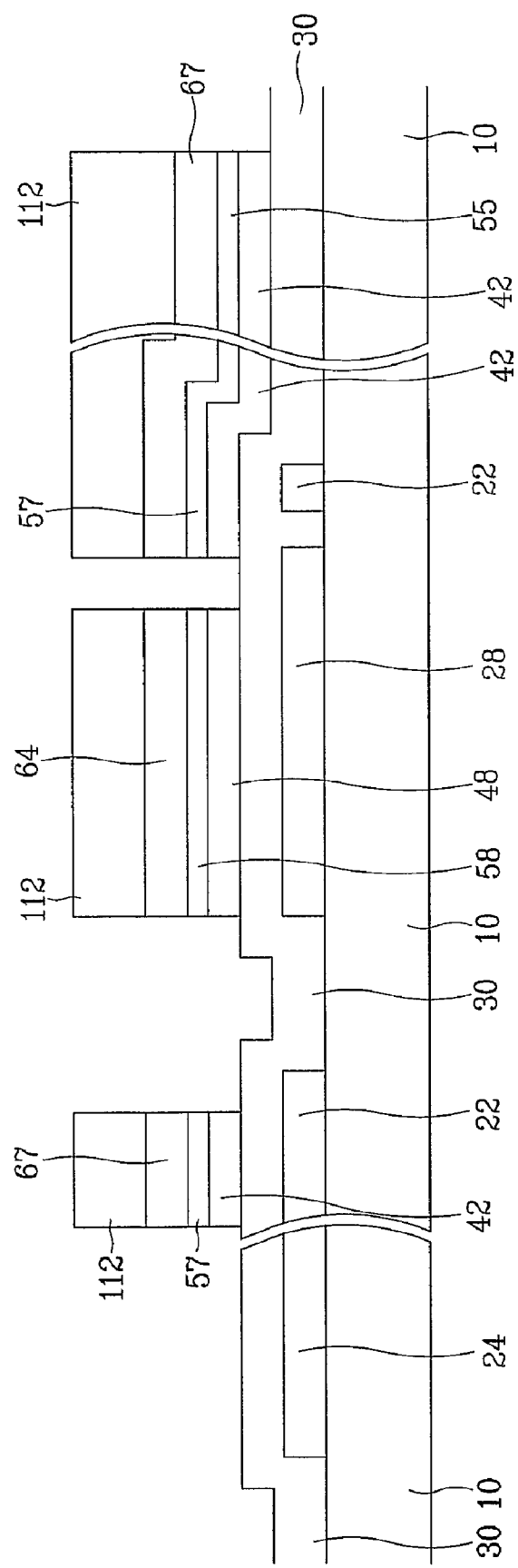

Next, as shown in FIG. 14A and FIG. 14B, the exposed portions of the intermediate layer 50 and the underlying portions of the semiconductor layer 40 on the areas B as well as the first portion 114 of the photoresist pattern 112 and 114 are removed by dry etch. The etching is performed under the conduction that the photoresist pattern 112 and 114, the intermediate layer 50 and the semiconductor layer 40 are easily etched and the gate insulating layer 30 is hardly etched. (It is noted that etching selectivity between the intermediate layer and the semiconductor layer is nearly zero.) In particular, it is preferable that the etching ratios for the photoresist pattern 112 and 114 and the semiconductor layer 40 are nearly the same. For instance, the etched thicknesses of the photoresist pattern 112 and 114 and the semiconductor layer 40 can be nearly the same by using a gas mixture of $SF_6$ and HCl, or a gas mixture of $SF_6$ and $O_2$. When the etching ratios for the photoresist pattern 112 and 114 and for the semiconductor pattern 40 are the same, the initial thickness of the first portion 114 is equal to or less than the sum of the thickness of the semiconductor layer 40 and the thickness of the intermediate layer 50.

Consequently, as shown in FIGS. 14A and 14B, the first portions 114 on the channel areas C are removed to expose the underlying portions of the S/D conductors 67, and the portions of the intermediate layer 50 and the semiconductor layer 40 on the remaining areas B are removed to expose the underlying portions of the gate insulating layer 30. In the meantime, the second portions 112 on the data areas A are also etched to become thinner. Moreover, the semiconductor pattern 42 and 48 is completed in this step. The reference numerals 57 and 58 refer to S/D ohmic contacts under the S/D conductors 67 and storage-capacitor ohmic contacts under the storage capacitor conductors 64, respectively.

Then, photoresist remnants left on the surface of the S/D conductors 67 on the channel areas C are removed by ashing.

Figure 15A:
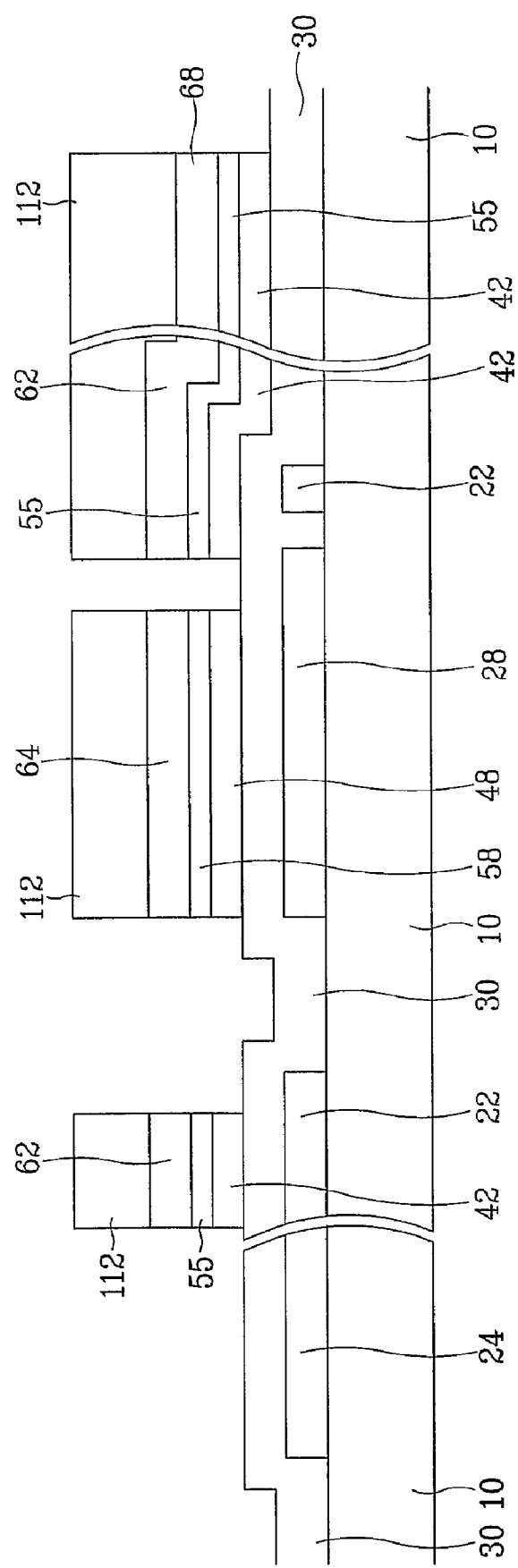
Figure 15B:
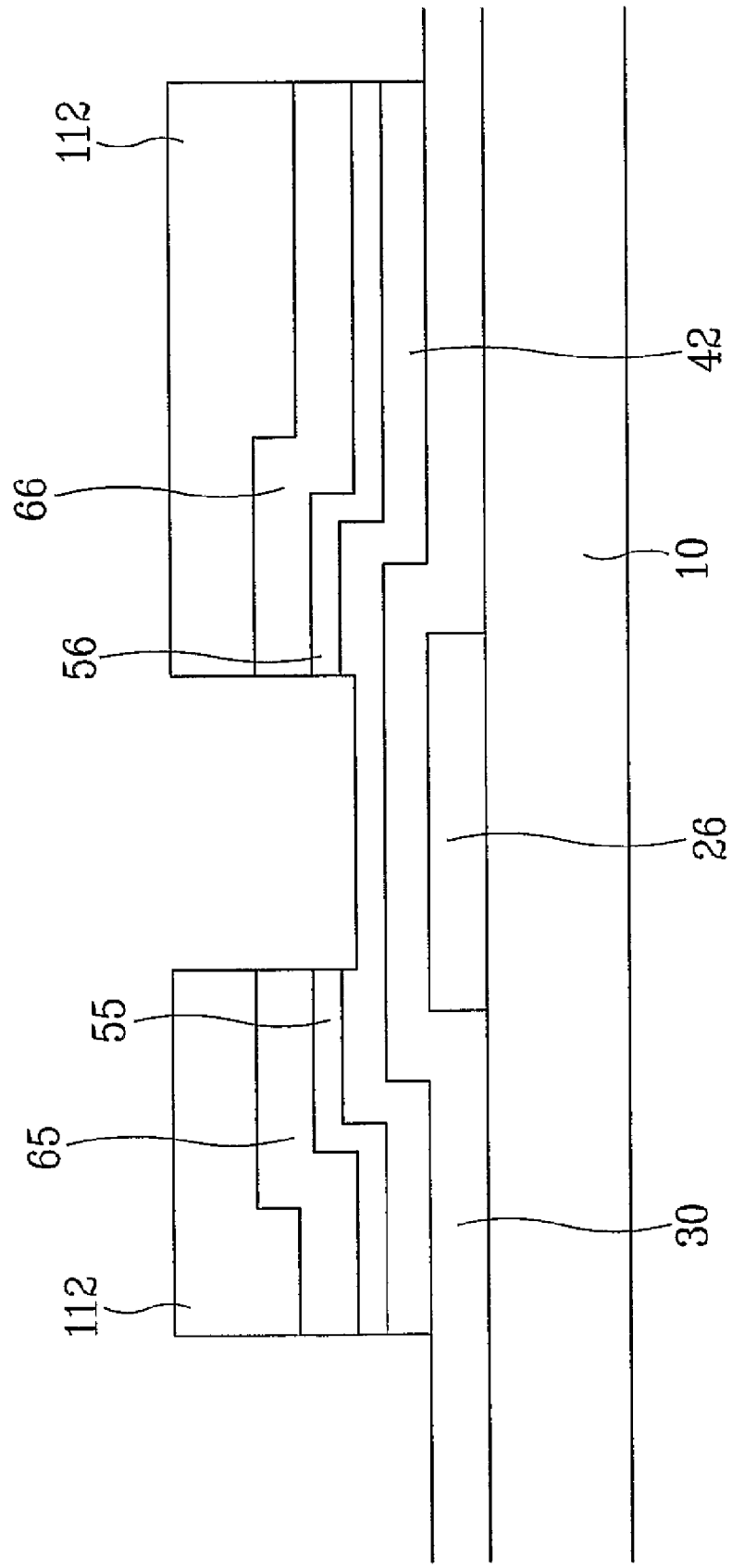

Next, as shown in FIGS. 15A and 15B, portions of the S/D conductors 67 and the underlying portions of the S/D ohmic contacts 57 on the channel areas C are etched to be removed. Here, the etching of both the S/D conductors 67 and the S/D ohmic contacts 57 may be done using only dry etching. Alternatively, the S/D conductors 67 are etched by wet etching and the S/D ohmic contacts 57 are etched by dry etching. In the former case, it is preferable to perform the etching under the condition that etching selectivity between the S/D conductors 67 and the S/D ohmic contacts 57 is high. It is because the low etching selectivity makes the determination of the etching finish point difficult, thereby causing the adjustment of the thickness of the portions of the semiconductor pattern 42 left on the channel areas C to be difficult. In the latter case alternately applying wet etching and dry etching, a stepwise lateral sidewall is formed since the wet etch etches the lateral sides of the S/D conductors 67, while the dry etch hardly etches the lateral sides of the S/D ohmic contacts 57. Examples of etching gases used for etching the S/D ohmic contacts 57 are a gas mixture of $CF_4$ and HCl and a gas mixture of $CF_4$ and $O_2$. Use of the gas mixture of CF4 and O2 enables to obtain uniform thickness of etched portions of the semiconductor pattern 42 and 48. In this regard, as shown in FIG. 15B, the exposed portions of the semiconductor pattern 42 and 48 are etched to have a reduced thickness, and the second portions 112 of the photoresist pattern 112 and 114 are also etched to have a reduced thickness. This etching is performed under the condition that the gate insulating layer 30 is not etched, and it is preferable that the photoresist pattern 112 and 114 is thick enough to prevent the second portions 112 from being removed to expose the underlying portions of the data wire 62, 64, 65, 66 and 68.

Accordingly, the source electrodes 65 and the drain electrodes 66 are separated from each other, and, simultaneously, the data wire 62, 64, 65, 66 and 68 and the ohmic contact pattern 55, 56 and 58 thereunder are completed.

Finally, the second portions 112 of the photoresist pattern 112 and 114 left on the data areas A are removed. Alternatively, the second portions 112 are removed after the portions of the S/D conductors 67 on the channel areas C are removed and before the underlying portions of the S/D ohmic contacts 57 are removed.

As described above, wet etching and dry etching may be performed one after the other, but only dry etching may be used. The latter is relatively simple but it is not easy to find a proper etching condition compared with the former. On the contrary, it is easy to find a proper etching condition for the former case but the former is relatively complicated compared with the latter.

The data wire 62, 64, 65, 66 and 68 is then subject to heat treatment at about 300° C., which diffuses the Zn content and form a ZnOx layer on the surfaces the data wire 62, 64, 65, 66 and 68. The heat treatment may be made immediately after patterning the data wire 62, 64, 65, 66 and 68, that is, before proceeding from the step illustrated in FIGS. 13A and 13B to the step illustrated in FIGS. 14A and 14B.

Figure 16A:
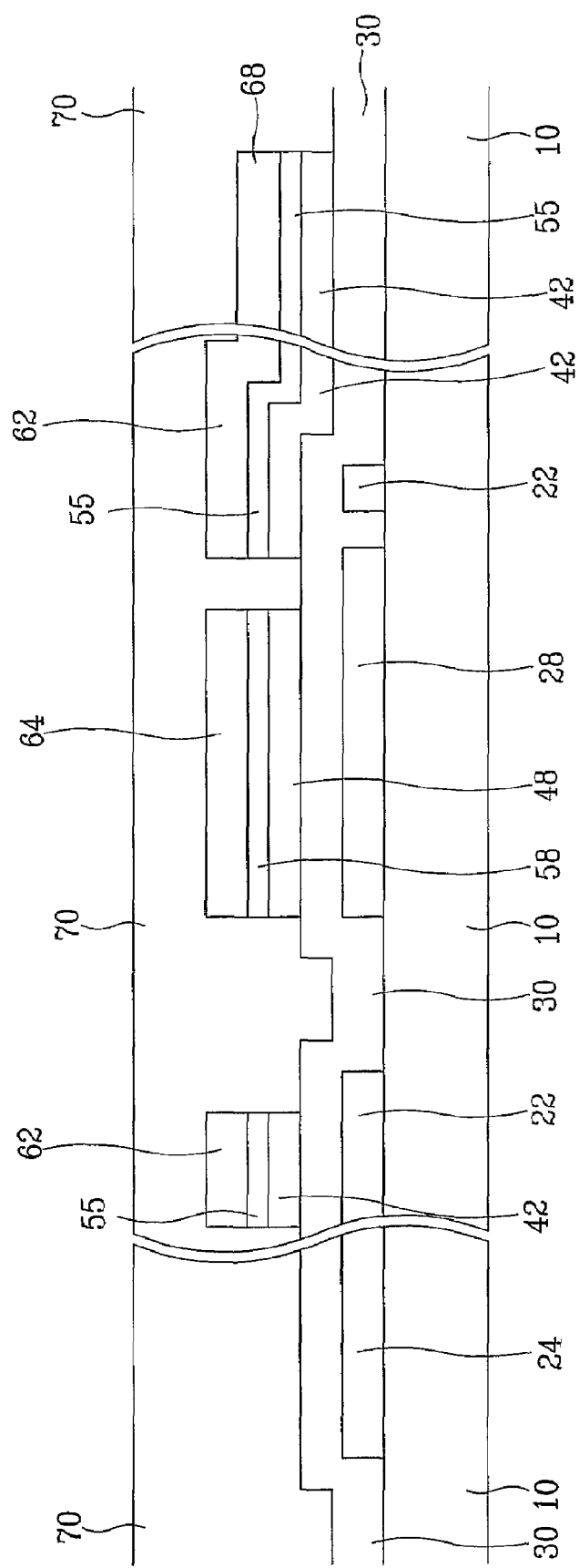
FIGS. 16A and 16B are sectional views of the TFT array panel in the step following the step illustrated in FIGS. 15A and 15B.
Figure 16B:
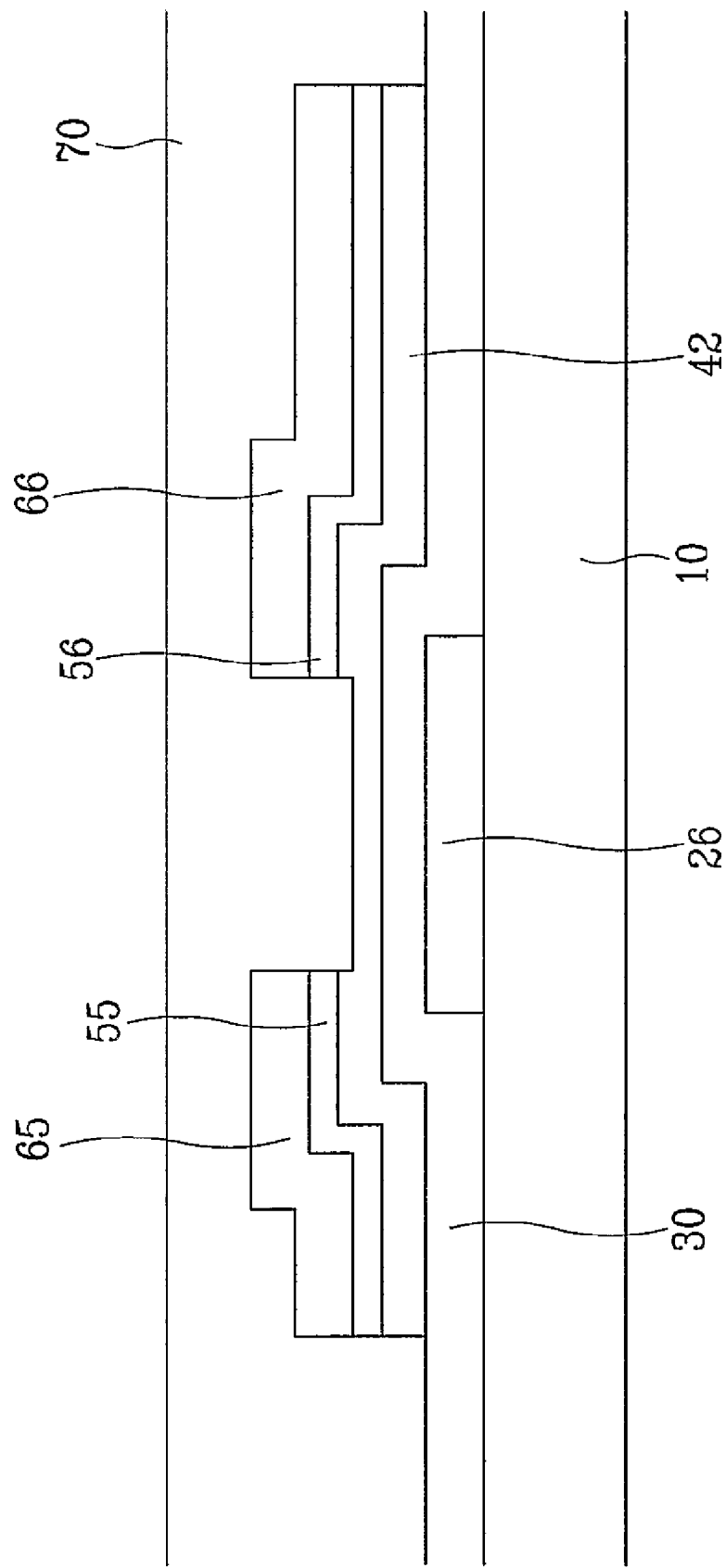

Thereafter, as shown in FIGS. 16A and 16B, a protective layer 70 is formed by CVD of silicon nitride, a-Si:C:O or a-Si:O:F, or by coating an organic insulating material.

Figure 17A:
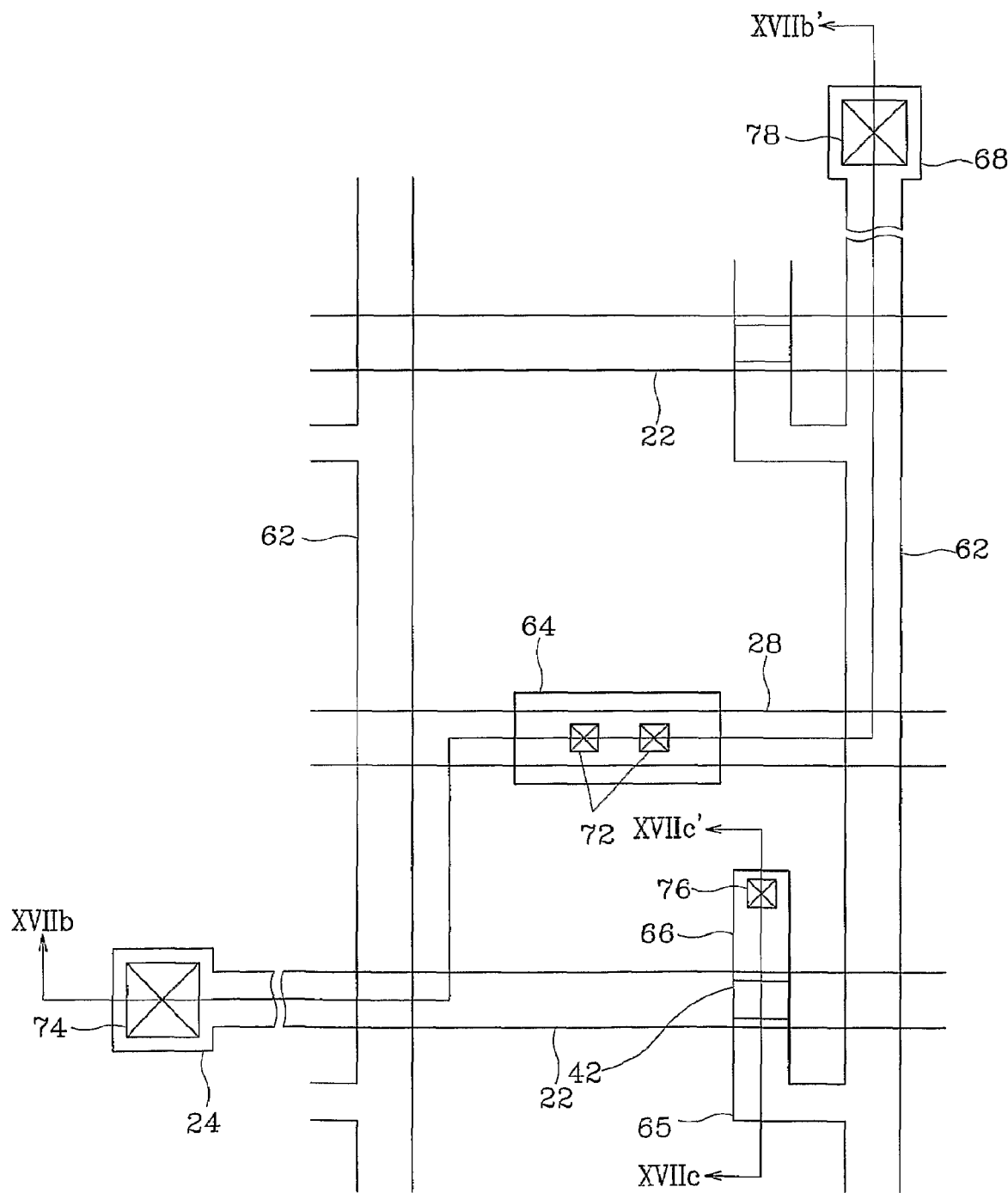
FIG. 17A is a layout view of the TFT array panel in the step following the step illustrated in FIGS. 16A and 16B.
Figure 17B:
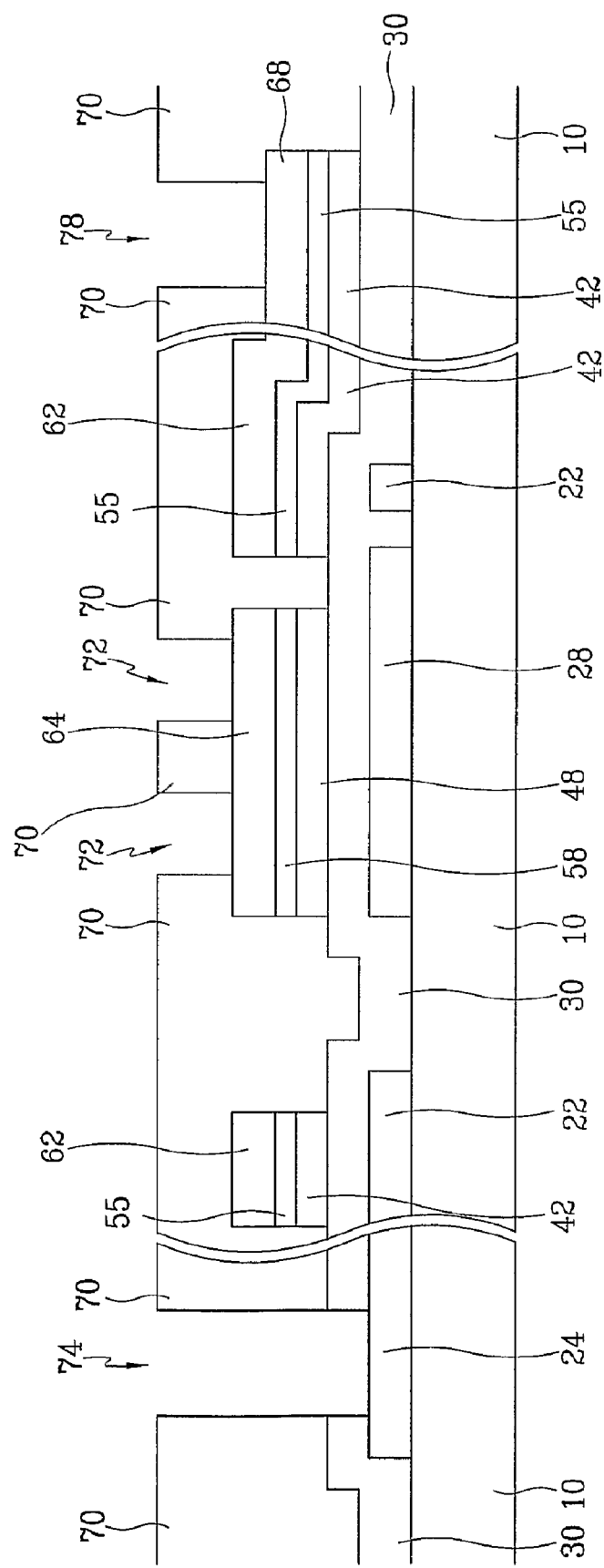

As shown in FIGS. 17A to 17C, the protective layer 70 together with the gate insulating layer 30 is photo-etched to form a plurality of contact holes 76, 74, 78 and 72 exposing the drain electrodes 66, the gate pads 24, the data pads 68 and the storage capacitor conductors 64. It is preferable that the area of the contact holes 74 and 78 is equal to or larger than 0.5 mm×15 μm and not larger than 2 mm×60 μm.

Finally, as shown in FIGS. 8 to 10, an ITO layer or an IZO layer with a thickness of 400-500Å is deposited and photo-etched to form a plurality of pixel electrodes 82 connected to the drain electrodes 66 and the storage capacitor conductors 64, a plurality of subsidiary gate pads 86 connected to the gate pads 24, and a plurality of subsidiary data pads 88 connected to the data pads 68.

Meanwhile, nitrogen gas is preferably used for the preheating process before the deposition of the ITO layer or the IZO layer. This is to prevent a metal oxide layer on portions of the metallic layers 24, 64, 66 and 68 exposed through the contact holes 72, 74, 76 and 78.

Since the data wire 62, 64, 65, 66 and 68, the ohmic contact pattern 55, 56 and 58 thereunder and the semiconductor pattern 42 and 48 thereunder are formed using a single mask, and the source electrode 65 and the drain electrode 66 are separated from each other in this process, the second embodiment of the present invention gives a simple manufacturing method as well as the advantage which the first embodiment gives.

In the first embodiment, both the gate wire and the data wire are made of Ag(Zn). Alternatively, only one of the gate wire and the data wire may be made of Ag(Zn) alloy.

Now, a detailed formation mechanism and the properties of a Ag(Zn) wire according to embodiments of the present invention are described more in detail.

Figure 18:
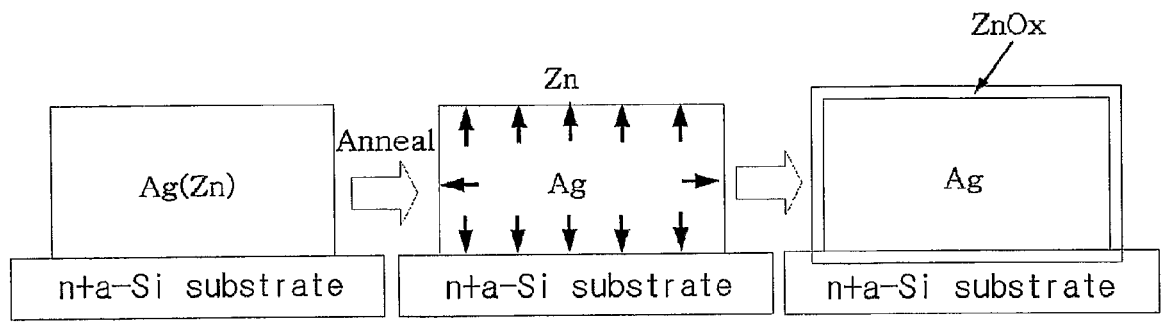
FIG. 18 schematically illustrates the formation mechanism of a wire of a TFT array panel according to an embodiment of the present invention.

FIG. 18 schematically illustrates the formation mechanism of a wire of a TFT array panel according to an embodiment of the present invention, which is formed by depositing Ag(Zn) on an n+ amorphous silicon layer.

Ag and Zn are co-deposited on an n+ amorphous silicon layer using DC magnetron sputtering, and photo-etched to form a wire.

The wire is then subject to heat treatment, which diffuses the Zn content to the surfaces of the wire.

The diffused Zn content on the surfaces is oxidized to form a ZnOx layer on the surfaces of the wire. The surface of the wire contacting the n+ amorphous silicon layer contains less amount of oxygen than the surface of the wire exposed to atmosphere so that the ZnOx layer on the surface contacting the n+ amorphous silicon layer bears a thickness smaller than that at the surface area. The ZnOx layer enhances the adhesiveness of the wire to the n+ amorphous silicon layer, prevents the oxidation of the wire, and physically and chemically protects the wire.

Figure 19A:
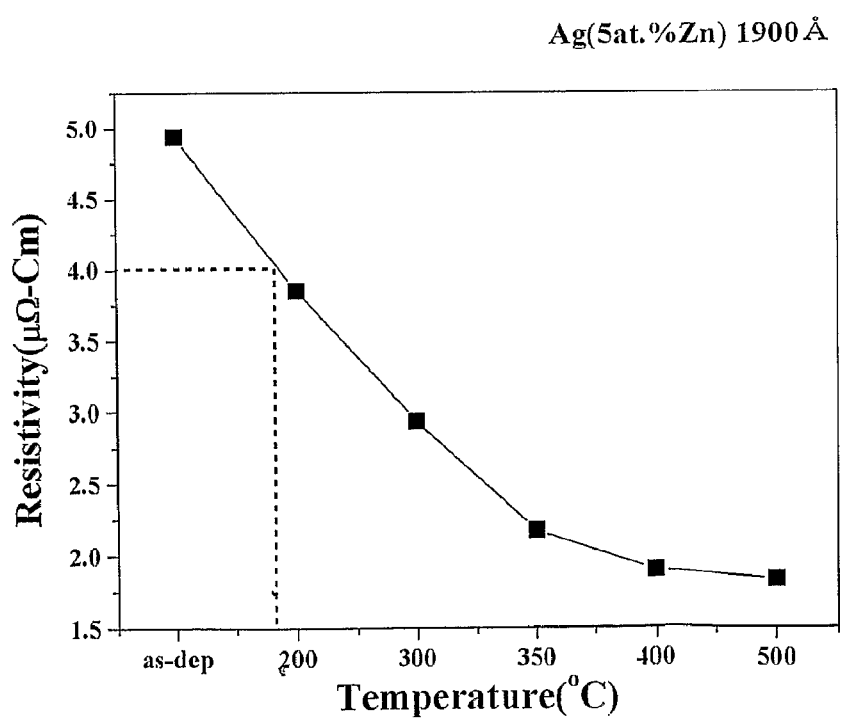
FIG. 19A is a graph illustrating variation in the resistivity of a Ag(Zn) thin film as a function of the heat treatment temperature for the Ag(Zn) thin film.

FIG. 19A is a graph illustrating variation in the resistivity of a Ag(Zn) thin film subject to heat treatment.

The Ag(Zn) layer was formed by DC magnetron sputtering, had the thickness of 1,900 Å, and contained five at % of Zn additive in addition to Ag.

As shown in FIG. 19A, the resistivity immediately after the deposition (as deposited) is 4.9 μΩ/cm. The resistivity becomes gradually reduced during the heat treatment. Consequently, the resistivity becomes lowered up to about 2 μΩ/cm at 500° C. The heat treatment is performed for 30 minutes under the vacuum state of $2.0\times10^{-5}$ Torr.

Figure 19B:
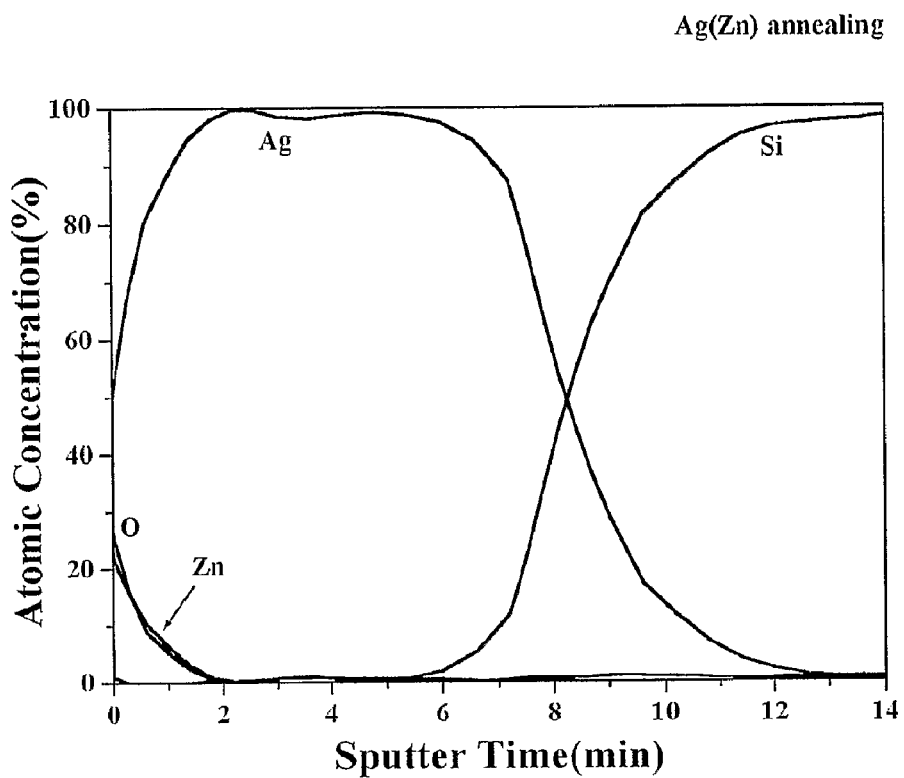
FIG. 19B is a depth profile of a Ag(Zn) thin film measured by Auger Electron Spectrometry ("AES") after heat treatment at 350° C. under the vacuum atmosphere.

FIG. 19B is a depth profile of a Ag(Zn) thin film measured by Auger Electron Spectrometry ("AES") after heat treatment at 350° C. under the vacuum atmosphere. The Ag(Zn) alloy thin film sample heat-treated at 350° C. under the vacuum atmosphere was bored by sputtering to measure its composition ratio.

As shown in FIG. 19B, ZnO is concentrated at the surface of the thin film, and the Zn content is rarely found below a place where it is bored for about two minutes by the sputtering. This is because the Zn content in the thin film is diffused to the surfaces of the thin film and then to react with the oxygen content in a furnace to form ZnO. However, the formation of ZnO is less at the interface where only small amount of the oxygen content is existent.

Figure 19C:
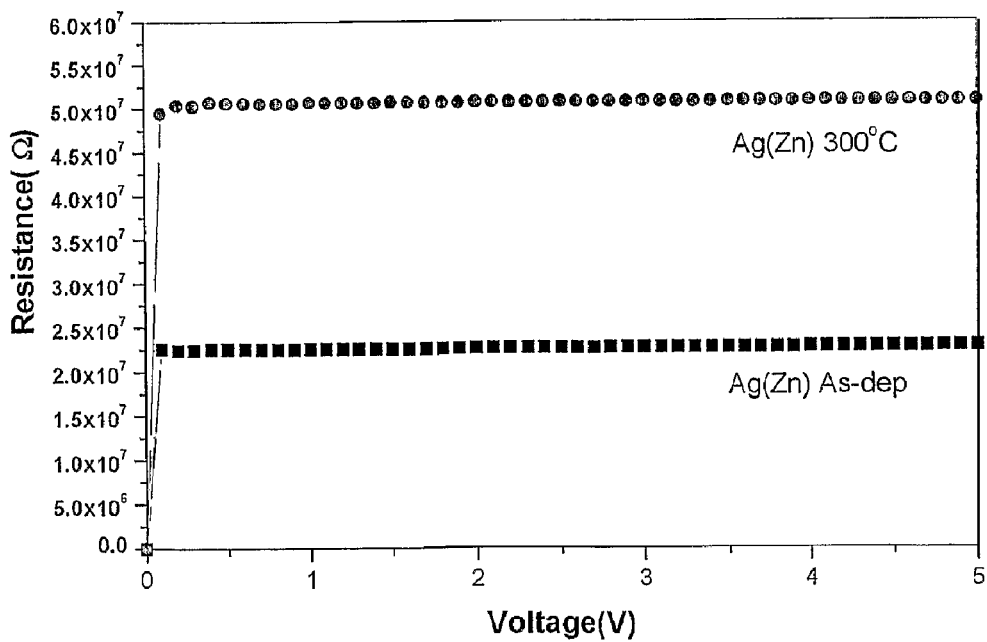
FIG. 19C is a graph illustrating variation in the contact resistance between a Ag(Zn) thin film and an underlying n+ amorphous silicon layer before and after heat treatment of the Ag(Zn) thin film.

FIG. 19C is a graph illustrating variation in the contact resistance between a Ag(Zn) alloy thin film and an underlying n+ amorphous silicon layer before and after heat treatment of the Ag(Zn) layer.

The contact resistance was measured to be about $2.3\times10^7$ Ω immediately after the deposition, i.e., before the heat treatment. The contact resistance of the thin film after suffered the heat treatment at 300° C. was measured to be $5\times10^7$ Ω. Since the ZnO layer formed on the interface of the Ag(Zn) alloy thin film bears conductivity, the contact resistance is not significantly increased.

FIG. 20A is a photograph illustrating a result of a scratch test for a Ag(Zn) alloy thin film before and after heat treatment of the Ag(Zn) alloy thin film.

FIG. 20A illustrates a result of a scratch test for testing the adhesiveness of Ag(Zn). The scratch test is an analysis technique for measuring adhesiveness of a thin film at the time the thin film is stripped from a substrate, which aligns a diamond tip with a predetermined radius perpendicular to the surface of the thin film, and moves the tip to a predetermined length with increasing the force of the tip applied to the thin film. As shown in FIG. 20A, the heat treatment enhances the adhesiveness of the thin film. It is considered that the improvement of the adhesiveness is due to the interfacial reaction of Zn atoms diffused to the surface by the heat treatment.

FIG. 20B is SEM photographs of a pure Ag layer and a Ag(Zn) alloy layer after heat treatment at 300° C. and exposure to $CF_4+O_2$ plasma.

FIG. 20B illustrates the experimental result of the resistance of Ag(Zn) against chemicals of dry etching agent. A metal layer for a data wire suffers plasma etching using $CF_4+O_2$ or $SF_6+O_2$ for formation of contact holes in a protective layer after deposition of the protective layer. In order to verify the effects of embodiments of the present invention under this condition, pure Ag and Ag(Zn) heat-treated at 300° C. were subject to plasma treatment under the condition that the composition ratio of $CF_4:O_2$ was 20:5, the pressure was 130 mTorr, the electric power was 150 W, and the process time was 5 minutes.

As shown in FIG. 20B, pure Ag reacted with the plasma gas to experience the change in the surface roughness and volume expansion, but Ag(Zn) alloy covered with ZnO did not experience the change in its surface state.

As described above, the easily-oxidizable Zn content added to Ag(Zn) alloy is diffused to the surfaces due to heat treatment to form a ZnO layer, thereby preventing oxidation, increasing adhesiveness, and improving resistance against dry etching agents. Furthermore, the heat treatment diffuses out Zn atoms contained in the bulk region of the thin film to make the bulk region of the thin film have lower resistivity close to pure Ag. Since ZnO is a conductive oxide, it can solve the problem of the high contact resistance with the n+ amorphous silicon layer and the transparent conductive layer such as ITO in the conventional alloy process.

Meanwhile, even though Zn is used as an additive to Ag as described above, In, Sn and Cr may be added to Ag instead of Zn. The above-described additives are easily oxidized, and their oxides have conductivity.

Now, TFT array panels having such a wire according to other embodiments are described.

First, a structure of a TFT array panel for an LCD according to a third embodiment of the present invention is described in detail with reference to FIGS. 21 and 22.

Figure 21:
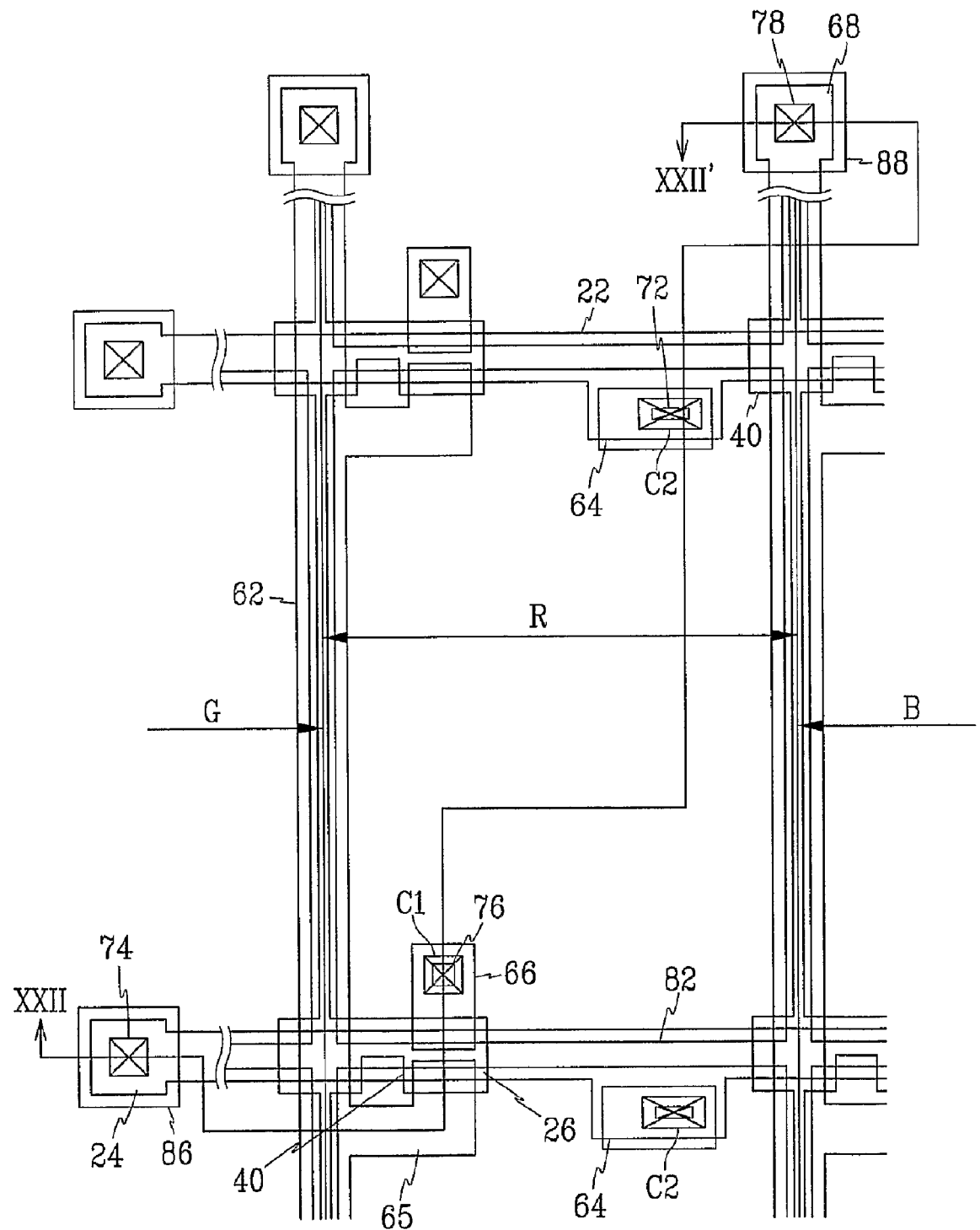
FIG. 21 is a layout view of a TFT array panel for an LCD according to a third embodiment of the present invention.
Figure 22:
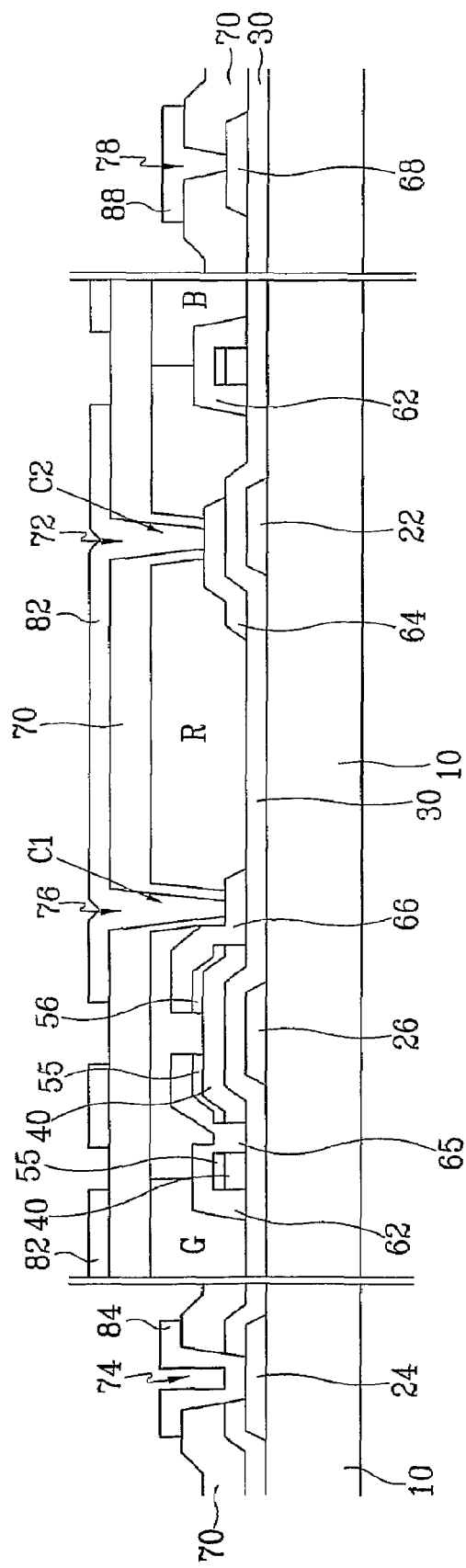
FIG. 22 is a sectional view of the TFT array panel taken along the line XXII-XXII' of FIG. 21.

FIG. 21 is a layout view of a TFT array panel for an LCD according to a third embodiment of the present invention, and FIG. 22 is a sectional view of the TFT array panel shown in FIG. 21 taken along the line XXII-XXII'.

A gate wire 22, 24 and 26 is formed on an insulating substrate 10. The gate wire 22, 24 and 26 is made of a Ag(Zn) alloy including Ag and additional Zn. A ZnOx layer, which is an oxide of the additive Zn, is formed on the surfaces of the gate wire 22, 24 and 26. The gate wire 22, 24 and 26 includes a plurality of scanning signal lines or gate lines 22 extending in the transverse direction, a plurality of gate pads 24 connected to one ends of the gate lines 22 to transmit gate signals from an external device to the gate lines 22, and a plurality of gate electrodes 26 of TFTs, which are parts of the gate lines 22 to form a plurality of TFTs. The expansions of the gate lines 22 overlap storage capacitor conductors 64 connected to pixel electrodes 82 to form storage capacitors for enhancing the charge storing capacity of the pixels, which is described later.

A gate insulating layer 10 preferably made of SiNx is formed on the substrate 10 and the gate wire 22, 24 and 26. The gate electrodes 24 are covered by the gate insulating layer 30.

A semiconductor pattern 40 preferably made of hydrogenated amorphous silicon are formed on the gate insulating layer 30. An ohmic contact pattern 55 and 56 preferably made of amorphous silicon heavily doped with n type impurities such as phosphorous P are formed on the semiconductor pattern 40.

A plurality of source electrodes 65 and a plurality of data electrodes 66 of TFTs are formed on the ohmic contact layer 55 and 56. A data wire further includes a plurality of data lines 62 extending in the longitudinal direction and connected to the source electrodes 65, a plurality of data pads 68 connected to one ends of the data lines 62 to receive image signals from an external device, and a plurality of storage capacitor conductors 64 overlapping the expansions of the gate lines 22. The data wire 62, 64, 65, 66 and 68 is made of Ag(Zn) alloy including Ag and additional Zn. A ZnOx layer, which is an oxide of the additive Zn, is formed on the surfaces of the data wire 62, 64, 65, 66 and 68.

The ohmic contact layer 55 and 56 reduces the contact resistance between the underlying semiconductor pattern 40 and the overlying data wire 62, 64, 65, 66 and 68.

An interlayer insulating layer (not shown) preferably made of silicon oxide or silicon nitride may be formed on portions of the semiconductor pattern 40, which are not covered by the data wire 62, 64, 65, 66 and 68.

A plurality of red, green and blue color filters of R, G and B extending in a longitudinal direction are formed in respective pixel areas on the gate insulating layer 30. The color filters R, G and B has a plurality of apertures C1 and C2 exposing the drain electrodes 65 and the storage capacitor conductors 64. In this embodiment, the boundaries of the color filters R, G and B are shown to coincide with each other on the data wire 62. However, the color filters R, G and B may overlap each other on the data wire 62 to block the light leakage between the pixel areas. The color filters R, G and B are not formed near pad areas with the gate pads 24 and the data pads 68.

A passivation layer 70 is formed on the color filters R, G and B. The passivation layer 70 is preferably made of an acryl-based organic insulating material having an excellent planarization characteristic and a low dielectric constant or a low dielectric insulating material such as Si:O:C or Si:O:F formed by CVD and having a low dielectric constant equal to or lower than 4.0. The passivation layer 70 along with the gate insulating layer 30 has a plurality of contact holes 74, 78, 76 and 72 exposing the gate pads 24, the data pads 68, the drain electrodes 66 and the storage capacitor conductors 64, respectively. The contact holes 76 and 72 exposing the drain electrodes 66 and the storage capacitor conductors 64 are located within the apertures C1 and C2 of the color filters R, G and B. When the interlayer insulating layer is added under the color filters R, G and B, as described above, the contact holes 76 and 72 have the same shapes as those of the interlayer insulating layer.

On the passivation layer 70, there are formed a plurality of pixel electrodes 82 applied with image signals from TFTs to generate an electric field in cooperation with an electrode of an upper panel. The pixel electrodes 82 are preferably made of transparent conductive material such as ITO or IZO and physically and electrically connected to the drain electrodes 66 via the contact holes 76 to receive the image signals. The pixel electrodes 82 overlap the gate lines 22 and the data lines 62 to increase the aperture ratio, but they may not do. In addition, the pixel electrodes 82 are also connected to the storage capacitor conductors 64 via the contact holes 72 to transmit the image signals thereto.

Meanwhile, a plurality of auxiliary gate pads 84 and a plurality of auxiliary data pads 88 are formed on the gate pads 24 and the data pads 68, respectively, and connected thereto via the contact holes 74 and 78. The auxiliary pads 84 and 88 supplement adhesiveness of the pads 24 and 68 with external circuit devices and protect the pads 24 and 68. The auxiliary gate pads 86 and the auxiliary data pads 88 are not requisites but may be introduced in a selective manner.

A method of manufacturing a TFT array panel for an LCD according to the third embodiment will be now described in detail with reference to FIGS. 23A to 27B as well as FIGS. 21 and 22.

Figure 23A:
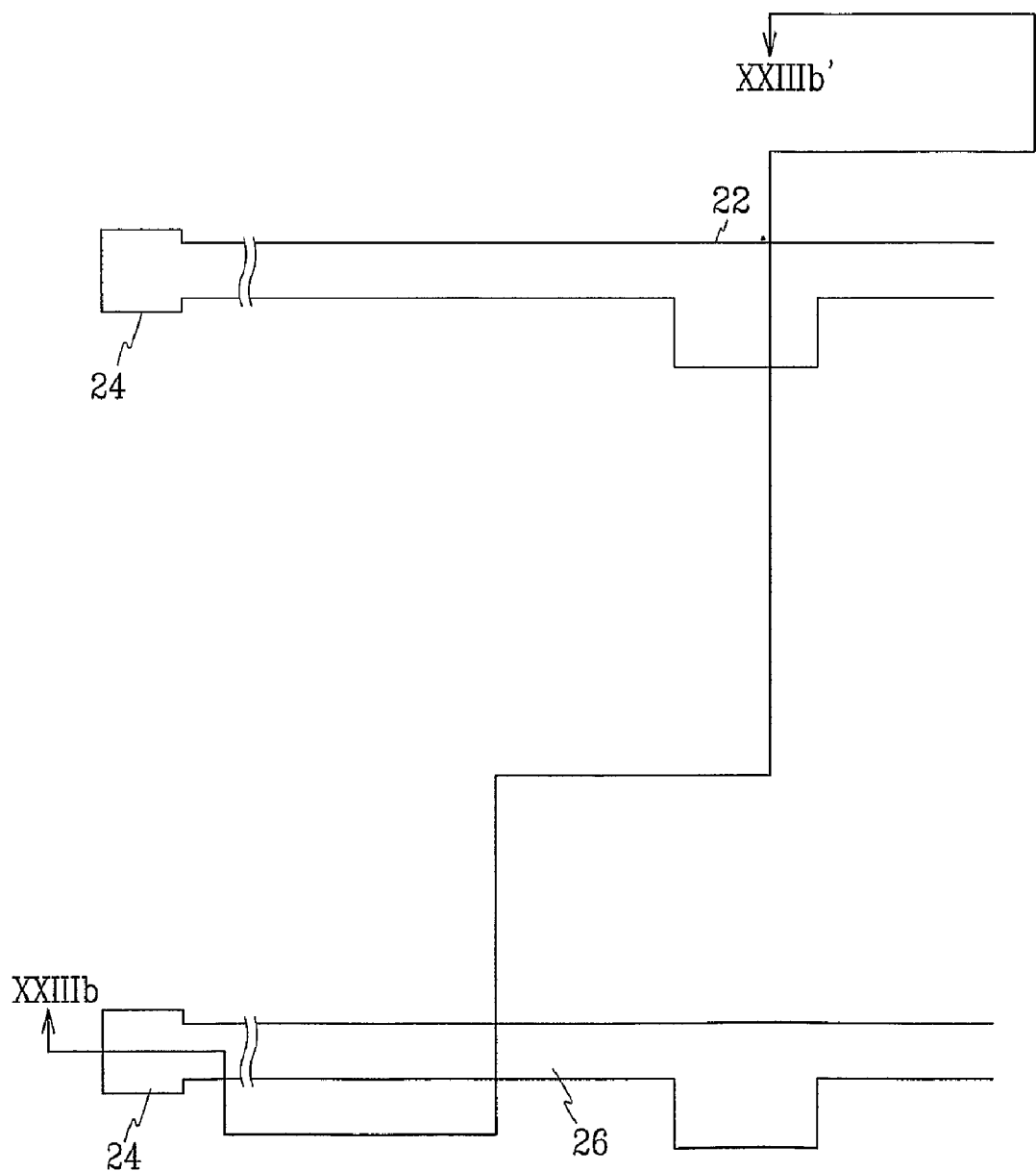
FIG. 23A is a layout view of a TFT array panel in the first step of a manufacturing method thereof according to the third embodiment of the present invention.
Figure 23B:
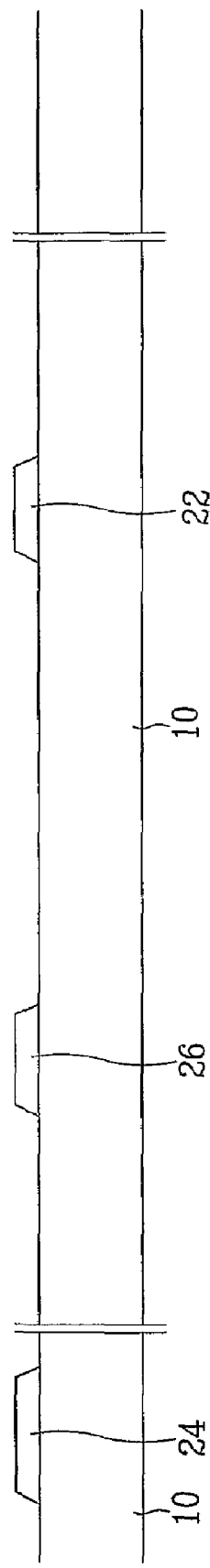
FIG. 23B is a sectional view of the TFT array panel shown in FIG. 23A taken along the line XXIIIb-XXIIIb'.
Figure 24A:
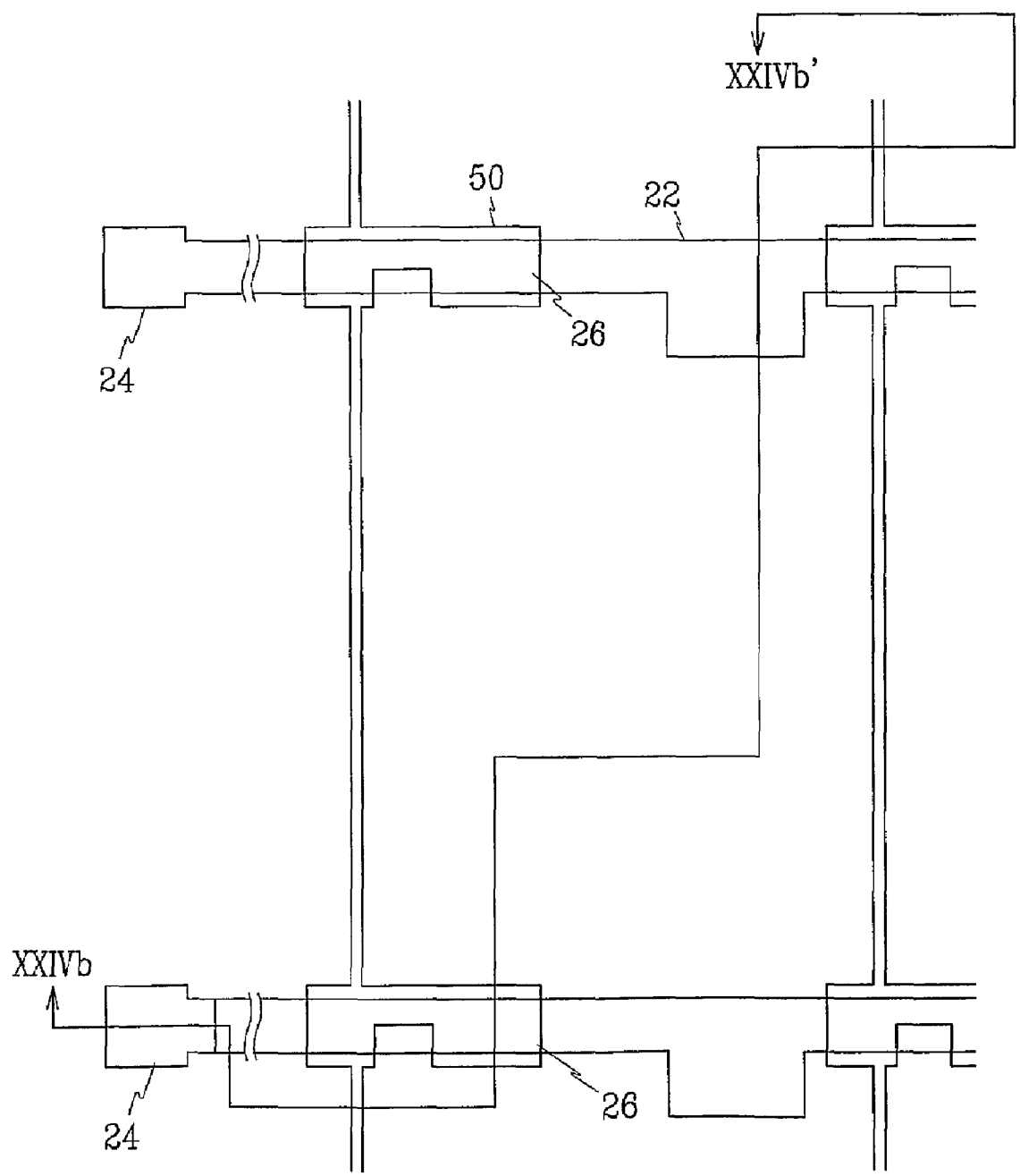
FIG. 24A is a layout view of a TFT array panel in the second step of a manufacturing method thereof according to the third embodiment of the present invention.

First, as shown in FIGS. 23A and 23B, a Ag(Zn) thin film is deposited on a substrate 10 and dry or wet etched by a first photo-etch using a mask to form a gate wire 22, 24 and 26. The gate wire 22, 24 and 26 includes a plurality of gate lines 22, a plurality of gate electrodes 26, and a plurality of gate pads 24. The Ag(Zn) thin film is formed by co-deposition of Ag and Zn preferably using DC magnetron sputtering. Thereafter, the Ag(Zn) thin film is subject to heat treatment at about 300° C., which diffuses the Zn content and form a ZnOx layer on the surfaces of the gate wire 22, 24 and 26.

As shown in 24A and 24B, a gate insulating layer 30 with thickness of 1,500-5,000Å, a semiconductor layer preferably of a hydrogenated amorphous silicon with thickness of 500-2,000 Å and a doped amorphous silicon layer heavily doped with N-type impurity such as phosphorous with thickness of 300-600 Å are deposited in sequence by CVD. The doped amorphous silicon layer and the semiconductor layer are patterned in sequence by photo etching using a mask to form an ohmic contact layer 50 and a semiconductor pattern 40.

Figure 25A:
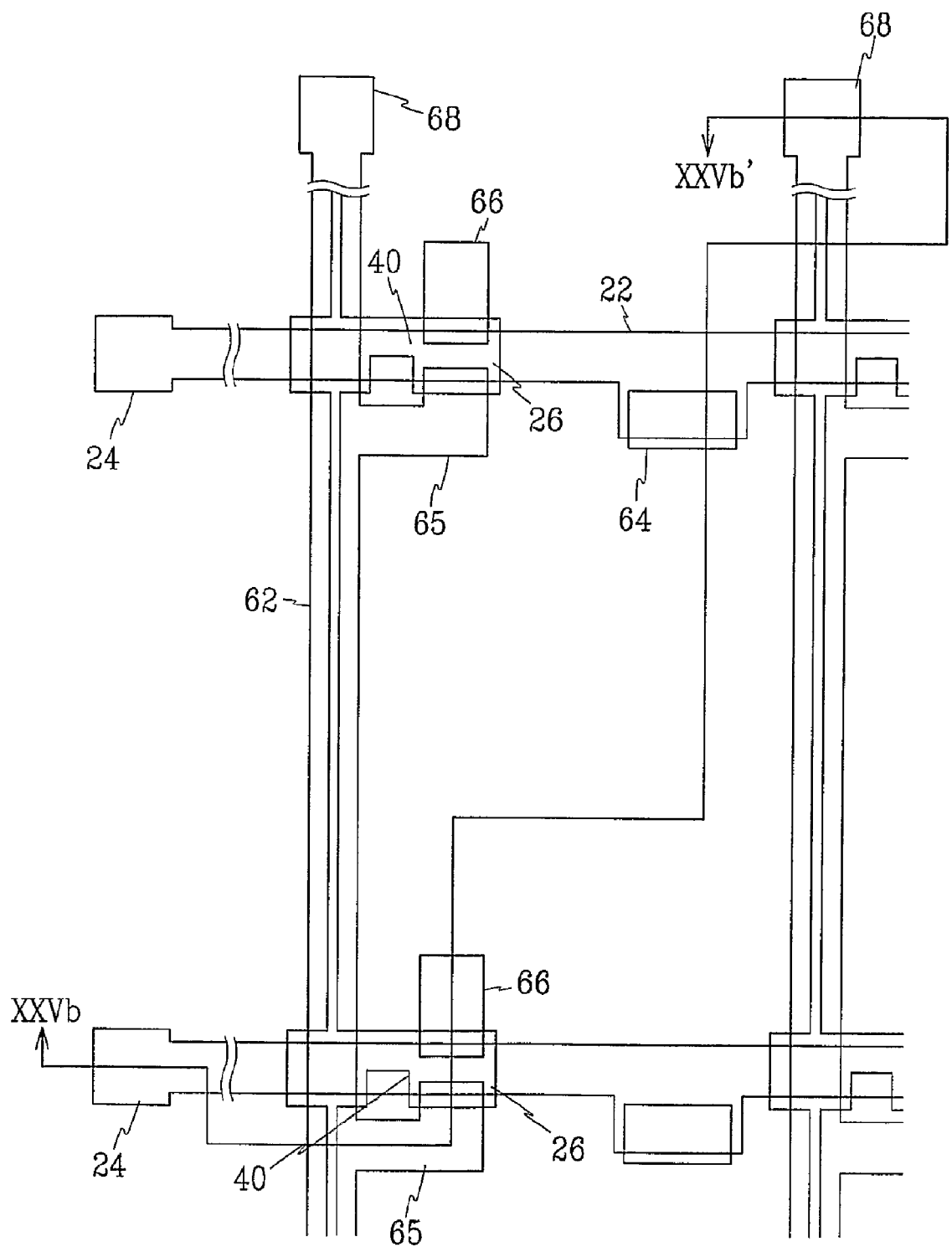
FIG. 25A is a layout view of a TFT array panel in the third step of a manufacturing method thereof according to the third embodiment of the present invention.
Figure 25B:
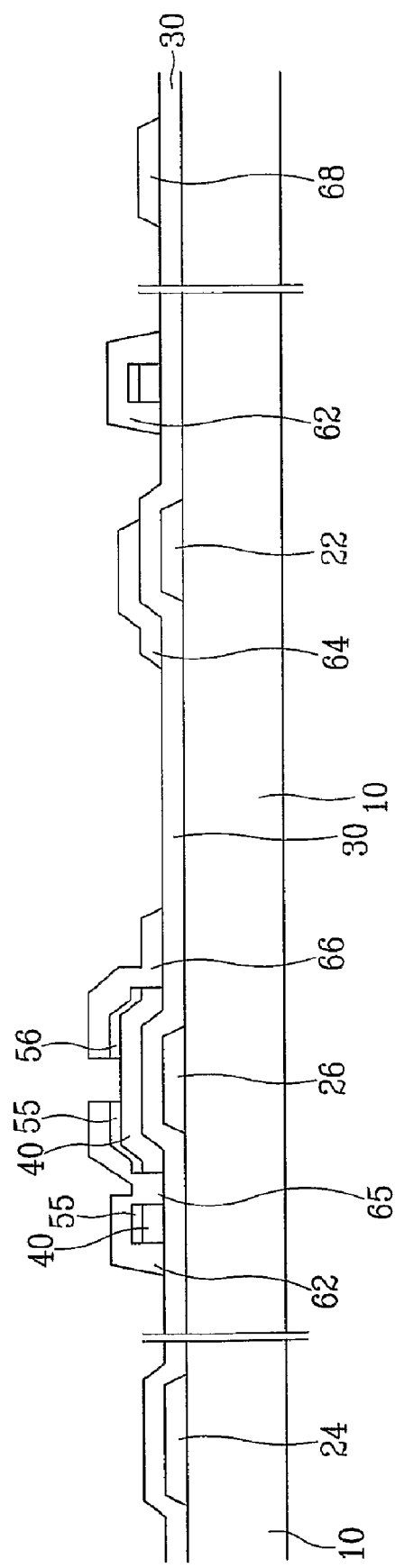
FIG. 25B is a sectional view of the TFT array panel shown in FIG. 25A taken along the line XXVb-XXVb'.

As shown in FIGS. 25A and 25B, a Ag(Zn) alloy layer is deposited on the substrate 10, and patterned by photo etch using a mask to form a data wire including a plurality of data lines 62, a plurality of source electrodes 65, a plurality of drain electrodes 66, a plurality of data pads 68 and a plurality of storage capacitor conductors 64. The Ag(Zn) thin film is formed by co-deposition of Ag and Zn preferably using DC magnetron sputtering. Thereafter, the Ag(Zn) thin film is subject to heat treatment at about 300° C., which diffuses the Zn content and form a ZnOx layer on the surfaces of the data wire 62, 64, 65, 66 and 68.

Then, the portions of the ohmic contact layer 50, which are not covered by the source electrodes 65 and the drain electrodes 66, are removed to expose portions of the semiconductor layer 40 located between the source electrodes 65 and the drain electrodes 66, and the ohmic contact layer 50 is divided into two parts. Thereafter, a SiNx layer or a SiOx layer may be deposited to form an interlayer insulating layer (not shown).

Figure 26A:
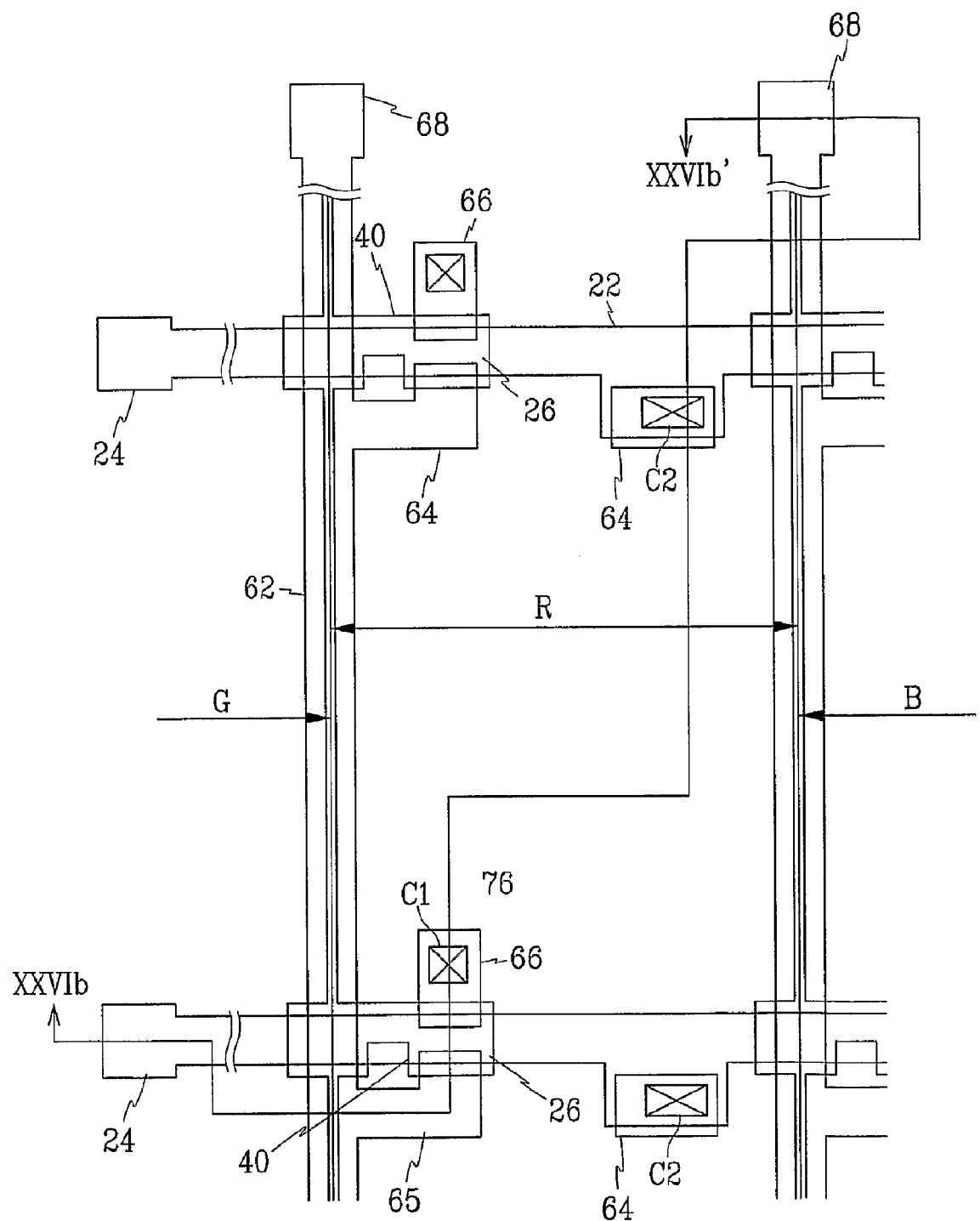
FIG. 26A is a layout view of a TFT array panel in the fourth step of a manufacturing method thereof according to the third embodiment of the present invention.
Figure 26B:
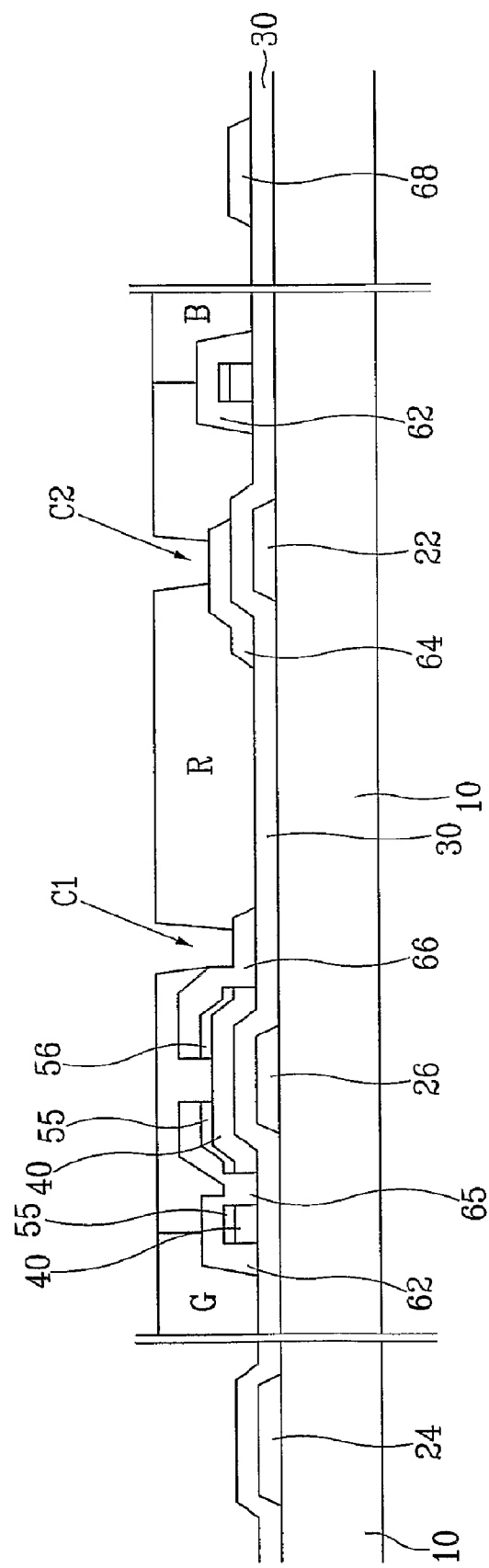
FIG. 26B is a sectional view of the TFT array panel shown in FIG. 26A taken along the line XXVIb-XXVIb'.

After the formation of the data wire and the interlayer insulating layer (not shown), as shown in FIGS. 26A and 26B, photosensitive organic materials containing red, green and blue pigments are sequentially coated and patterned by photolithography to form a plurality of red, green and blue color filters R, G and B in a sequential manner. A plurality of apertures C1 and C2 exposing the drain electrodes 66 and the storage capacitor conductors 64 are also formed when forming the red, green and blue color filters R, G and B by photolithography. The apertures C1 and C2 are provided for obtaining good profiles of contact holes exposing the drain electrode 66 and the storage capacitor conductors 64 on a passivation layer 70 to be formed later.

Figure 27A:
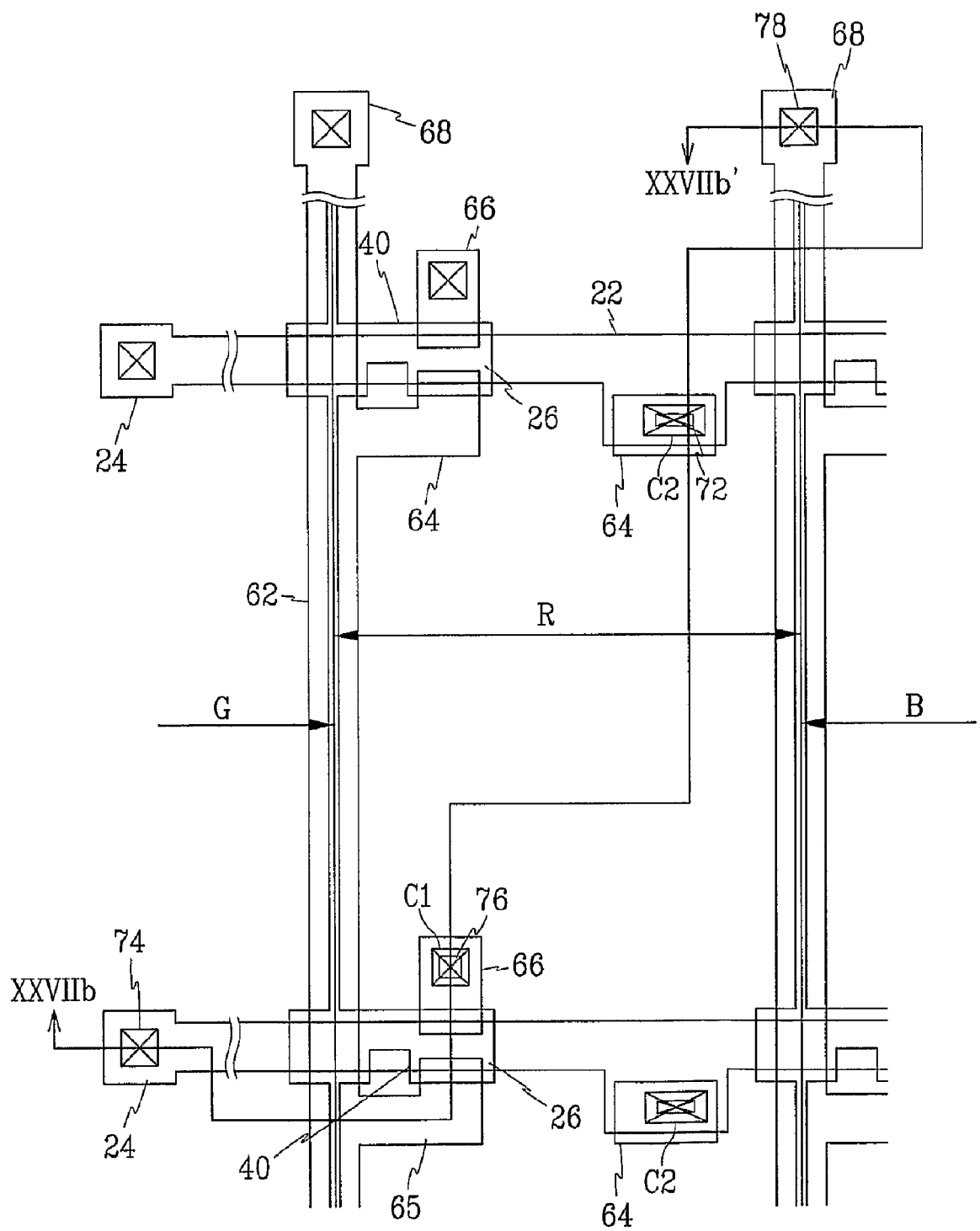
FIG. 27A is a layout view of a TFT array panel in the fifth step of a manufacturing method thereof according to the third embodiment of the present invention.
Figure 27B:
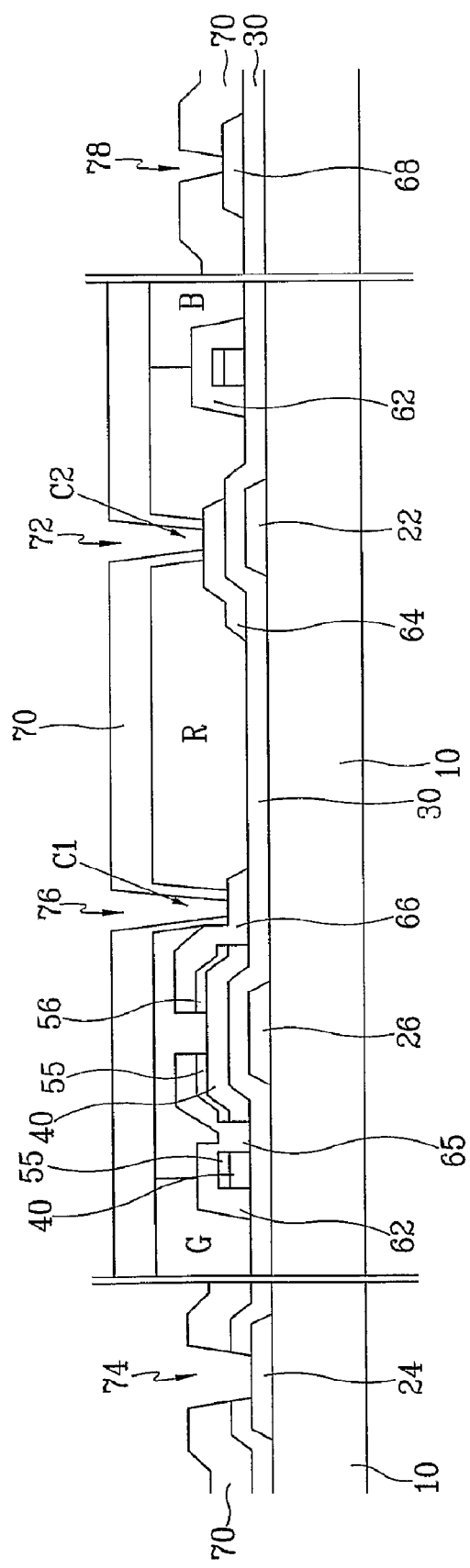
FIG. 27B is a sectional view of the TFT array panel shown in FIG. 27A taken along the line XXVIIb-XXVIIb'.

As shown in FIGS. 27A and 27B, organic insulating material having a low dielectric constant and an excellent pla-narization characteristic is coated on the substrate 10 or a low dielectric insulating material having a dielectric constant equal to or less than 4.0 such as Si:O:F or Si:O:C is deposited by CVD, to form a passivation layer 70. The passivation layer 70 together with gate insulating layer 30 is patterned by photo etch using a mask to form a plurality of contact holes 72, 74, 76 and 78. The contact holes 76 and 74 exposing the drain electrodes 66 and the storage capacitor conductors 74 are formed within the apertures C1 and C2 provided at the color filters R, G and B. As described above, by providing the apertures C1 and C2 on the color filters R, G and B in advance and then patterning the passivation layer 70 to form the contact holes 76 and 74 exposing the drain electrodes 66 and the storage capacitor conductors 64, it is possible to obtain good profiles of the contact holes 76 and 74.

Finally, as shown in FIGS. 21 to 23, an ITO layer or an IZO layer having 400-500Å thickness is deposited and photo etched using a mask to form a plurality of pixel electrodes 82, a plurality of auxiliary gate pads 84 and a plurality of auxiliary data pads 88.

Although this method uses five masks as described above, the present invention is also applicable to a manufacturing method of a TFT array panel for an LCD using four masks. This will be described in detail with reference to the drawings.

First, referring to FIGS. 28 to 30, a structure of a TFT array panel for an LCD according to an embodiment of the present invention will be described in detail.

Figure 28:
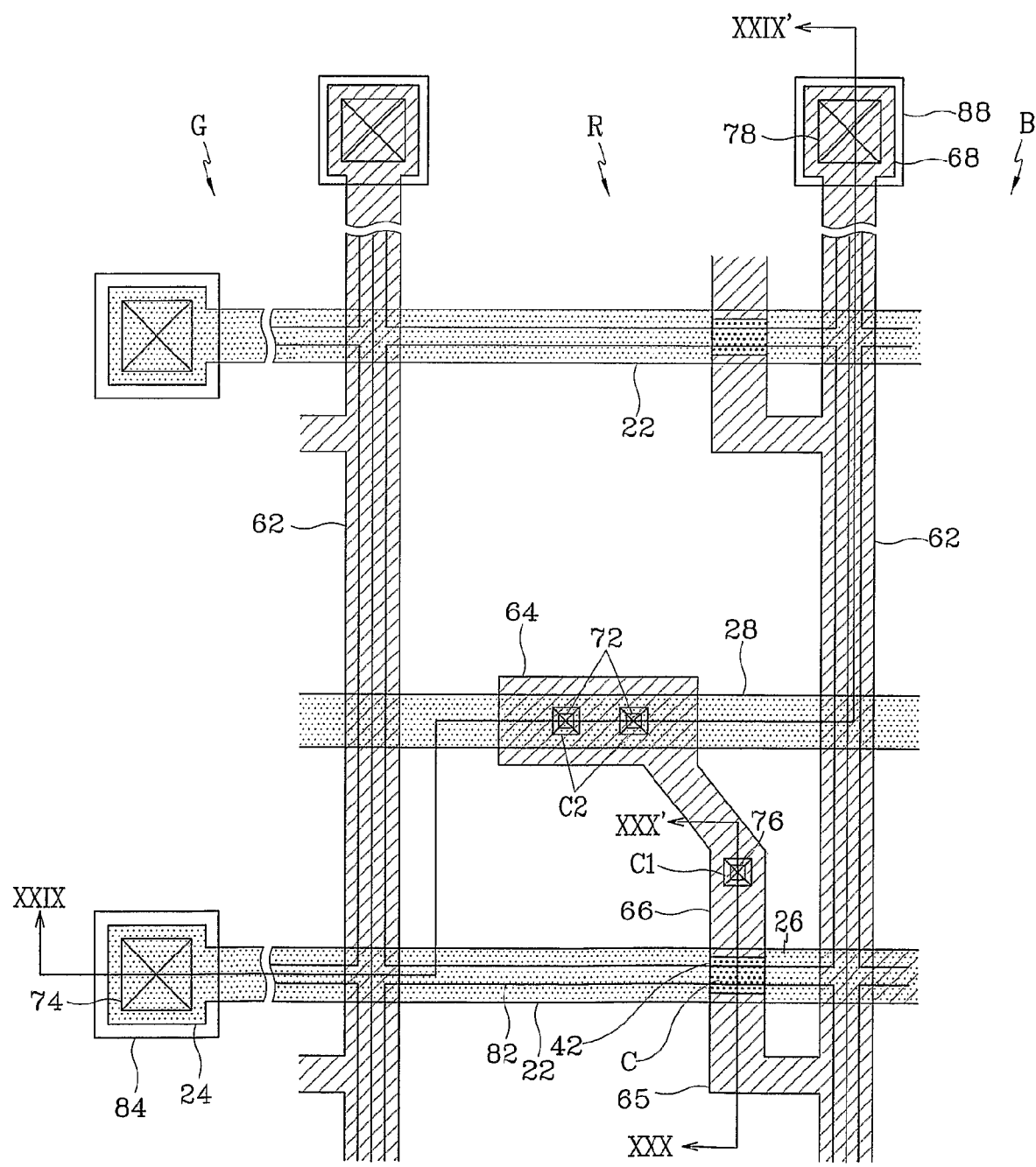
FIG. 28 is a layout view of a TFT array panel for an LCD according to a fourth embodiment of the present invention.
Figure 29:
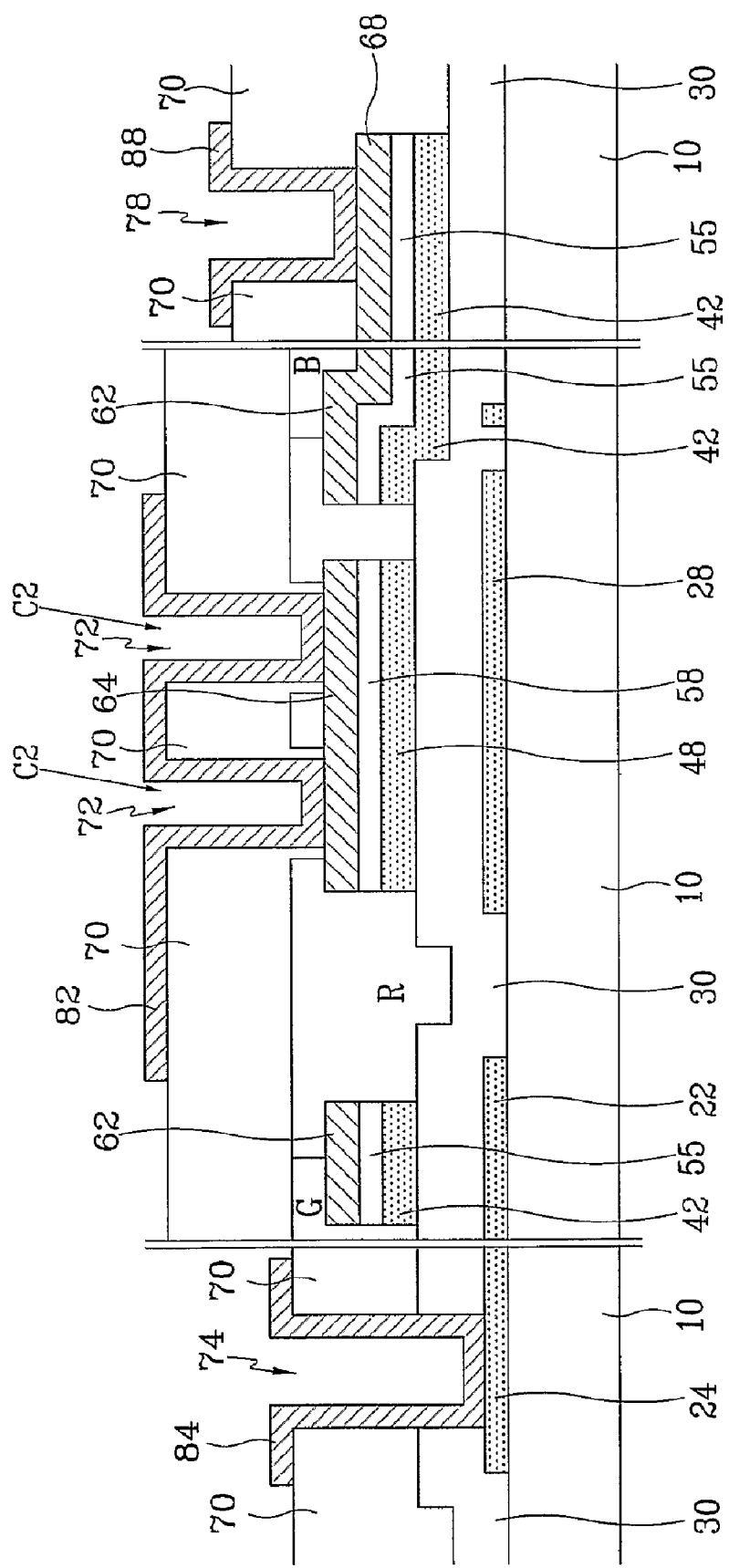
FIGS. 29 and 30 are sectional views of the TFT array panel shown in FIG. 28 taken along the line XXIX-XXIX' and the line XXX-XXX'.
Figure 30:
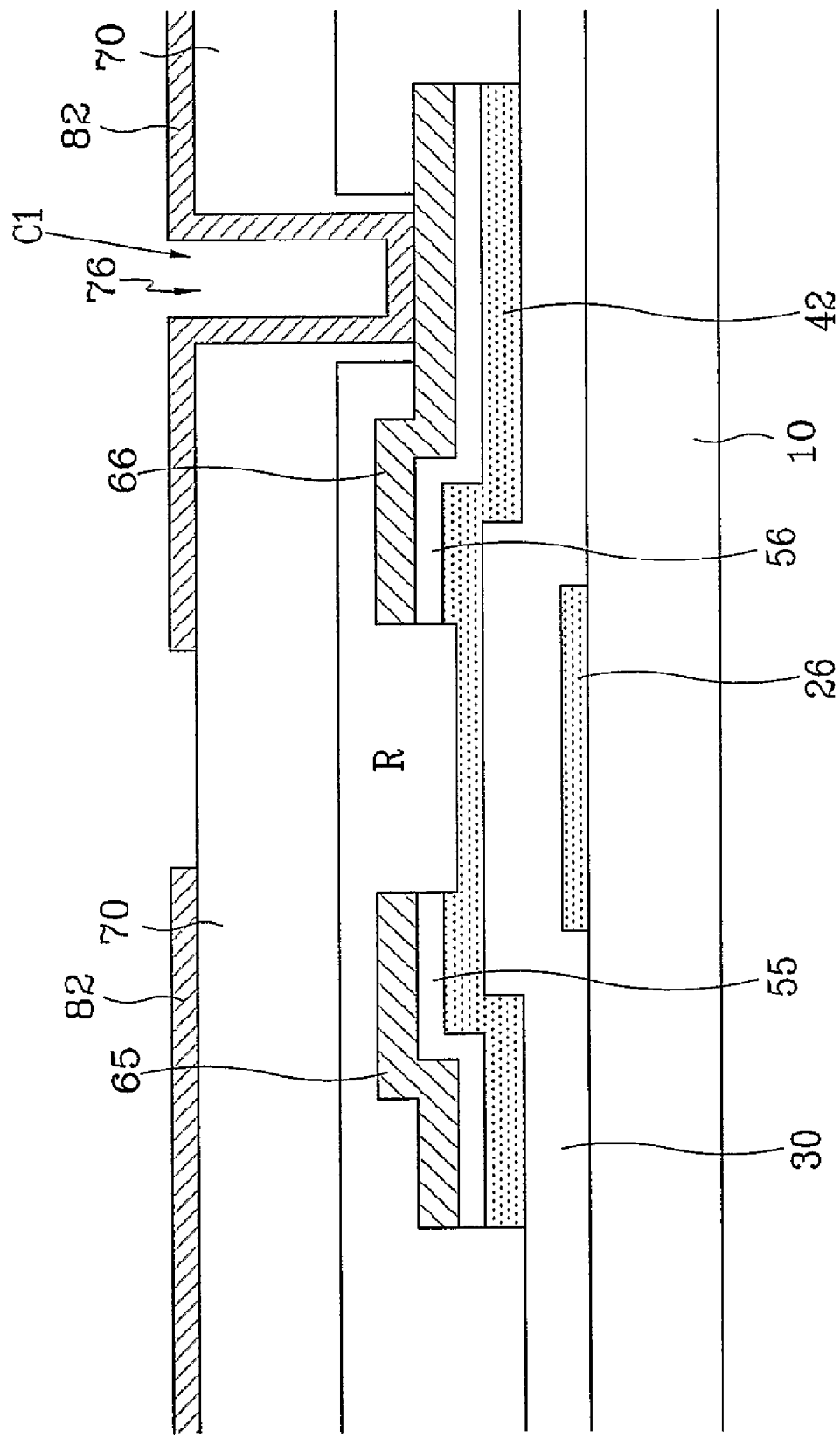

FIG. 28 is a layout view of a TFT array panel for an LCD according to a fourth embodiment of the present invention, and FIGS. 29 and 30 are sectional views of the TFT array panel shown in FIG. 28 taken along the line XXIX-XXIX' and the line XXX-XXX', respectively.

A gate wire 22, 24 and 26 is formed on an insulating substrate 10. The gate wire 22, 24 and 26 is made of a Ag(Zn) alloy including Ag and additional Zn. A ZnOx layer, which is an oxide of the additive Zn, is formed on the surfaces of the gate wire 22, 24 and 26. The gate wire 22, 24 and 26 includes a plurality of scanning signal lines or gate lines 22 extending in the transverse direction, a plurality of gate pads 24 connected to one ends of the gate lines 22 to transmit gate signals from an external device to the gate lines 22, and a plurality of gate electrodes 26 of TFTs, which are parts of the gate lines 22 to form a plurality of TFTs. The gate wire further includes a plurality of storage capacitor electrode lines 28 extending parallel to the gate lines 22 and receiving a predetermined voltage such as a common electrode voltage from an external device, which is applied to a common electrode of an upper panel. The storage capacitor electrode lines 28 overlap storage capacitor conductors 64 connected to pixel electrodes 82 to form storage capacitors for enhancing the charge storing capacity of the pixels, which is described later.

A gate insulating layer 30 preferably made of SiNx is formed on the gate wire 22, 24, 26 and 28 and the substrate 10.

A semiconductor pattern 42 and 48 preferably made of hydrogenated amorphous silicon are formed on the gate insulating layer 30. An ohmic contact pattern (or an intermediate layer pattern) 55, 56 and 58 preferably made of amorphous silicon heavily doped with n type impurities such as phosphorous P are formed on the semiconductor pattern 42 and 48.

A data wire 62, 64, 65, 66 and 68 is formed on the ohmic contact pattern 55, 56 and 58. Like the gate wire, the data wire 62, 64, 65, 66 and 68 is made of Ag(Zn) alloy including Ag and additional Zn. The data wire 62, 64, 65, 66 and 68 includes a plurality of data line units 62, 65 and 68, a plurality of drain electrodes 66 for TFTs, and a plurality of storage capacitor conductors 64. Each data line unit 62, 65 and 68 includes a data line 62 extending in the longitudinal direction, a data pad 68 connected to one end of the data line 62 to receive image signals from an external device, and a plurality of source electrodes 65 of TFTs branched from the data line 62. Each drain electrode 66 is separated from the data line units 62, 65 and 68 and placed opposite to the corresponding source electrode 65 with respect to the corresponding gate electrode 26 or the channel portion C of the TFT. The storage capacitor conductors 64 are placed over the storage capacitor electrode lines 28. In the absence of the storage capacitor electrode lines 28, the storage capacitor conductors 64 are also omitted.

A ZnOx layer, which is an oxide of the additive Zn, is formed on the surfaces of the data wire 62, 64, 65, 66 and 68.

The ohmic contact pattern 55, 56 and 58 reduces the contact resistance between the underlying semiconductor pattern 42 and 48 and the overlying data wire 62, 64, 65, 66 and 68 and has substantially the same shape as the data wire 62, 64, 65, 66 and 68. That is, the ohmic contact pattern 55, 56 and 58 includes a plurality of data-line ohmic contacts 55 having substantially the same shapes as the data line units 62, 68 and 65, a plurality of drain-electrode ohmic contacts 56 having substantially the same shapes as the drain electrodes 66, and a plurality of storage-capacitor ohmic contacts 58 having substantially the same shapes as the storage capacitor conductors 64.

Meanwhile, the semiconductor pattern 42 and 48 has substantially the same shape as the data wire 62, 64, 65, 66 and 68 and the ohmic contact pattern 55, 56 and 58 except for the TFT channel areas C. That is, the source and the drain electrodes 65 and 66 are separated from each other at the TFT channel areas C, where the data-line ohmic contacts 55 and the drain-electrode ohmic contacts 56 are also separated from each other. However, the TFT semiconductors 42 continue to proceed there without disconnection to form TFT channels.

A plurality of red, green and blue color filters R, G and B are formed on the data wire 62, 64, 65, 66 and 68 and portions of the gate insulating layer which are not covered with the data wire 62, 64, 65, 66 and 68. The color filters R, G and B has a plurality of apertures C1 and C2 exposing the drain electrodes 65 and the storage capacitor conductors 64.

The red, green and blue color filters R, G and B are covered with a passivation layer 70, which is made of photosensitive organic insulating material or low dielectric insulating material. The passivation layer 70 has a plurality of contact holes 76, 78 and 72 exposing the drain electrodes 66, the data pads 68 and the storage capacitor conductors 64. The passivation layer 70 together with the gate insulating layer 30 is further provided with a plurality of contact holes 74 exposing the gate pads 24. The contact holes 76 and 72 exposing the drain electrodes 66 and the storage capacitor conductors 64 are placed within the apertures C1 and C2 of the color filters R, G and B.

On the passivation layer 70, there are formed a plurality of pixel electrodes 82 applied with image signals from TFTs to generate an electric field in cooperation with an electrode of an upper panel. The pixel electrodes 82 are preferably made of transparent conductive material such as ITO or IZO and physically and electrically connected to the drain electrodes 66 via the contact holes 76 to receive the image signals. The pixel electrodes 82 overlap the gate lines 22 and the data lines 62 adjacent thereto to increase the aperture ratio, but they may not do. In addition, the pixel electrodes 82 are also connected to the storage capacitor conductors 64 via the contact holes 72 to transmit the image signals thereto.

Meanwhile, a plurality of auxiliary gate pads 84 and a plurality of auxiliary data pads 88 are formed on the gate pads 24 and the data pads 68, respectively, and connected thereto via the contact holes 74 and 78. The auxiliary pads 84 and 88 supplement adhesiveness of the pads 24 and 68 with external circuit devices and protect the pads 24 and 68. The auxiliary gate pads 86 and the auxiliary data pads 88 are not requisites but may be introduced in a selective manner.

A method of manufacturing the TFT array panel for an LCD according to an embodiment will be now described in detail with reference to FIGS. 31A to 38C as well as FIGS. 28 to 30.

Figure 31A:
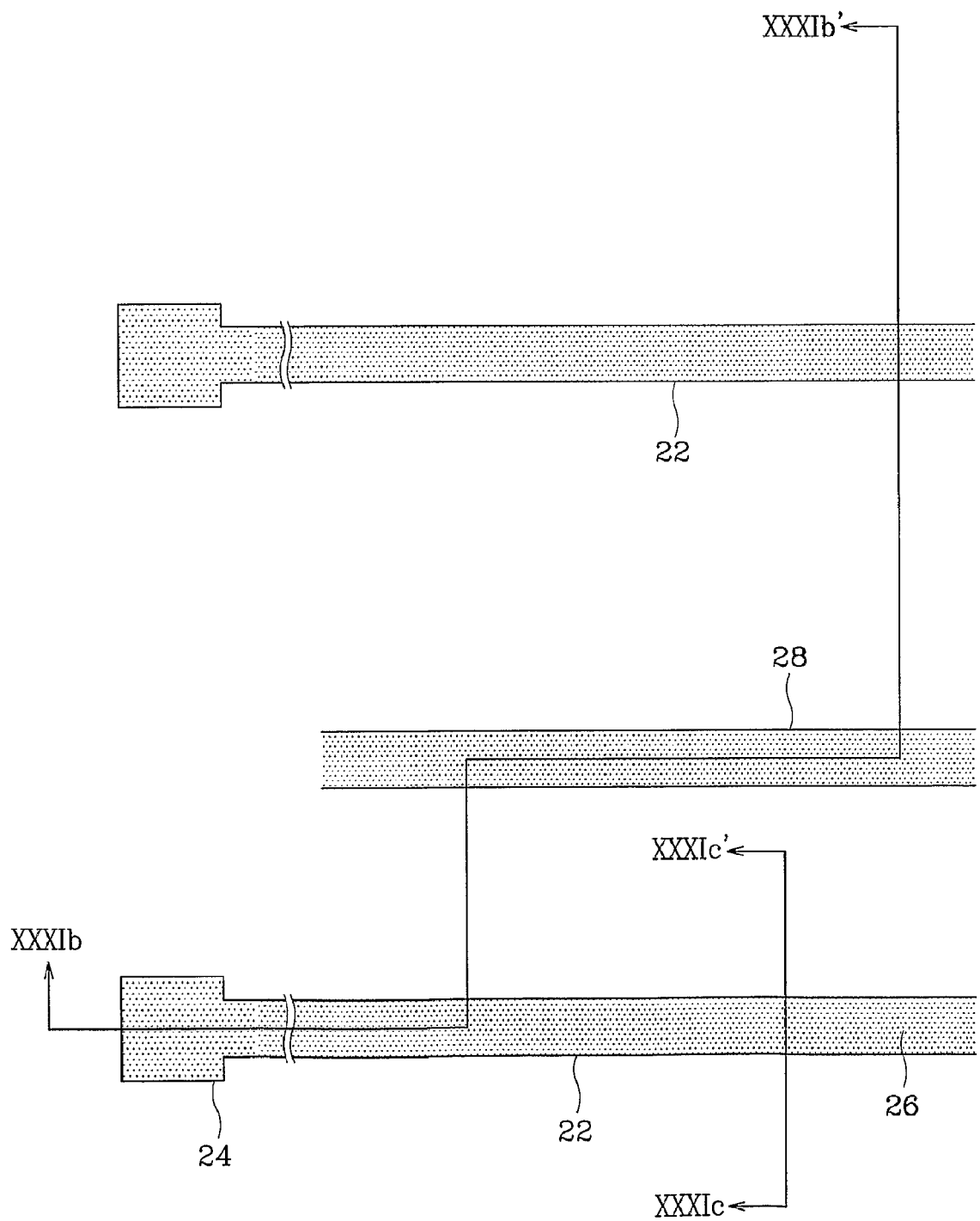
FIG. 31A is a layout view of a TFT array panel in the first step of a manufacturing method thereof according to the embodiment of the present invention.
Figure 31B:
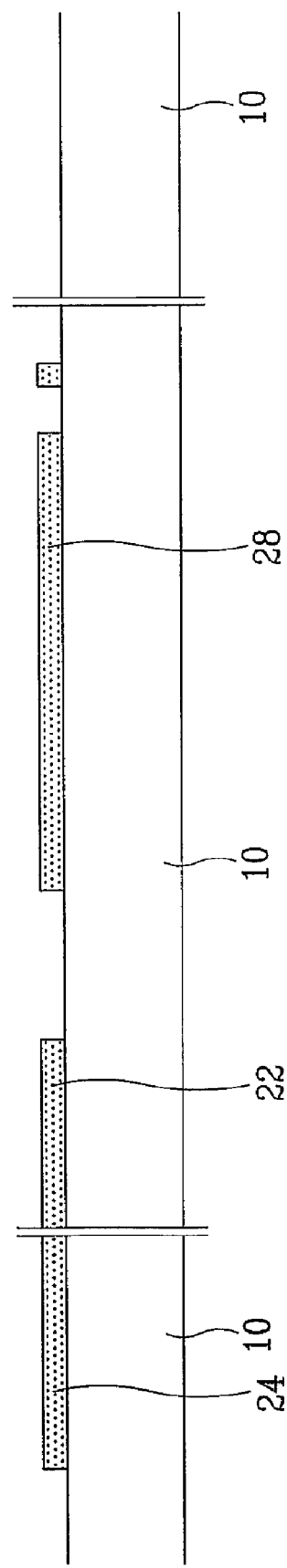

First, as shown in FIGS. 31A to 31C, a Ag(Zn) alloy layer with the thickness of 1,000-3,000Å is deposited on a substrate 10 and dry or wet etched by a first photo-etch using a mask to form a gate wire 22, 24 and 26. The gate wire 22, 24 and 26 includes a plurality of gate lines 22, a plurality of gate electrodes 26, and a plurality of gate pads 24. The Ag(Zn) thin film is formed by co-deposition of Ag and Zn preferably using DC magnetron sputtering. Thereafter, the Ag(Zn) thin film is subject to heat treatment at about 300° C., which diffuses the Zn content and form a ZnOx layer on the surfaces of the gate wire 22, 24 and 26.

Figure 32A:
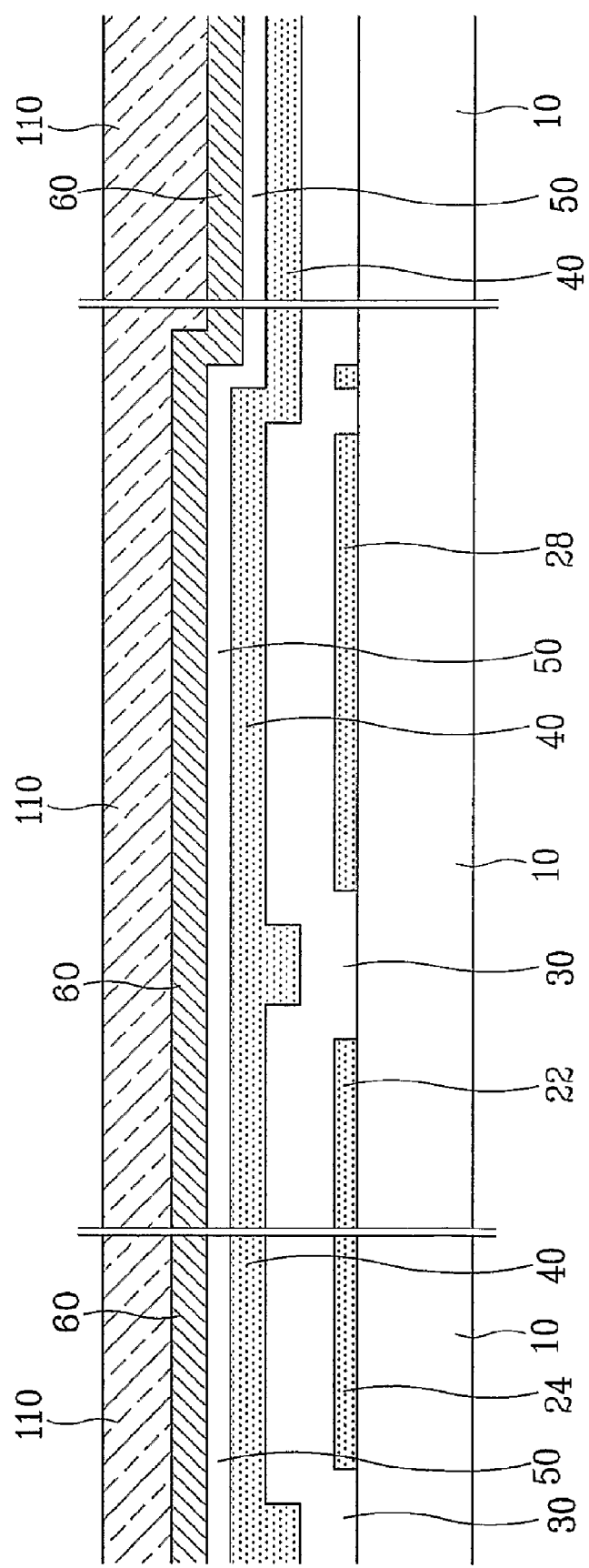
FIGS. 32A and 32B are sectional views of the TFT array panel shown in FIG. 31A taken along the line XXXIb-XXXIb' and the line XXXIc-XXXIc', respectively, in the step following the step illustrated in FIG. 31A.
Figure 32B:
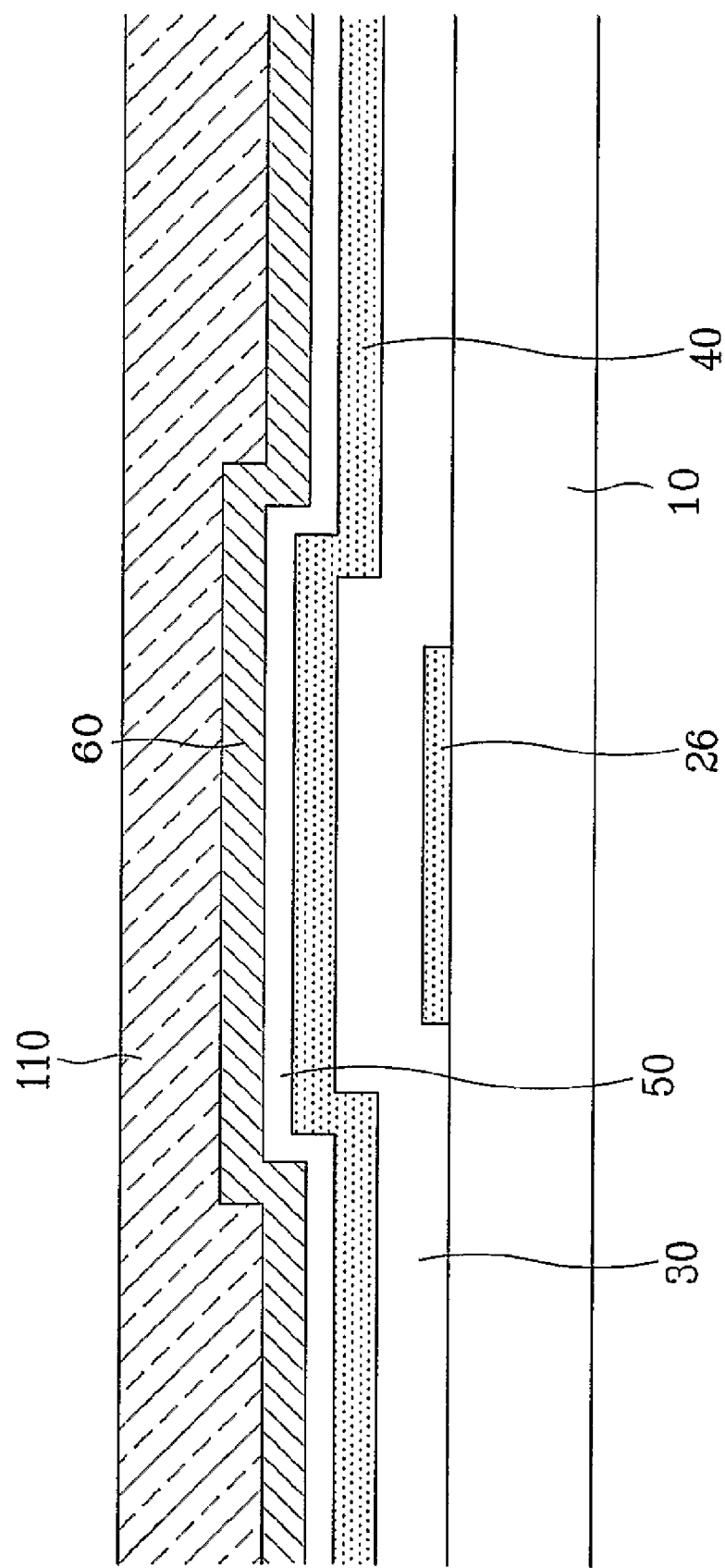

As shown in FIGS. 32A and 32B, a gate insulating layer 30 with 1,500-5,000Å thickness, a semiconductor layer 40 with 500-2,000Å thickness, and an intermediate layer 50 with 300-600Å thickness are sequentially deposited on the substrate 10 by CVD. A conductive layer 60 for a data wire made of Ag(Zn) is formed on the intermediate layer 50, and a photoresist film 110 with thickness of 1-2 microns is coated thereon.

Figure 33A:
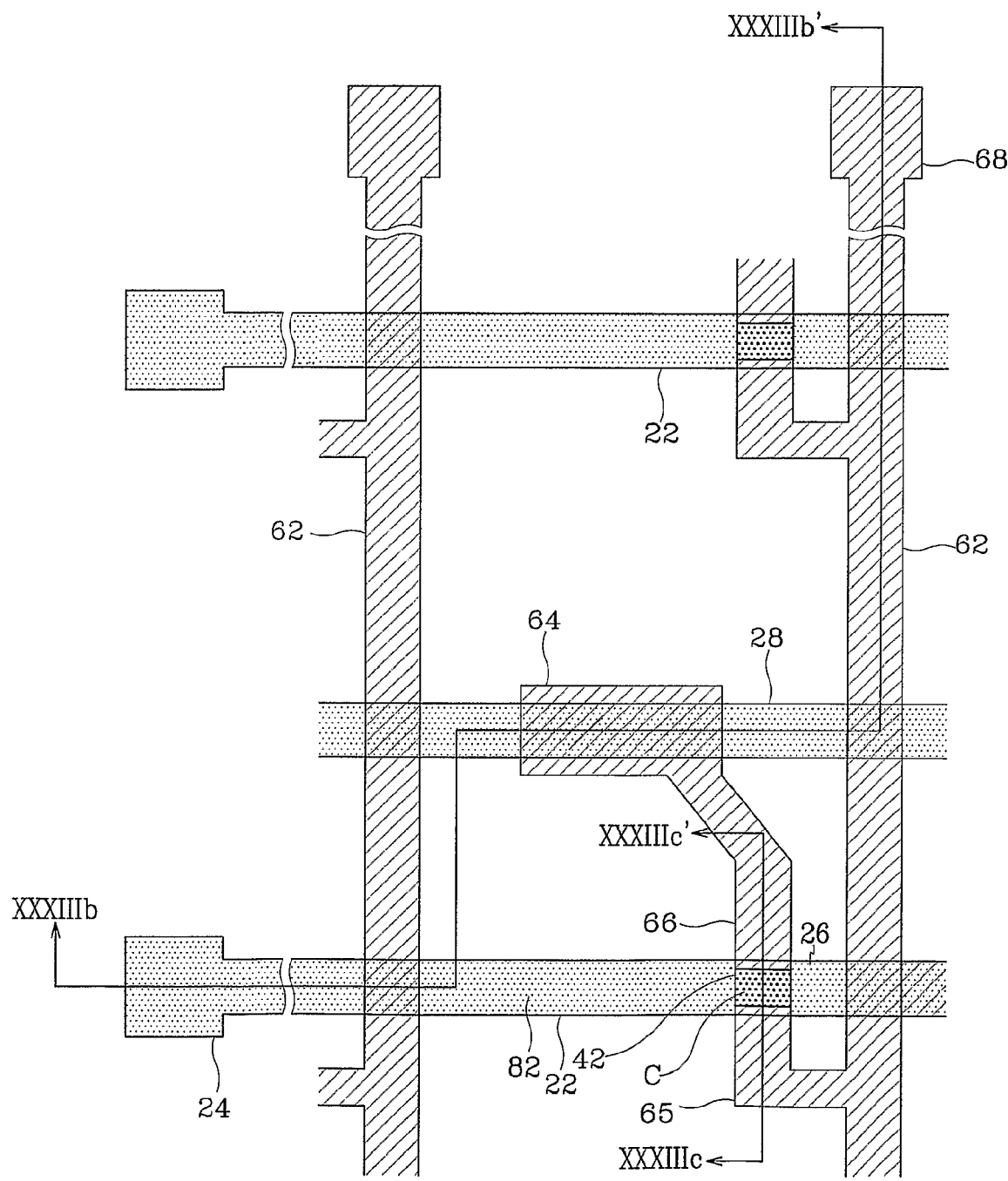
FIG. 33A is a layout view of the TFT array panel in the step following the step illustrated in FIGS. 32A and 32B.
Figure 33B:
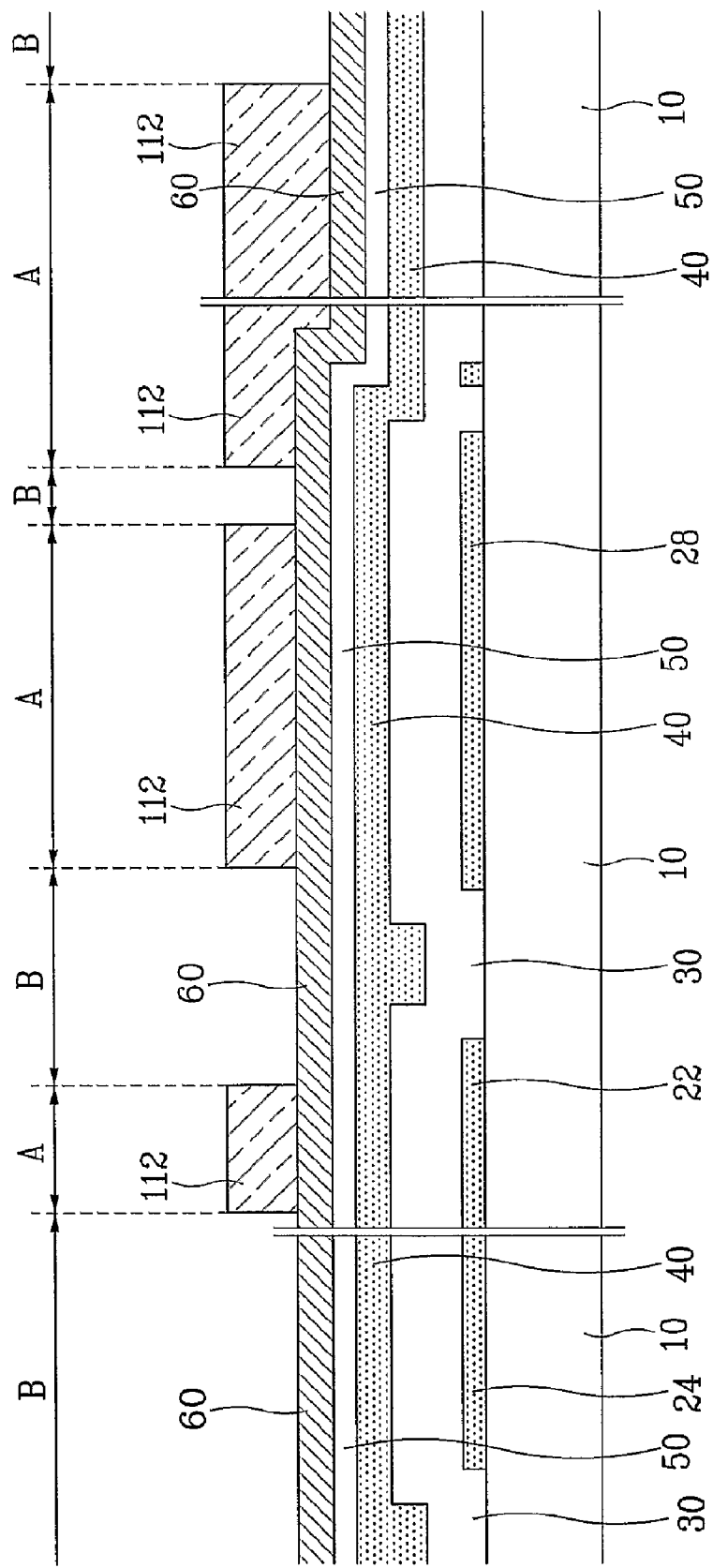

Thereafter, the photoresist film 110 is exposed to light through a second mask and is developed to form a photoresist pattern 112 and 114 having a plurality of first portions and a plurality of second portions as shown in FIGS. 13B and 33C. Each of the first portions 114 of the photoresist pattern 112 and 114 is located on the channel area C of a TFT, which is placed between a source electrode 65 and a drain electrode 66. Each of the second portions 112 is located on a data area A located at a place where a data wire 62, 64, 65, 66 and 68 will be formed. All portions of the photoresist film 110 on the remaining areas B are removed, and the first portions 114 are made to be thinner than the second portions 112. Here, the ratio of the thickness of the first portion 114 on the channel area C and the second portion 112 on the data area A is adjusted depending on process conditions of subsequent etching steps described later, and it is preferable that the thickness of the first portion 114 is equal to or less than a half of that of the second portion 112, for example, equal to or less than 4,000 Å.

The position-dependent thickness of the photoresist pattern 112 and 114 are obtained by several techniques. A slit pattern, a lattice pattern or a translucent film is provided on the mask in order to adjust the light transmittance in the area C.

When using a slit pattern, it is preferable that width of the slits and a gap between the slits is smaller than the resolution of an exposer used for the photolithography. In case of using a translucent film, thin films with different transmittances or different thickness may be used to adjust the transmittance on the masks.

When a photoresist film 110 is exposed to light through such a mask, polymers of a portion directly exposed to the light are almost completely decomposed, and those of a portion exposed to the light through a slit pattern or a translucent film are not completely decomposed because the amount of a light irradiation is small. The polymers of a portion of the photoresist film 110 blocked by a light-blocking film provided on the mask is hardly decomposed. After the photoresist film 110 is developed, the portions containing the polymers, which are not decomposed, is left. At this time, the thickness of the portion with less light exposure is thinner than that of the portion without light exposure. Since too long exposure time decomposes all the molecules, it is necessary to adjust the exposure time.

The first portion 114 of the photoresist pattern 112 and 114 may be obtained using reflow. That is, the photoresist film 100 is made of a reflowable material and exposed to light through a normal mask having opaque and transparent portions. The photoresist film 110 is then developed and subject to reflow such that portions of the photoresist film 110 flows down onto areas without photoresist, thereby forming the thin portion 114.

Next, the photoresist film 114 and the underlying layers including the conductive layer 60, the intermediate 50 and the semiconductor layer 40 are etched such that the data wire and the underlying layers are left on the data areas A, only the semiconductor layer is left on the channel areas C, and all the three layers 60, 50 and 40 are removed to expose the gate insulating layer 30 on the remaining areas B.

Figure 34A:
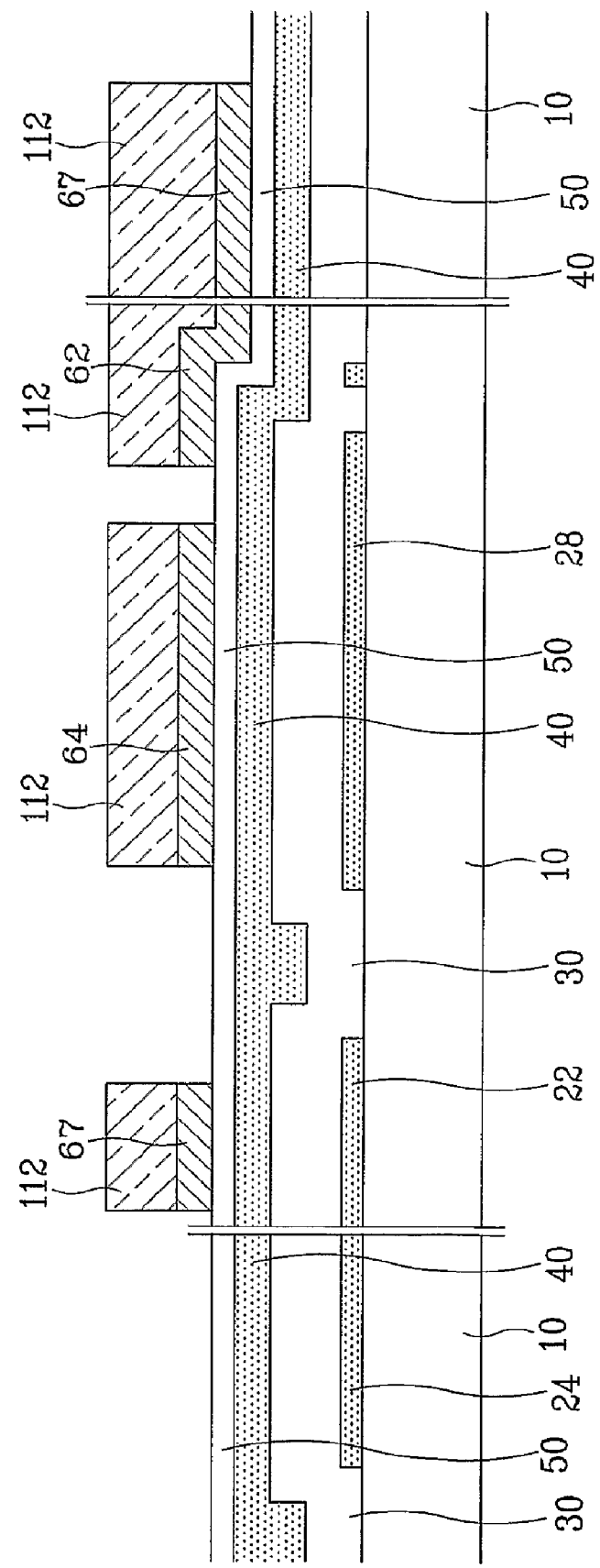
FIGS. 34A, 35A and 36A and 34B, 35B and 36B are sectional views of the TFT array panel shown in FIG. 33A taken along the line XXXIIIb-XXXIIIb' and the line XXXIIIc-XXXIIIc', respectively, sequentially illustrating the steps following the step illustrated in FIGS. 33B and 33C.
Figure 34B:
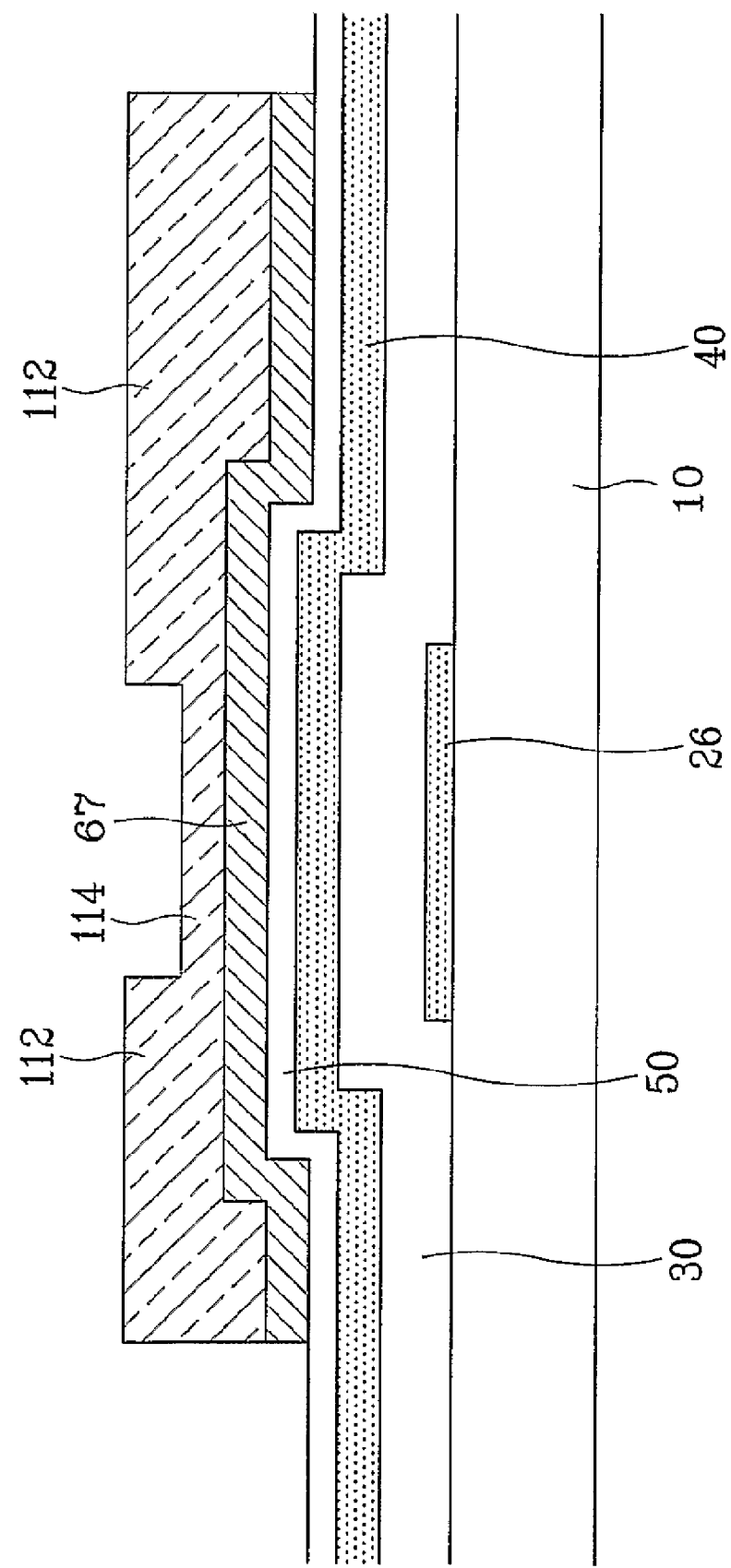

First, as shown in FIGS. 34A and 34B, the exposed portions of the conductive layer 60 on the other areas B are removed to expose the underlying portions of the intermediate layer 50. Both dry etch and wet etch are selectively used in this step and preferably performed under the condition that the conductive layer 60 is easily etched and the photoresist pattern 112 and 114 are hardly etched. However, since it is hard to identify the above-described condition for dry etch, and the dry etch may be performed under the condition that the photoresist pattern 112 and 114 and the conductive layer 60 are etched simultaneously. In this case, the first portion 114 for dry etch is preferably made to be thicker than that for the wet etch to prevent the removal of the first portion 114 and thus the exposure of the underlying portions of the conductive layer 60.

Consequently, as shown in FIGS. 34A and 34B, only the portions of the conductive layer 60 on the channel areas C and the data areas A, that is, the source/drain ("S/D") conductors 67 and the storage capacitor conductors 64 are left and the remaining portions of the conductive layer 60 on the remaining areas B are removed to expose the underlying portions of the intermediate layer 50. Here, the S/D conductors 64 have substantially the same planar shapes as the data wire 62, 64, 65, 66 and 68 except that the source electrodes 65 and the drain electrodes 66 are not disconnected from but connected to each other. When using dry etch, the thickness of the photoresist pattern 112 and 114 is reduced to an extent.

Figure 35A:
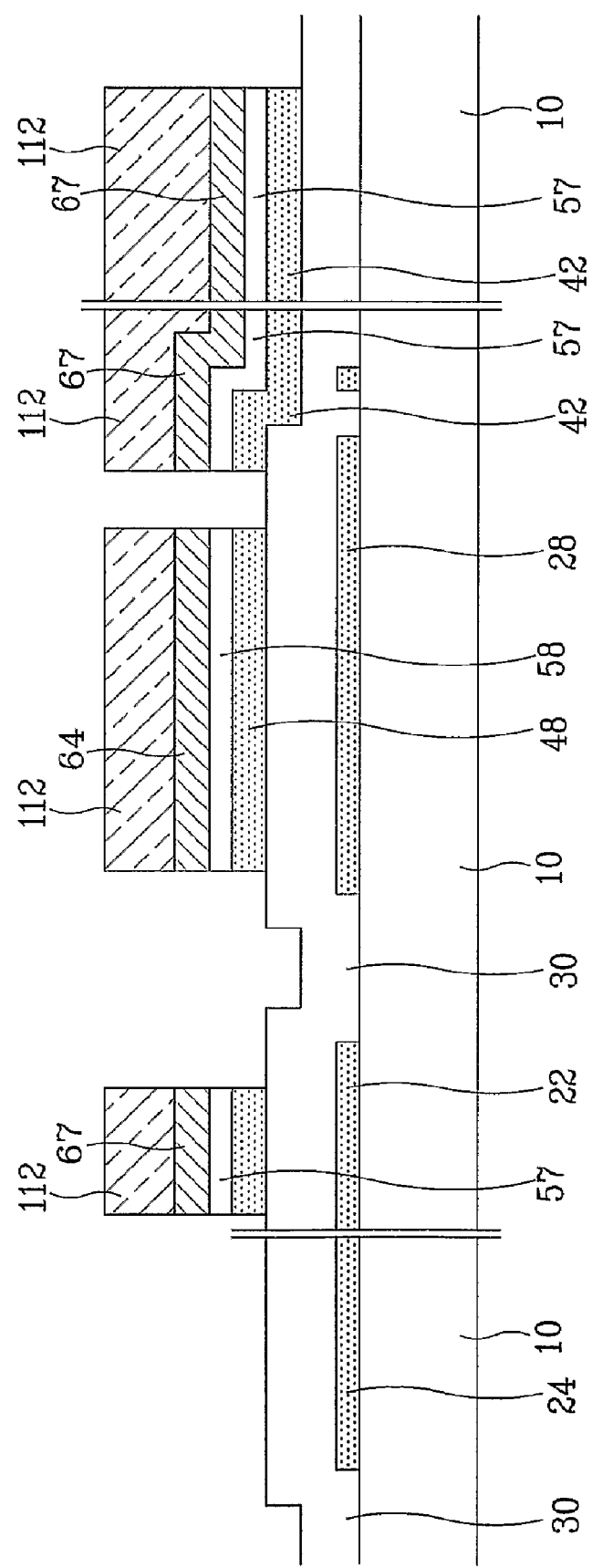
Figure 35B:
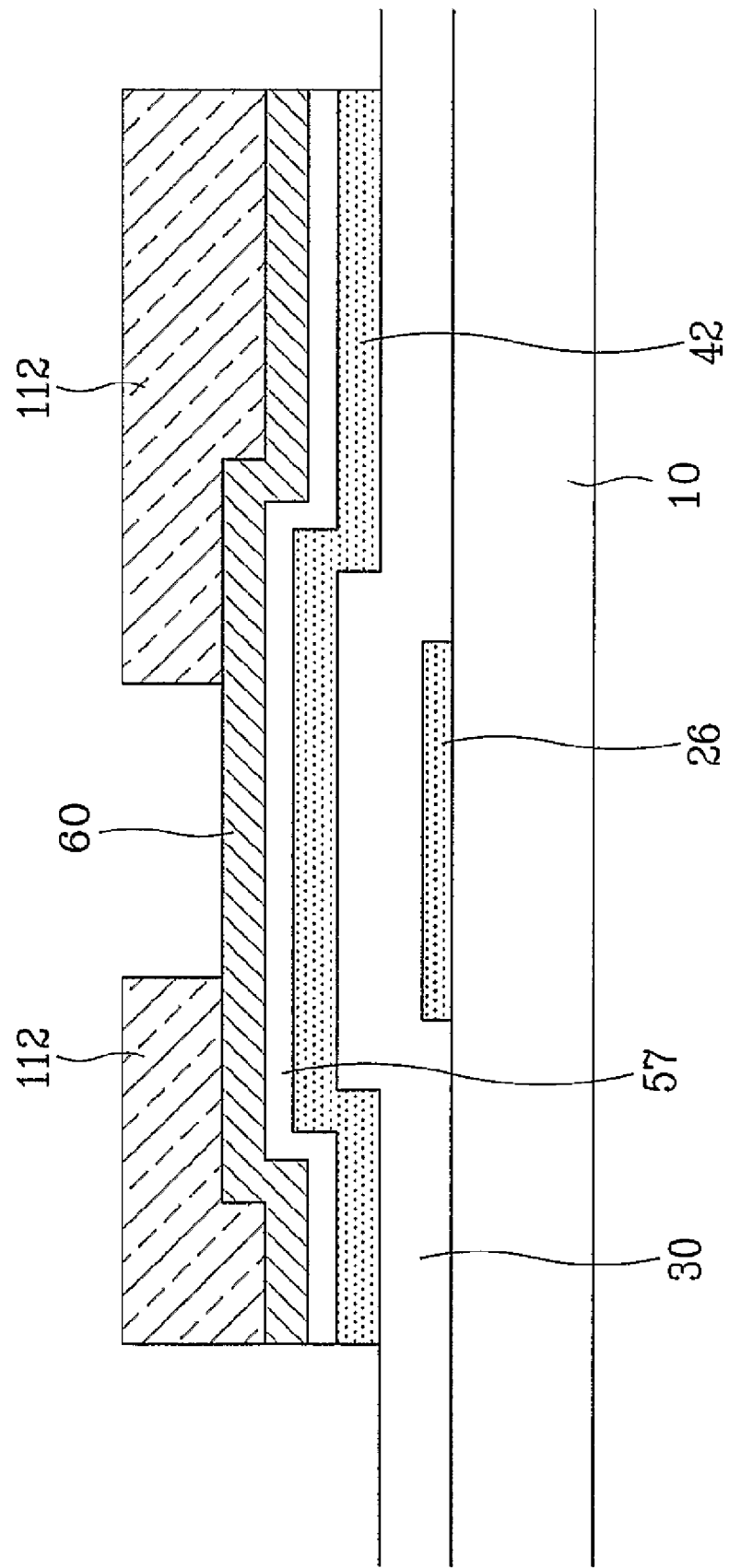

Thereafter, as shown in FIGS. 35A and 35B, the exposed portions of the intermediate layer 50 and the underlying portions of the semiconductor layer 40 on the areas B as well as the first portion 114 of the photoresist pattern 112 and 114 are removed by dry etch. The etching is performed under the conduction that the photoresist pattern 112 and 114, the intermediate layer 50 and the semiconductor layer 40 are easily etched and the gate insulating layer 30 is hardly etched. (It is noted that etching selectivity between the intermediate layer and the semiconductor layer is nearly zero.) When the etching ratios for the photoresist pattern 112 and 114 and for the semiconductor pattern 40 are the same, the initial thickness of the first portion 114 is equal to or less than the sum of the thickness of the semiconductor layer 40 and the thickness of the intermediate layer 50.

As a result, as shown in FIGS. 35A and 35B, the first portions 114 on the channel areas C are removed to expose the underlying portions of the S/D conductors 67, and the portions of the intermediate layer 50 and the semiconductor layer 40 on the remaining areas B are removed to expose the underlying portions of the gate insulating layer 30. In the meantime, the second portions 112 on the data areas A are also etched to become thinner. Moreover, the semiconductor pattern 42 and 48 is completed in this step. The reference numerals 57 and 58 refer to S/D ohmic contacts under the S/D conductors 67 and storage-capacitor ohmic contacts under the storage capacitor conductors 64, respectively.

Then, photoresist remnants left on the surface of the S/D conductors 67 on the channel areas C are removed by ashing.

The data wire 62, 64, 65, 66 and 68 is then subject to heat treatment at about 300° C., which diffuses the Zn content and form a ZnOx layer on the surfaces the data wire 62, 64, 65, 66 and 68. The heat treatment may be made immediately after patterning the data wire 62, 64, 65, 66 and 68, that is, before proceeding from the step illustrated in FIGS. 34A and 34B to the step illustrated in FIGS. 35A and 35B.

Figure 36A:
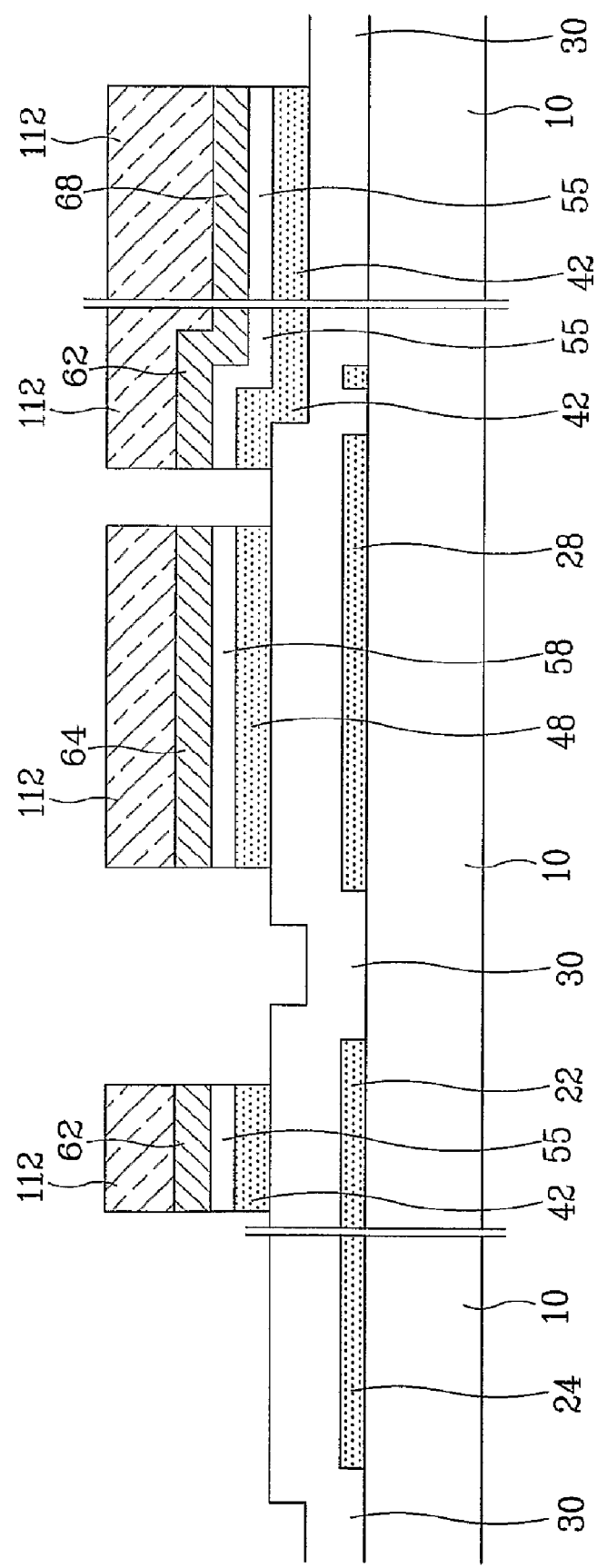
Figure 36B:
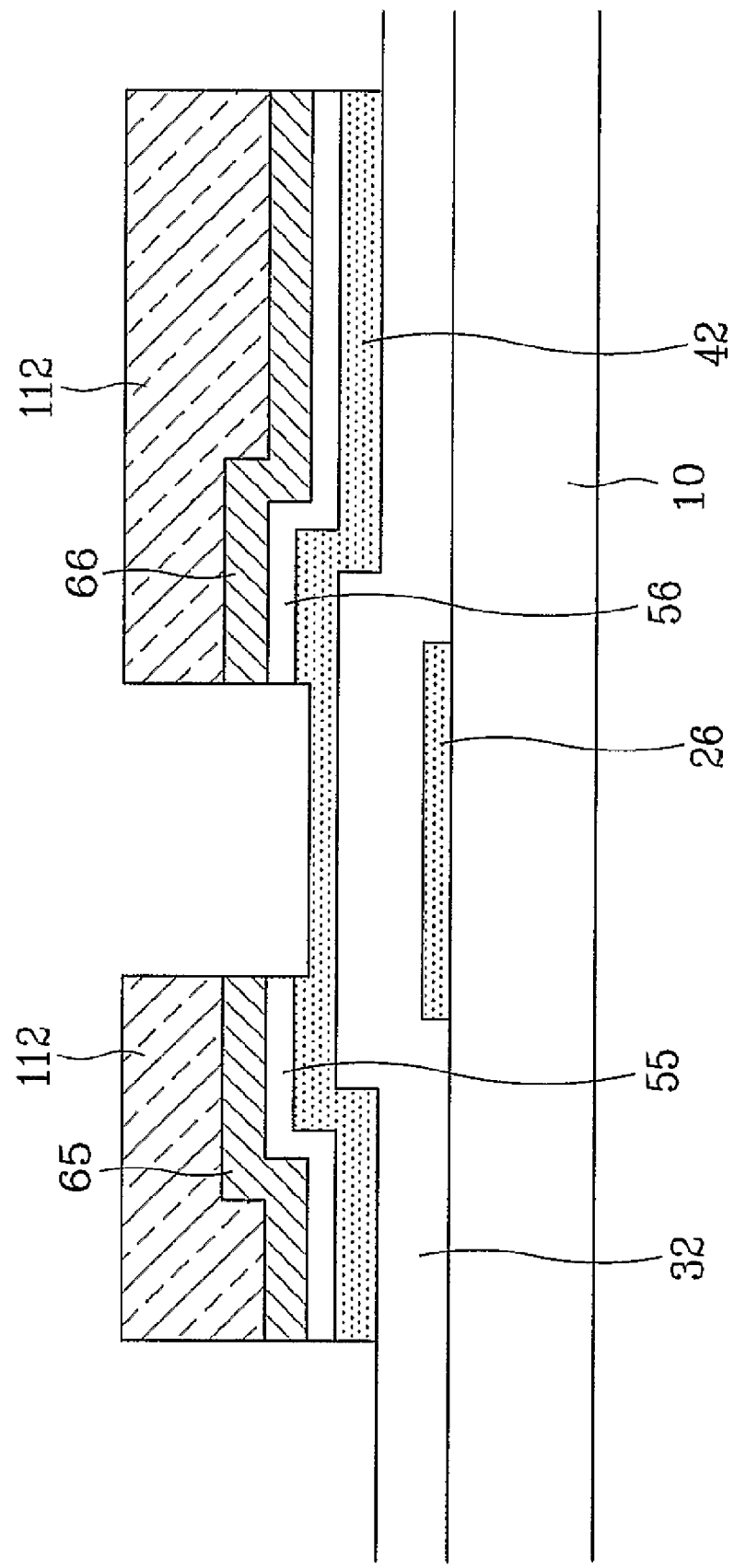

Next, as shown in FIGS. 36A and 36B, portions of the S/D conductors 67 and the underlying portions of the S/D ohmic contacts 57 on the channel areas C are etched to be removed.

Accordingly, the source electrodes 65 and the drain electrodes 66 are separated from each other, and, simultaneously, the data wire 62, 64, 65, 66 and 68 and the ohmic contact pattern 55, 56 and 58 thereunder are completed.

Finally, the second portions 112 of the photoresist pattern 112 and 114 left on the data areas A are removed. Alternatively, the second portions 112 are removed after the portions of the S/D conductors 67 on the channel areas C are removed and before the underlying portions of the S/D ohmic contacts 57 are removed.

As described above, wet etching and dry etching may be performed one after the other, but only dry etching may be used. The latter is relatively simple but it is not easy to find a proper etching condition compared with the former. On the contrary, it is easy to find a proper etching condition for the former case but the former is relatively complicated compared with the latter.

Figure 37A:
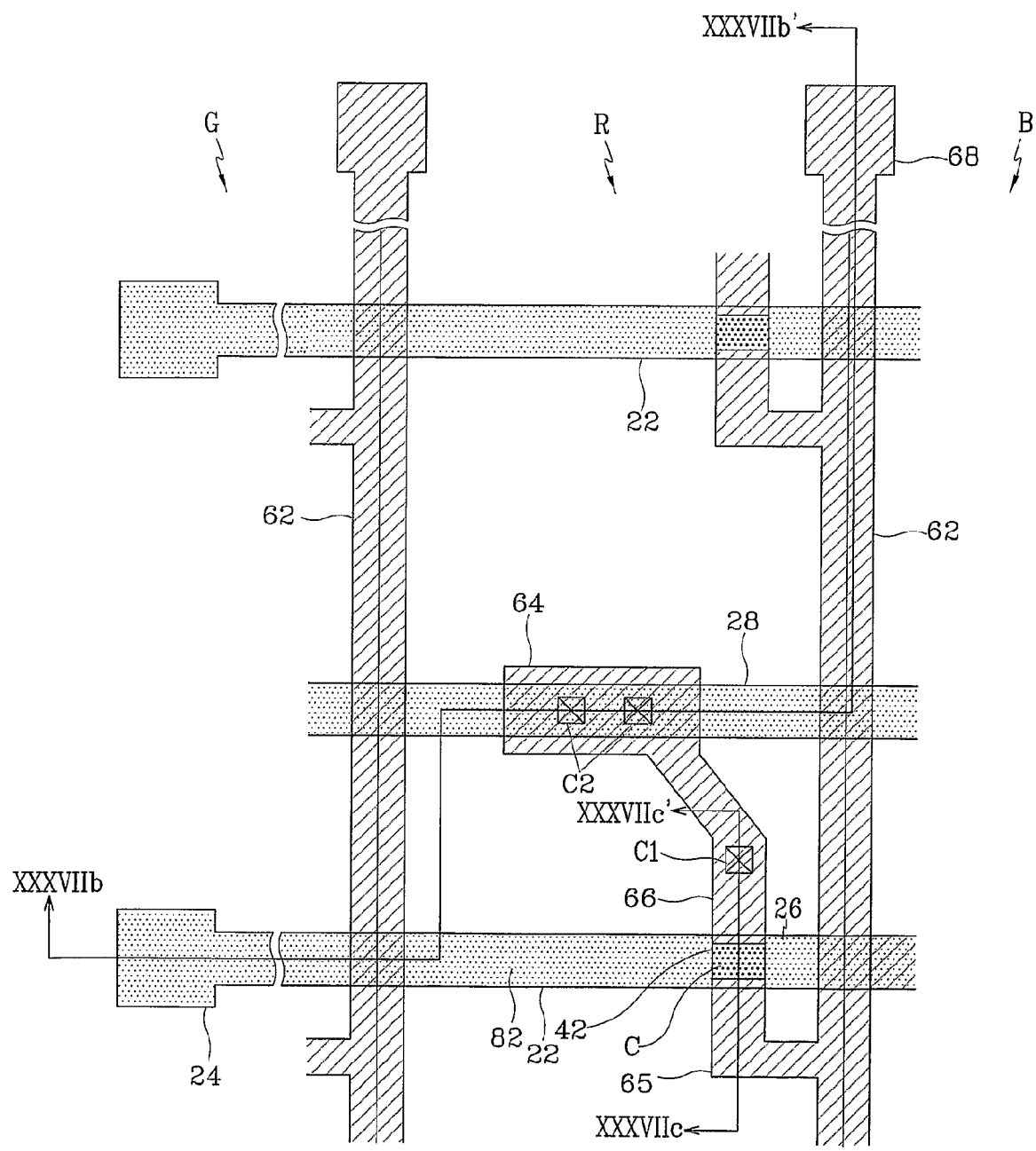
FIG. 37A is a layout view of the TFT array panel in the step following the step illustrated in FIGS. 36A and 36B.
Figure 37B:
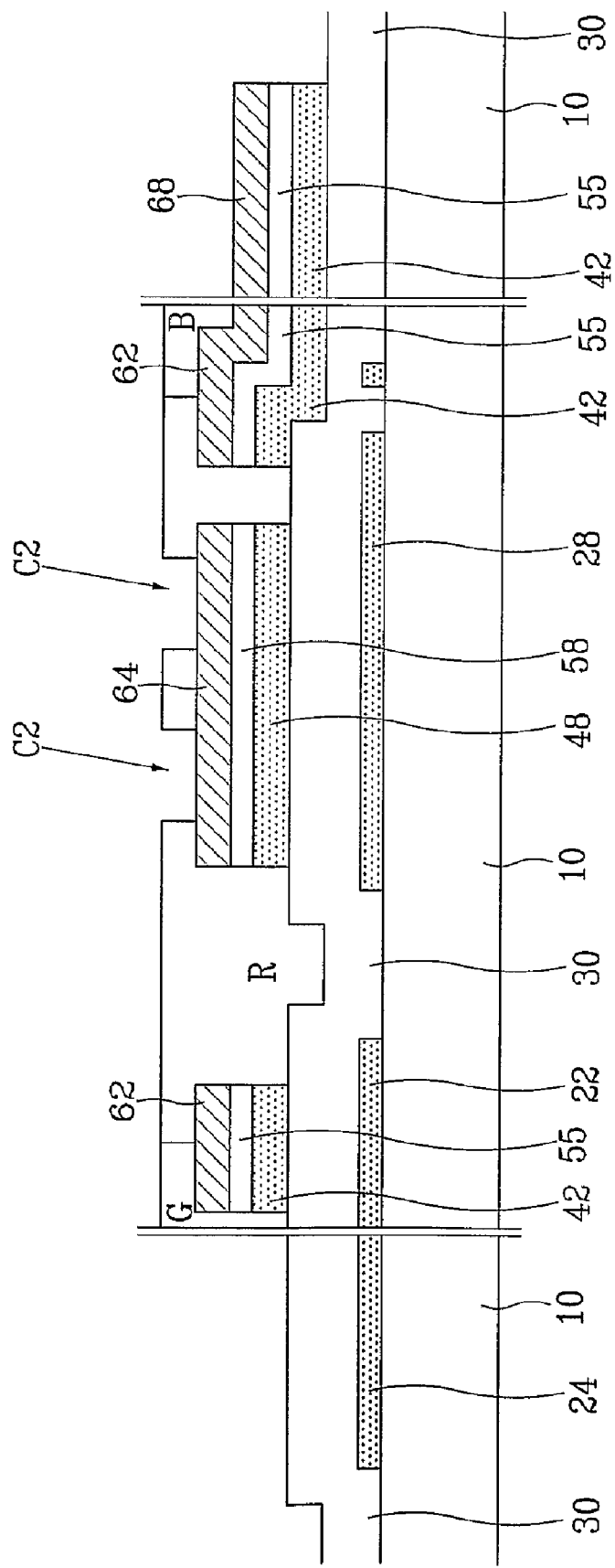
FIGS. 37B and 37C are sectional views of the TFT array panel shown in FIG. 37A taken along the line XXXVIIb-XXXVIIb' and the line XXXVIIc-XXXVIIc'.
Figure 37C:
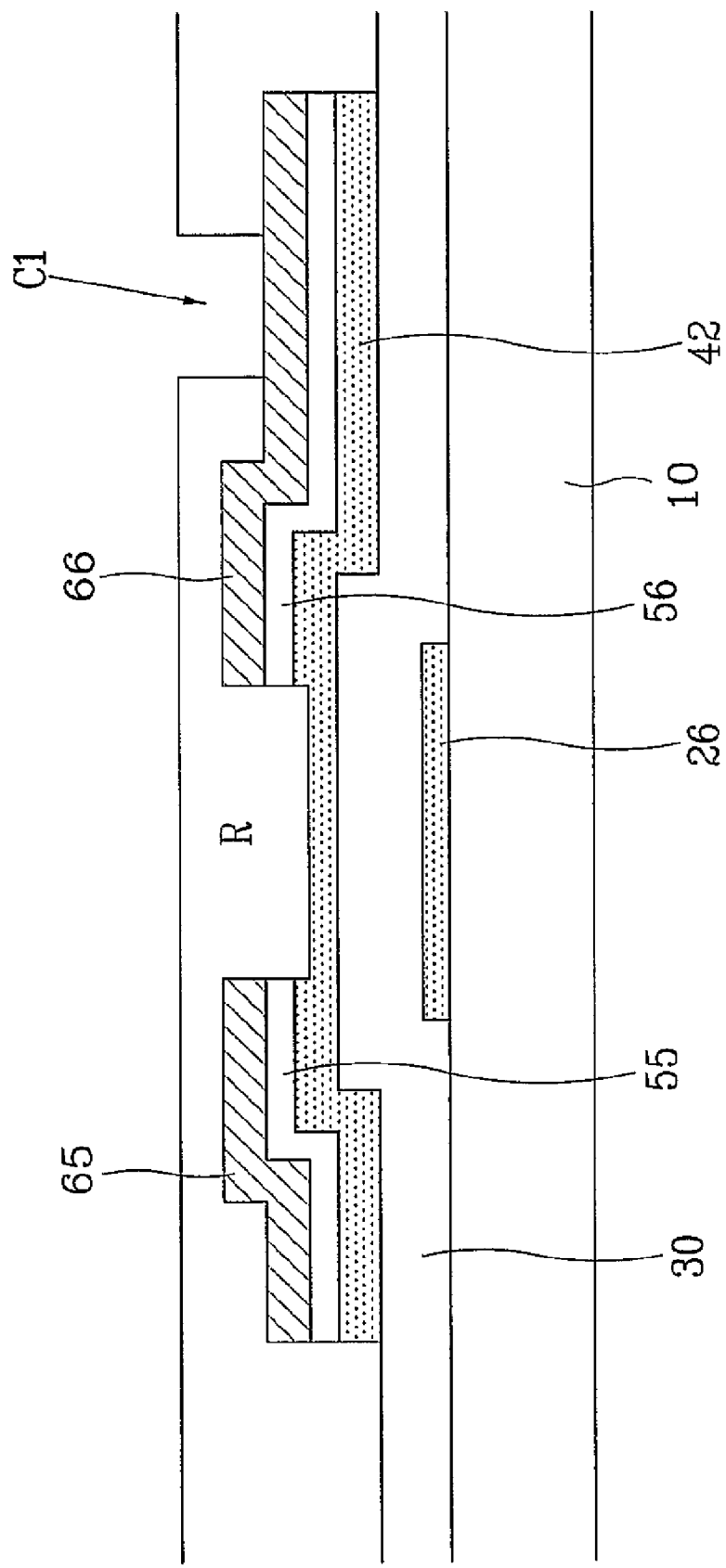
Figure 38A:
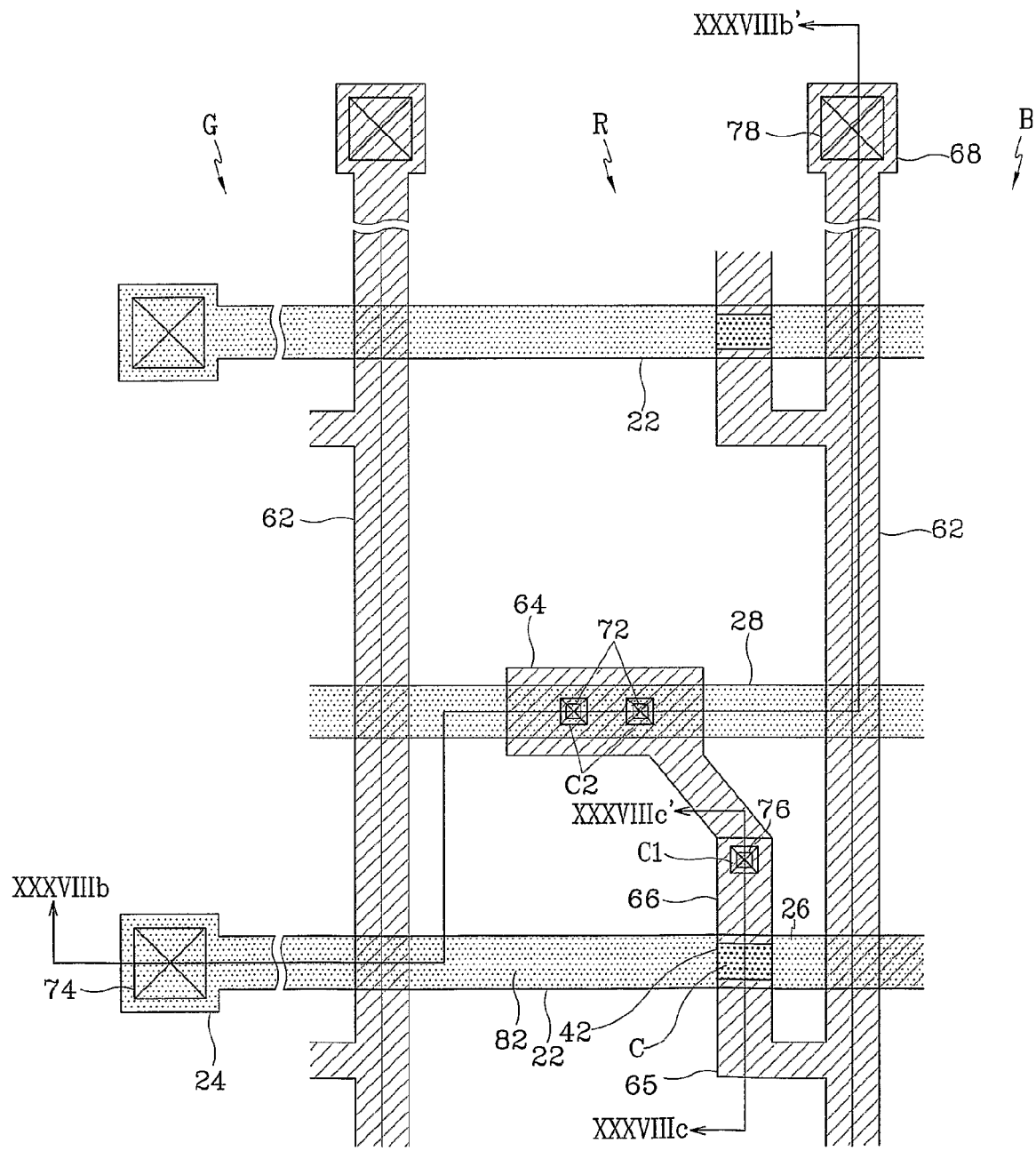
FIG. 38A is a layout view of the TFT array panel in the step following the step illustrated in FIGS. 37A-37C.
Figure 38B:
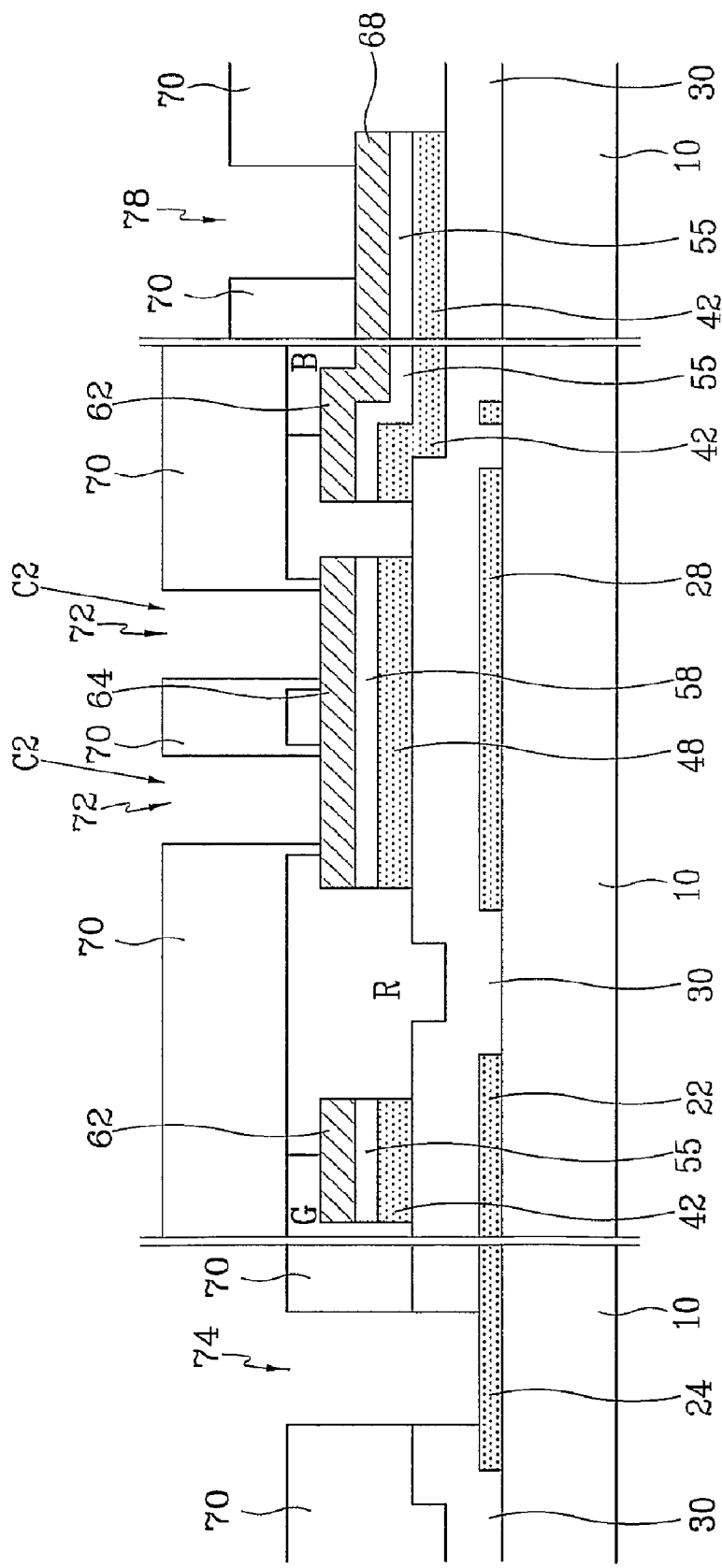
FIGS. 38B and 38C are sectional views of the TFT array panel shown in FIG. 38A taken along the line XXXVIIIb-XXXVIIIb' and the line XXXVIIIc-XXXVIIIc'.
Figure 38C:
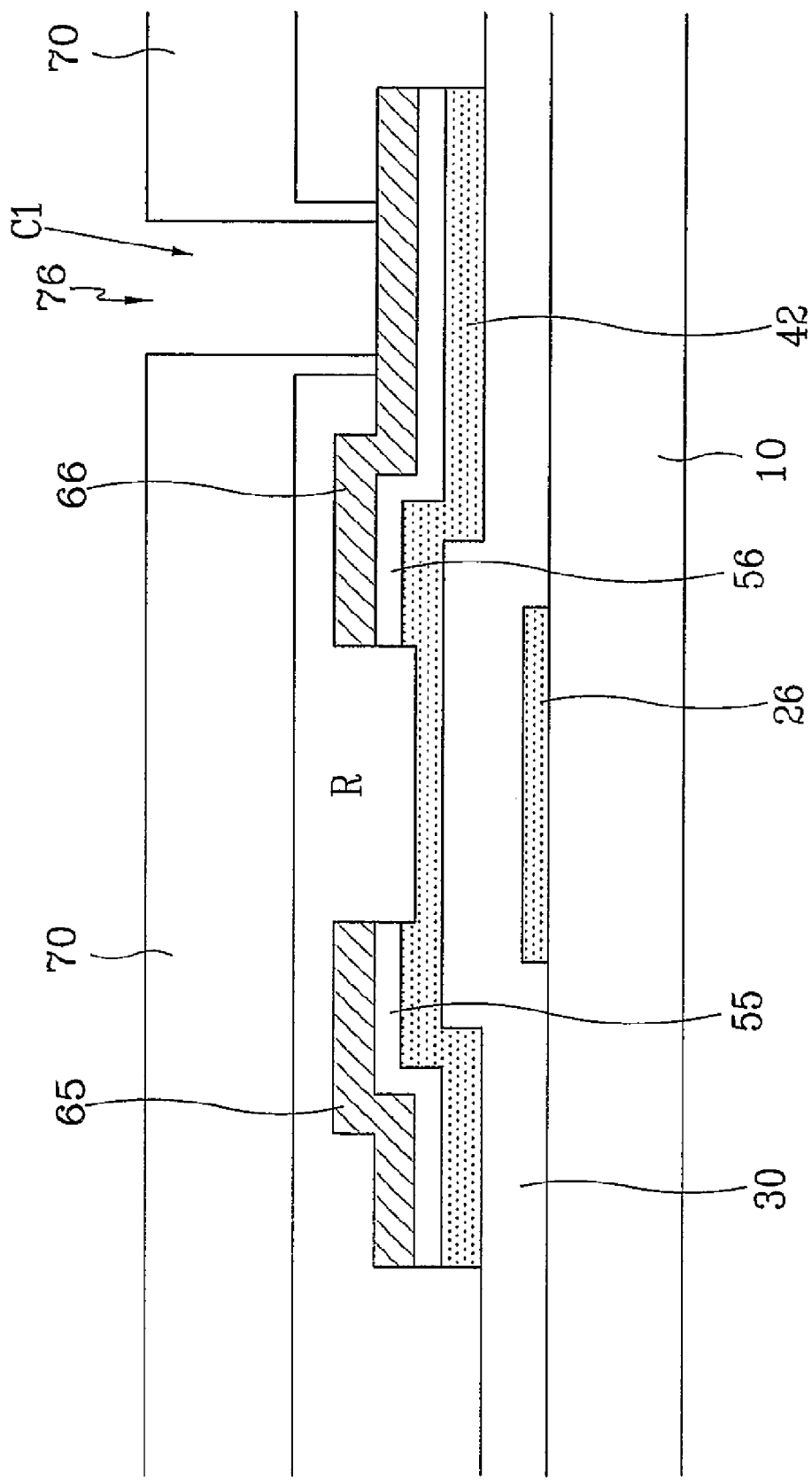

After the formation of the data wire 62, 64, 65, 66 and 68, the ohmic contact pattern 55, 56 and 58 and the semiconductor pattern 42 and 48, as shown in FIGS. 37A to 37C, photosensitive organic materials containing red, green and blue pigments are coated and patterned by photolithography with exposure and development to form a plurality of red, green and blue color filters R, G and B in a sequential manner, and simultaneously to form a plurality of apertures C1 and C2 exposing the drain electrodes 66 and the storage capacitor conductors 64.

A light blocking layer of red or green color filters may be formed on the channel areas C to further block or absorb the short wavelength visible ray incident upon the channel areas C of TFTs.

An acryl-based organic material is coated on the substrate 10, or a low dielectric insulating material having a dielectric constant equal to or less than 4.0 is deposited on the substrate 10 by CVD to form a passivation layer 70. The passivation layer 70 together with the gate insulating layer 30 is patterned by photo etch using a mask to form a plurality of contact holes 72, 74, 78 and 76 exposing the drain electrodes 66, the gate pads 24, the data pads 68 and the storage capacitor conductors 64, respectively. Like the third embodiment, the contact holes 72 and 76 exposing the data pads 68 and the storage capacitor conductors 64 are formed within the apertures C1 and C2 of the color filters R, G and B, thereby making their profiles excellent. As in the third embodiment, the contact holes 72 and 76 exposing the data pads 68 and the storage capacitor conductors 64 are formed after the formation of the apertures C1 and C2 at the color filters R, G and B, thereby making the profiles of the contact holes 72 and 76 excellent. This results in simplified processing steps without additional steps.

Finally, as shown in FIGS. 28 to 30, an ITO layer or an IZO layer having 400-500Å thickness is deposited and photo etched using a mask to form a plurality of pixel electrodes 82, a plurality of auxiliary gate pads 84 and a plurality of auxiliary data pads 88.

Before the formation of the color filters R, G and B, in this embodiment, an insulating layer preferably made of silicon nitride may be additionally formed to prevent the TFT channel areas C from being contaminated with the photosensitive material containing the pigments.

Since the data wire 62, 64, 65, 66 and 68, the ohmic contact pattern 55, 56 and 58 thereunder and the semiconductor pattern 42 and 48 thereunder are formed using a single mask, and the source electrode 65 and the drain electrode 66 are separated from each other in this process, the fourth embodiment of the present invention gives a simple manufacturing method as well as the advantage which the third embodiment gives.

The above described TFT array panels may be manufactured in various ways.

The easily-oxidizable Zn content added to Ag(Zn) alloy is diffused to the surfaces due to heat treatment to form a ZnO layer, thereby preventing oxidation, increasing adhesiveness, and improving resistance against dry etching agents. Furthermore, the heat treatment diffuses out Zn atoms contained in the bulk region of the thin film to make the bulk region of the thin film have lower resistivity close to pure Ag. Since ZnO is a conductive oxide, it can solve the problem of the high contact resistance with the n+ amorphous silicon layer and the transparent conductive layer such as ITO in the conventional alloy process.

What is claimed is:

1. A method of manufacturing a thin film transistor array panel, the method comprising:
    forming a gate wire on an insulating substrate, the gate wire including a gate line, a gate electrode connected to the gate line, and a gate pad connected to the gate line;
    forming a gate insulating layer;
    forming a semiconductor layer;
    depositing a conductive layer and patterning the conductive layer to form a data wire including a data line intersecting the gate line, a data pad connected to the data line, a source electrode connected to the data line and placed close to the gate electrode, and a drain electrode opposite the source electrode with respect to the gate electrode;
    forming a protective layer;
    patterning the protective layer together with the gate insulating layer to form a plurality of contact holes respectively exposing the gate pad, the data pad and the drain electrode; and
    depositing a transparent conductive layer and patterning the conductive layer to form a subsidiary gate pad, a subsidiary data pad and a pixel electrode respectively connected to the gate pad, the data pad, and the pixel electrode,
    wherein at least one of the formation of the gate wire and the formation of the data wire comprises:
    forming a Ag alloy layer by sputtering Ag and an additive including at least one selected from the group consisting of Zn, In, Sn and Cr;
    patterning the Ag alloy layer; and
    heat-treating the Ag alloy layer.

2. The method of claim 1, wherein the heat treatment of the Ag alloy layer is performed at 200-400° C.

3. The method of claim 1, wherein both the data wire and the semiconductor layer are formed by a photolithography step using a photoresist pattern including a first portion, a second portion having a thickness larger than the first portion, and a third portion having a thickness smaller than the first portion.

4. The method of claim 3, wherein in the photolithography step, the first portion is placed between the source and the drain electrodes, and the second portion is placed on the data wire.

5. A method of manufacturing a thin film transistor array panel, the method comprising:
    forming a gate wire on an insulating substrate, the gate wire having a gate line, and a gate electrode connected to the gate line;
    forming a gate insulating layer covering the gate wire;
    forming a semiconductor pattern on the gate insulating layer;
    forming a data wire on the gate insulating layer, the data wire comprising source and drain electrodes including substantially the same layer and separated from each other, and a data line connected to the source electrode;
    forming red, green and blue color filters and a first aperture exposing the drain electrode, the color filters including a photosensitive material containing red, green and blue pigments and covering the data wire;
    forming a protective layer covering the red, green and blue color filters;
    forming a first contact hole exposing the drain electrode; and
    forming a pixel electrode connected to the drain electrode through the first contact hole,
    wherein at least one of the formation of the gate wire and the formation of the data wire comprises:
    forming a Ag alloy layer by sputtering Ag and an additive including at least one selected from the group consisting of Zn, In, Sn and Cr;
    patterning the Ag alloy layer; and
    heat-treating the Ag alloy layer.

6. The method of claim 5, wherein
    the data wire further comprises a storage capacitor conductor overlapping the gate line or a storage capacitor electrode line to form a storage capacitor, the storage capacitor electrode line including substantially the same layer as the gate line;
    the red, green and blue color filters having a second aperture exposing the storage capacitor conductor; and
    the protective layer has a second contact hole placed within the second aperture and exposing the storage capacitor conductor.

7. The method of claim 5, further comprising:
    forming an interlayer insulating layer including silicon nitride or silicon oxide before the formation the color filters.

8. The method of claim 5, wherein the separation of the source and the drain electrodes is made by a photolithography step using a photoresist pattern, and the photoresist pattern has a first portion placed between the source and the drain electrodes and having a first thickness, a second portion having a second thickness larger than the first thickness, and a third portion having a thickness smaller than the first and the second thickness.

* * * * *